(12) United States Patent
Lee et al.

(10) Patent No.: US 8,652,921 B2
(45) Date of Patent: Feb. 18, 2014

(54) SEMICONDUCTOR DEVICE HAVING A DAMP-PROOF STRUCTURE AND METHOD OF FABRICATING THE SAME

(71) Applicant: Samsung Electronics Co., Ltd., Suwon-si (KR)

(72) Inventors: Seung-Jun Lee, Suwon-si (KR); Woonkyung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/759,584

(22) Filed: Feb. 5, 2013

(65) Prior Publication Data
US 2013/0171809 A1 Jul. 4, 2013

Related U.S. Application Data

(60) Division of application No. 13/014,188, filed on Jan. 26, 2011, now Pat. No. 8,395,206, and a continuation-in-part of application No. 12/588,270, filed on Oct. 9, 2009, now Pat. No. 8,476,713.

(30) Foreign Application Priority Data

Oct. 9, 2008 (KR) .......... 10-2008-0098896
Jan. 27, 2010 (KR) .......... 10-2010-0007505

(51) Int. Cl.
*H01L 29/792* (2006.01)
*H01L 21/76* (2006.01)

(52) U.S. Cl.
USPC ......................... 438/383; 257/324

(58) Field of Classification Search
USPC ................. 365/184; 257/324; 438/383
See application file for complete search history.

(56) References Cited

U.S. PATENT DOCUMENTS 6,157,067 A * 12/2000 Hsu et al. ............ 257/369
6,391,736 B1 5/2002 Uh et al.
6,551,895 B1 4/2003 Hsu et al.

(Continued)

FOREIGN PATENT DOCUMENTS

| JP | 06-338602 A | 12/1994 |
| KR | 10 2000-0052484 A | 8/2000 |
| KR | 10 2001-0045595 A | 6/2001 |
| KR | 10 2005-0072168 A | 7/2005 |

OTHER PUBLICATIONS

Tanaka, et al.; Bit Cost Scalable Technology with Punch and Plug Process for Ultra High Density Flash Memory; Symposium on VLSI Technology Digest of Technical Papers; pp. 14-15; 2007;978-4-900784-03-1;; VLSI Technology Digest.

(Continued)

*Primary Examiner* — Howard Weiss
*Assistant Examiner* — Steven Rao
(74) *Attorney, Agent, or Firm* — Lee & Morse, P.C.

(57) ABSTRACT

A semiconductor device has a substrate that includes a cell array region and a dummy pattern region surrounding the cell array region. The cell array region includes a cell structure having a plurality of cell active pillars extending in a vertical direction from the cell array region of the substrate and includes cell gate patterns and cell gate interlayer insulating patterns alternately stacked on the substrate. The cell gate patterns and cell gate interlayer insulating patterns have sides facing the cell active pillars. The dummy pattern region includes a damp-proof structure.

11 Claims, 63 Drawing Sheets

(56) References Cited

U.S. PATENT DOCUMENTS

| | | |
|---|---|---|
| 7,052,941 B2 | 5/2006 | Lee |
| 2005/0280061 A1 | 12/2005 | Lee |
| 2007/0252201 A1* | 11/2007 | Kito et al. ............... 257/331 |
| 2009/0121271 A1 | 5/2009 | Son et al. |

OTHER PUBLICATIONS

Fukuzumi, et al.; Optimal Integration and Characteristics of Vertical Array Devices for Ultra-High Density, Bit-Cost Scalable Flash Memory; IEEE; 2007; pp. 449-452;1-4244-0439-X/07; IEEE.

* cited by examiner

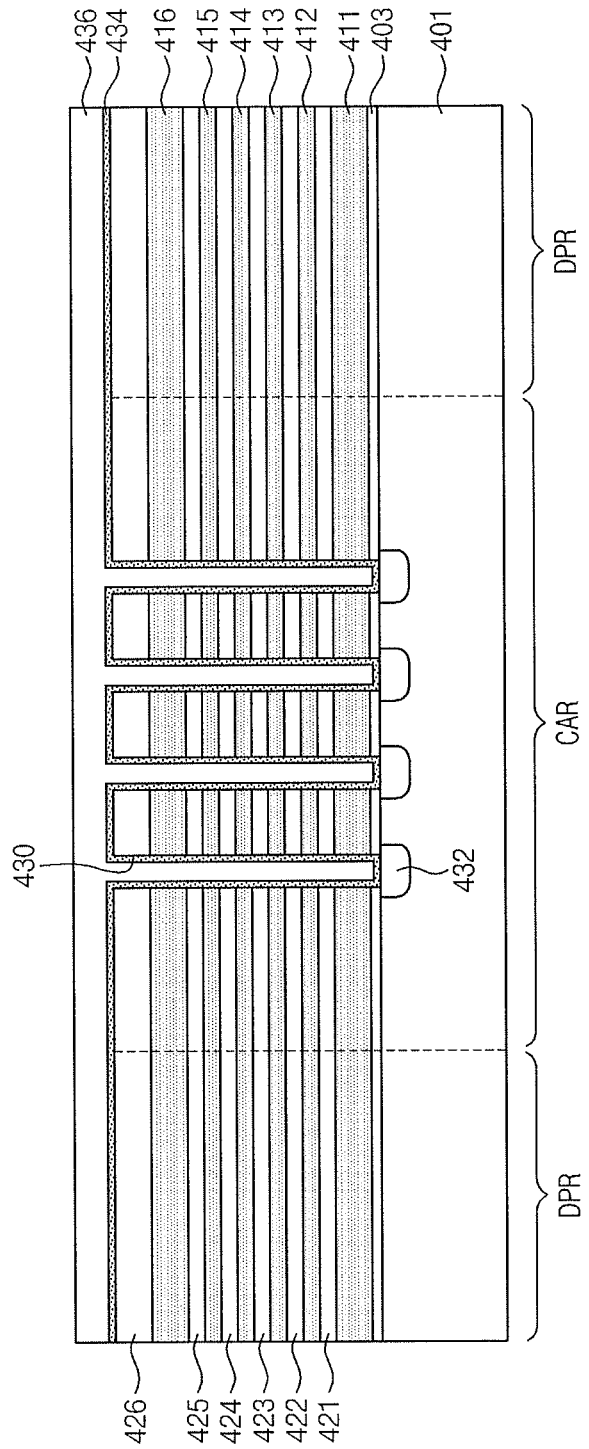

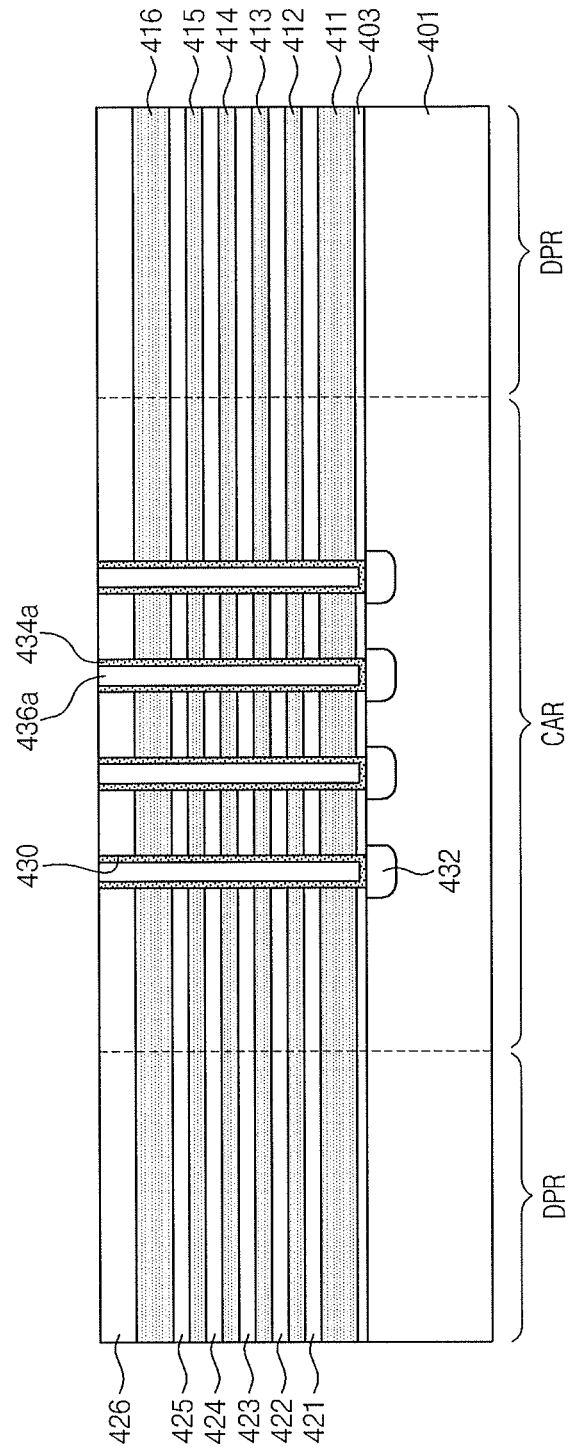

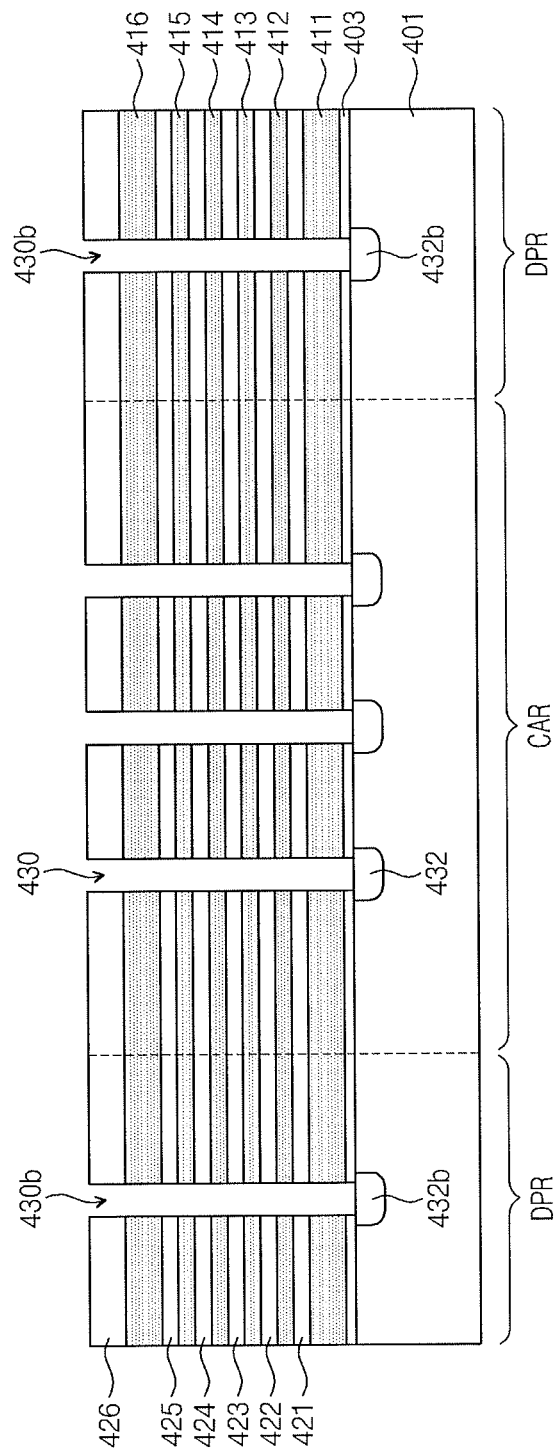

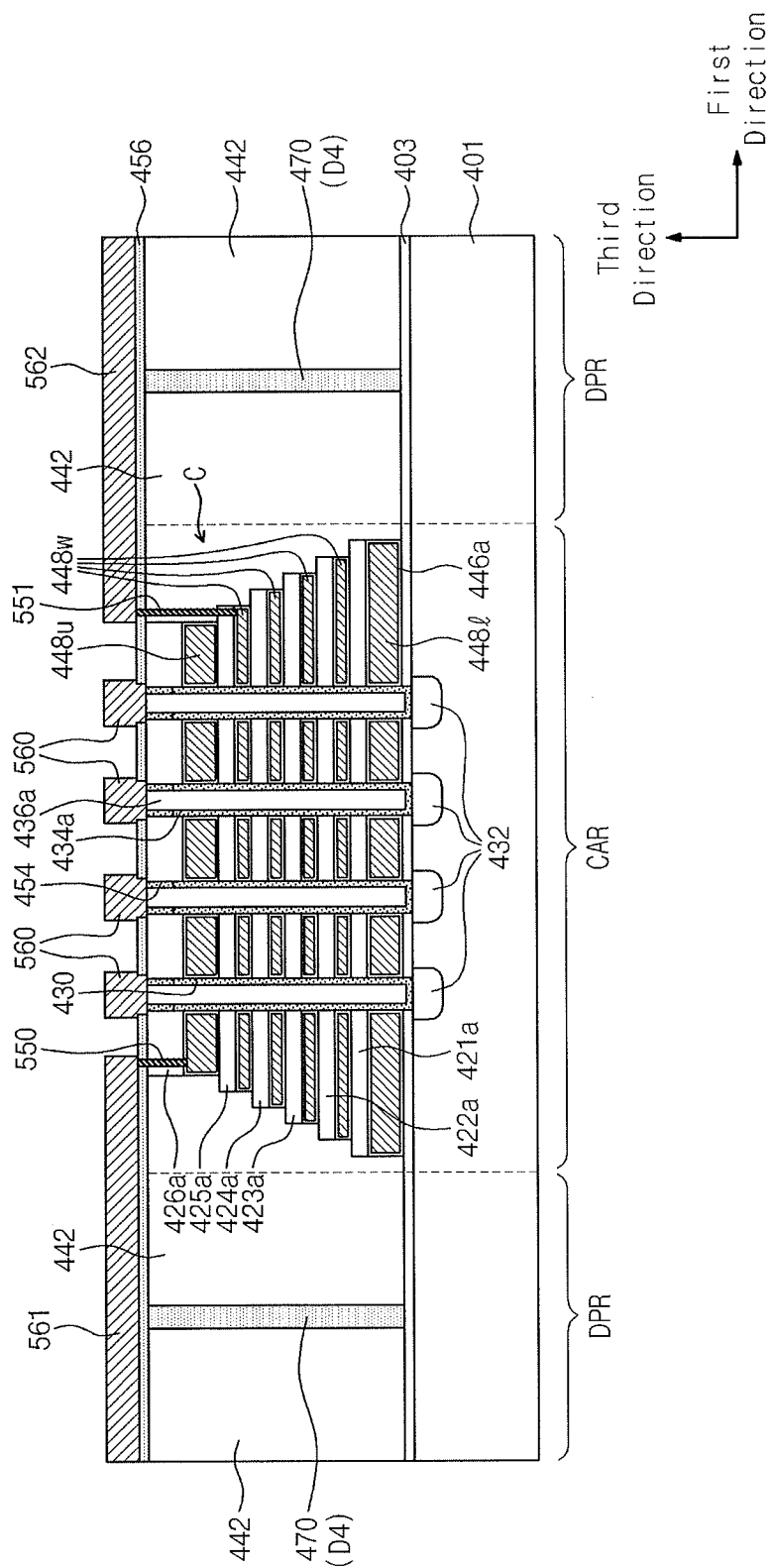

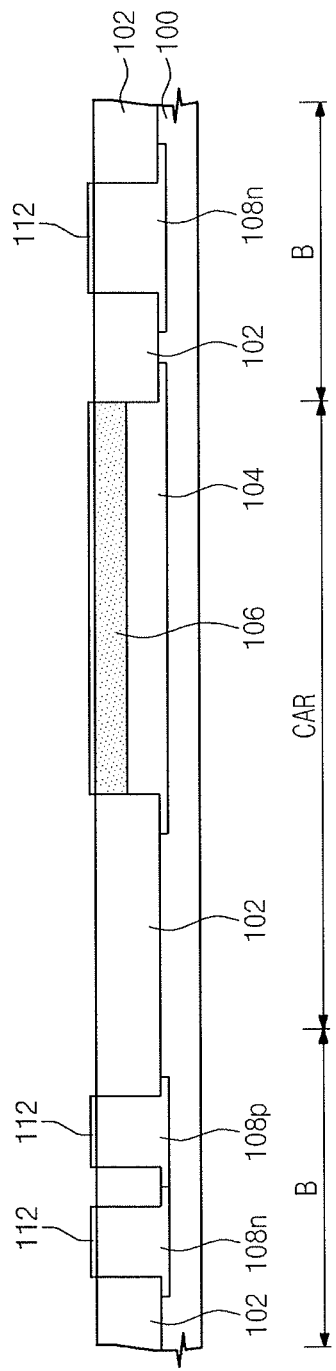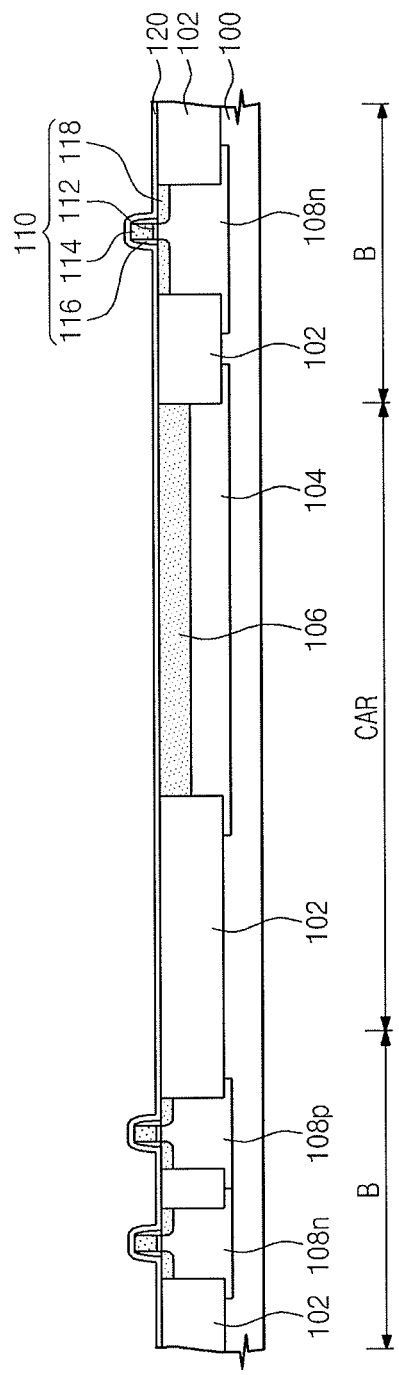

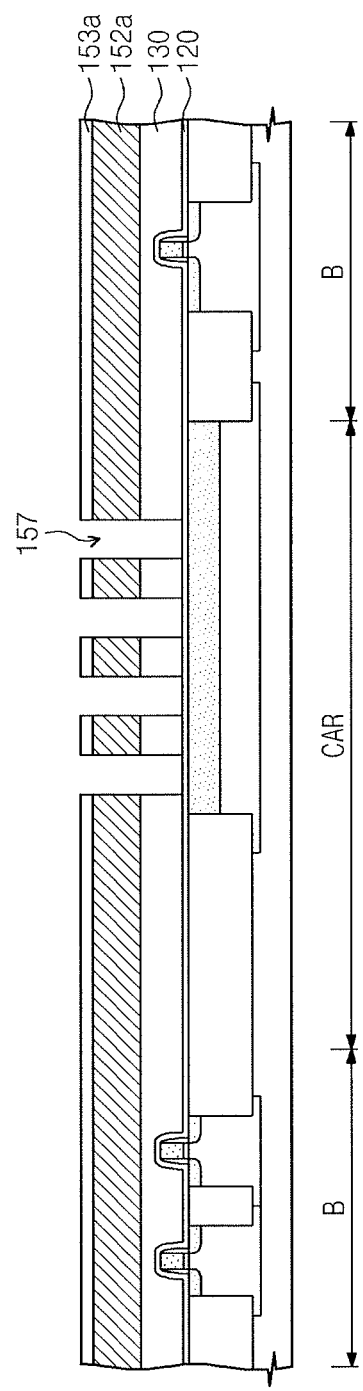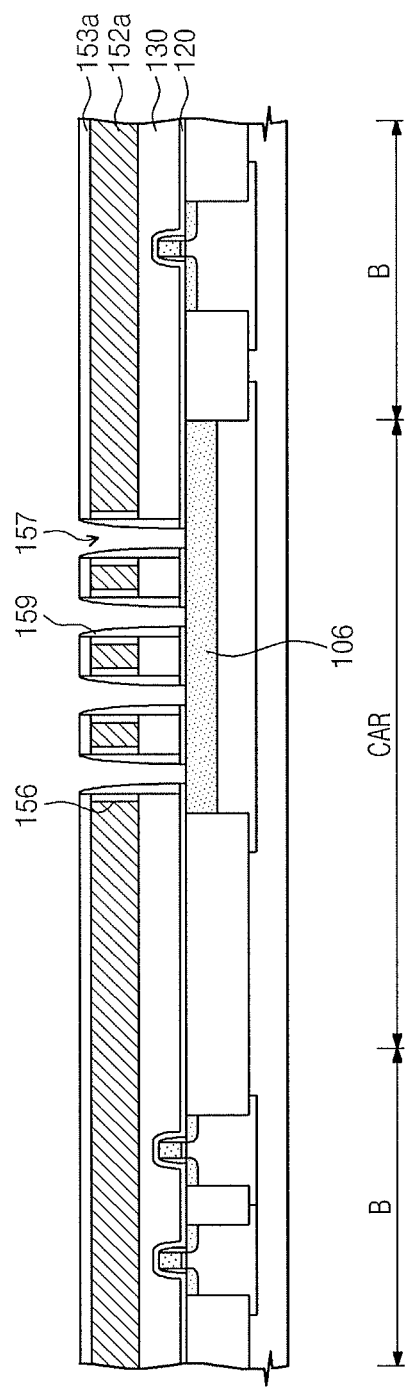

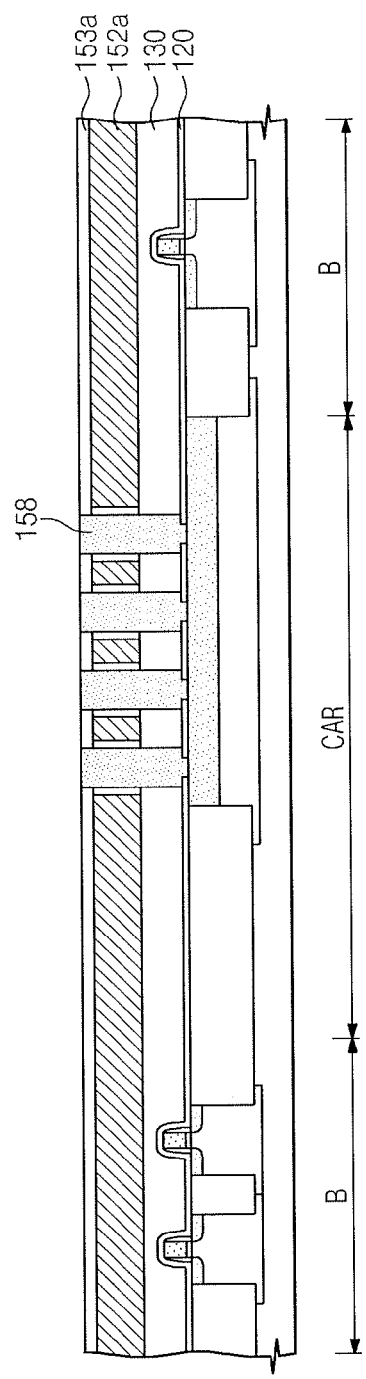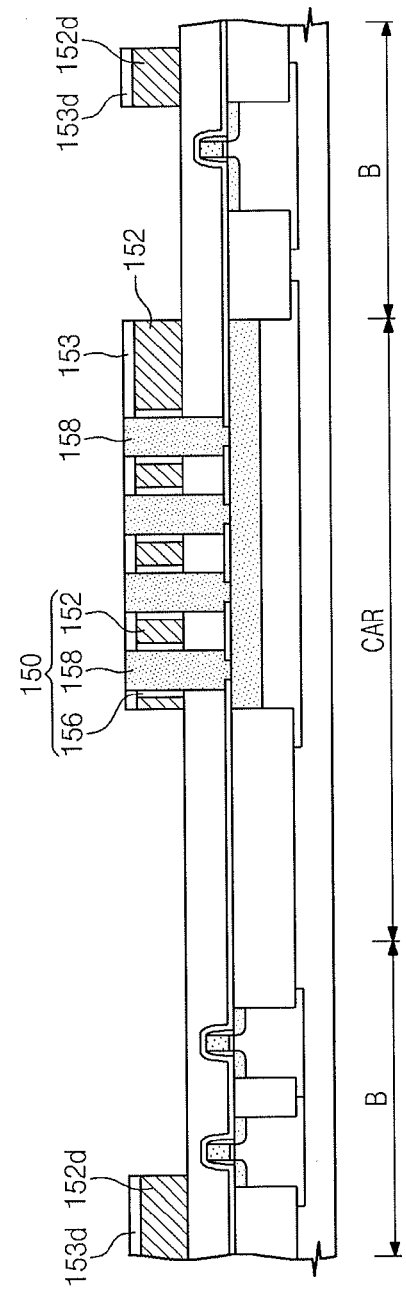

SEMICONDUCTOR DEVICE HAVING A DAMP-PROOF STRUCTURE AND METHOD OF FABRICATING THE SAME

CROSS-REFERENCE TO RELATED APPLICATIONS

This application is a division of U.S. patent application Ser. No. 13/014,188, filed Jan. 26, 2011, which in turn is a continuation-in-part of U.S. patent application Ser. No. 12/588, 270, filed Oct. 9, 2009, the entire contents of both or which are hereby incorporated by reference. U.S. patent application Ser. No. 12/588,270 claims priority to Korean Patent Application No. 10-2008-0098896, filed on Oct. 9, 2008, in the Korean Intellectual Property Office, and entitled: "Vertical-Type Semiconductor Device and Method of Manufacturing the Same."

BACKGROUND

1. Field

Embodiments relate to a semiconductor device and a method of fabricating the same, and to a vertical-type nonvolatile memory device and a method of fabricating the same.

2. Description of the Related Art

In response to users' needs, good performance and low price may be sought for semiconductor devices. To address the users' needs, semiconductor devices may have an increased integration degree. For example, in semiconductor memory devices, the integration degree may be a significant factor for determining prices. In particular, in two-dimensional or planar semiconductor memory devices, the integration degree may be determined by an occupying area of each unit memory cell. The memory devices are also greatly influenced by the level of technique for forming fine patterns. However, since the highest-priced equipments may be necessary for forming hyper-fine patterns, the integration degree of the two-dimensional semiconductor memory devices is very limited.

An alternative for overcoming the above limitations of two-dimensional or planar semiconductor memory devices, includes forming three-dimensional semiconductor memory devices provided with three-dimensionally arranged memory cells. However, in order to massively produce the three-dimensional semiconductor memory device, it may be necessary to have process techniques that can realize reliable products with a reduced manufacturing cost per a bit as compared to the two-dimensional or planar semiconductor memory devices.

SUMMARY

Embodiments are directed to a semiconductor device and a method of fabricating the same. Embodiments may be realized by providing a semiconductor device having a substrate that includes a cell array region and a dummy pattern region surrounding the cell array region, a cell structure that includes a plurality of cell active pillars extending in a vertical direction from the cell array region of the substrate and including cell gate patterns and cell gate interlayer insulating patterns alternately stacked on the substrate, the cell gate patterns and cell gate interlayer insulating patterns having sides facing the cell active pillars, and a damp-proof structure on the dummy pattern region of the substrate.

The damp proof structure may have a same height as the cell active pillars. The damp-proof structure may have a closed curve shape surrounding the cell array region. The damp proof structure may be a multi-layered structure that includes one of alternately stacked dummy sacrificial patterns and dummy interlayer insulating patterns or alternately stacked dummy gate patterns and dummy interlayer insulating patterns. The damp-proof structure may be step-shaped based on ends of the alternately stacked dummy sacrificial patterns and the dummy interlayer insulating patterns or ends of the alternately stacked dummy gate patterns and the dummy interlayer insulating patterns having a step-like shape. The damp-proof structure may include a damp-proof reinforcement structure, the damp-proof reinforcement structure penetrating the dummy sacrificial patterns and the dummy interlayer insulating patterns or penetrating the dummy gate patterns and the dummy interlayer insulating patterns. The damp proof structure may include the dummy sacrificial patterns and the dummy interlayer insulating patterns, and the dummy sacrificial patterns and the damp-proof reinforcement structure may include a same material. The damp-proof structure may include the damp-proof reinforcement structure that penetrates the dummy sacrificial patterns and the dummy interlayer insulating patterns, the dummy sacrificial patterns and the dummy interlayer insulating patterns surrounding the damp-proof reinforcement structure, and a dummy active pattern contacting the substrate. The damp proof structure may include a protective insulating pattern that is on the damp-proof reinforcement structure, the damp-proof reinforcement structure having a lower height than an upper surface of the dummy active pattern and the protective insulating pattern having an upper surface of the same height as the upper surface of the dummy active pattern.

The semiconductor device may include an outer interlayer insulating layer filling a gap between the cell structure and the damp-proof structure, and a damp-proof layer covering upper surfaces of the cell structure, the damp-proof structure, and the outer interlayer insulating layer. The device may include a plurality of contact plugs penetrating the damp-proof layer and contacting one of corresponding cell active pillars and cell gate patterns, and a plurality of interconnections contacting corresponding contact plugs and overlap the damp-proof structure. In the semiconductor device, ends of the cell gate patterns and the cell gate interlayer insulating patterns may have a step-like shape. The cell structure may include an information storage layer between the cell gate patterns and the cell active pillars. The information storage layer may extend between the cell gate patterns and the cell gate interlayer insulating patterns.

At least one of the above and other features and advantages may also be realized by providing a method of fabricating a semiconductor device that may include preparing a substrate including a cell array region and a dummy pattern region surrounding the cell array region, and may include forming a cell structure and a damp-proof structure on the cell array region and the dummy pattern region, respectively. Wherein the cell structure may include a plurality of cell active pillars extending in a vertical direction from the substrate, and cell gate patterns and cell gate interlayer insulating patterns may be alternately stacked on the substrate and have sides facing the cell active pillars.

The method may include forming an outer interlayer insulating layer filling a gap between the cell structure and the damp-proof structure, and forming a damp-proof layer covering upper surfaces of the cell structure, the damp-proof structure, and the outer interlayer insulating layer. The damp-proof structure may formed so as to surround the cell structure.

Forming of the cell structure and the damp-proof structure at the cell array region and the dummy pattern region, respectively, may include alternately stacking sacrificial layers and interlayer insulating layers on an entire surface of the substrate to form a stacked structure, forming the plurality of cell active pillars in contact holes penetrating the stacked structure in the cell array region, the cell active pillars being in contact with the substrate, forming a cell preliminary structure and a damp-proof structure spaced apart from each other on the cell array region and the dummy pattern region, respectively, by patterning the sacrificial layers and the interlayer insulating layers, forming an outer interlayer insulating layer that fills a gap between the cell preliminary structure and the damp-proof structure, and removing the cell sacrificial patterns in the cell array region and forming cell gate patterns in a region where the cell sacrificial patterns are removed. Wherein the cell preliminary structure may include alternately stacked cell sacrificial patterns and cell gate interlayer insulating patterns and includes the cell active pillars, and the damp-proof structure includes alternately stacked dummy sacrificial patterns and dummy interlayer insulating patterns. A damp-proof reinforcement structure that penetrates the dummy sacrificial patterns and the dummy interlayer insulating patterns at the dummy pattern region, may be formed after forming the cell gate patterns.

Forming of the cell structure and the damp-proof structure at the cell array region and the dummy pattern region, respectively, may include alternately stacking sacrificial layers and interlayer insulating layers on an entire surface of the substrate to form a stacked structure, forming the plurality of cell active pillars in first contact holes penetrating the stacked structure in the cell array region, the cell active pillars being in contact with the substrate, and forming a damp-proof reinforcement structure in second contact holes penetrating the stacked structure in the dummy pattern region, forming a cell preliminary structure and a damp-proof structure spaced apart from each other on the cell array region and the dummy pattern region, respectively, by patterning the sacrificial layers and the interlayer insulating layers, forming an outer interlayer insulating layer that fills a gap between the cell preliminary structure and the damp-proof structure, and removing the cell sacrificial patterns at the cell array region and forming cell gate patterns in a region where the cell sacrificial patterns are removed. Wherein the cell preliminary structure may include alternately stacked cell sacrificial patterns and cell gate interlayer insulating patterns and includes the cell active pillars, and the damp-proof structure may include alternately stacked dummy sacrificial patterns and dummy interlayer insulating patterns and may include the damp-proof reinforcement structure. Forming of the plurality of cell active pillars and the damp-proof reinforcement structure may include forming dummy active patterns between the damp-proof reinforcement structure and the sacrificial layers and between the damp proof reinforcement structure and the interlayer insulating layers, and forming a protective insulating pattern on the damp-proof reinforcement structure, the protective insulating pattern having an upper surface that is a same height as upper surfaces of the cell active pillars.

Forming of the cell structure and the damp-proof structure at the cell array region and the dummy pattern region, respectively, may include alternately stacking conductive layers and interlayer insulating layers on an entire surface of the substrate to form a stacked structure, forming the plurality of cell active pillars in contact holes penetrating the stacked structure in the cell array region, the cell active pillars being in contact with the substrate, forming a cell structure and a damp-proof structure spaced apart from each other at the cell array region and the dummy pattern region, respectively, by patterning the conductive layers and the interlayer insulating layers, and forming an outer interlayer insulating layer that fills a gap between the cell structure and the damp-proof structure. Wherein the damp-proof structure may include alternately stacked dummy gate patterns and dummy interlayer insulating patterns.

Forming of the cell structure and the damp-proof structure at the cell array region and the dummy pattern region, respectively, may include alternately stacking conductive layers and interlayer insulating layers on an entire surface of the substrate to form a stacked structure, forming the plurality of cell active pillars in first contact holes penetrating the stacked structure in the cell array region, the cell active pillars being in contact with the substrate, and forming a damp-proof reinforcement structure in second contact holes penetrating the stacked structure in the dummy pattern region, forming a cell structure and a damp-proof structure spaced apart from each other on the cell array region and the dummy pattern region, respectively, by patterning the conductive layers and the interlayer insulating layers, and forming an outer interlayer insulating layer that fills a gap between the cell structure and the damp-proof structure. Wherein the damp-proof structure may include alternately stacked dummy gate patterns and dummy interlayer insulating patterns and may include the damp-proof reinforcement structure.

BRIEF DESCRIPTION OF THE DRAWINGS

Features will become apparent to those of ordinary skill in the art by describing in detail exemplary embodiments with reference to the attached drawings, in which:

FIGS. 5A, 6A, 7A, 8A, 9A, 10A, 11A, and 12A illustrate cross-sectional views showing sequential processes of fabricating the semiconductor device of FIG. 3 along line I-I';

FIGS. 17B, 18B, 19B, 20B, 21B, 22B, and 23B illustrate cross-sectional views showing sequential processes of fabricating the semiconductor device of FIG. 15 along lines II-II';

FIGS. 25A and 25B illustrate cross-sectional views taken along respective lines I-I' and II-II' of FIG. 24;

FIGS. 29 through 44 illustrate cross-sectional views showing sequential processes of fabricating the semiconductor device of FIG. 27 along III-III';

DETAILED DESCRIPTION

Figure 1:
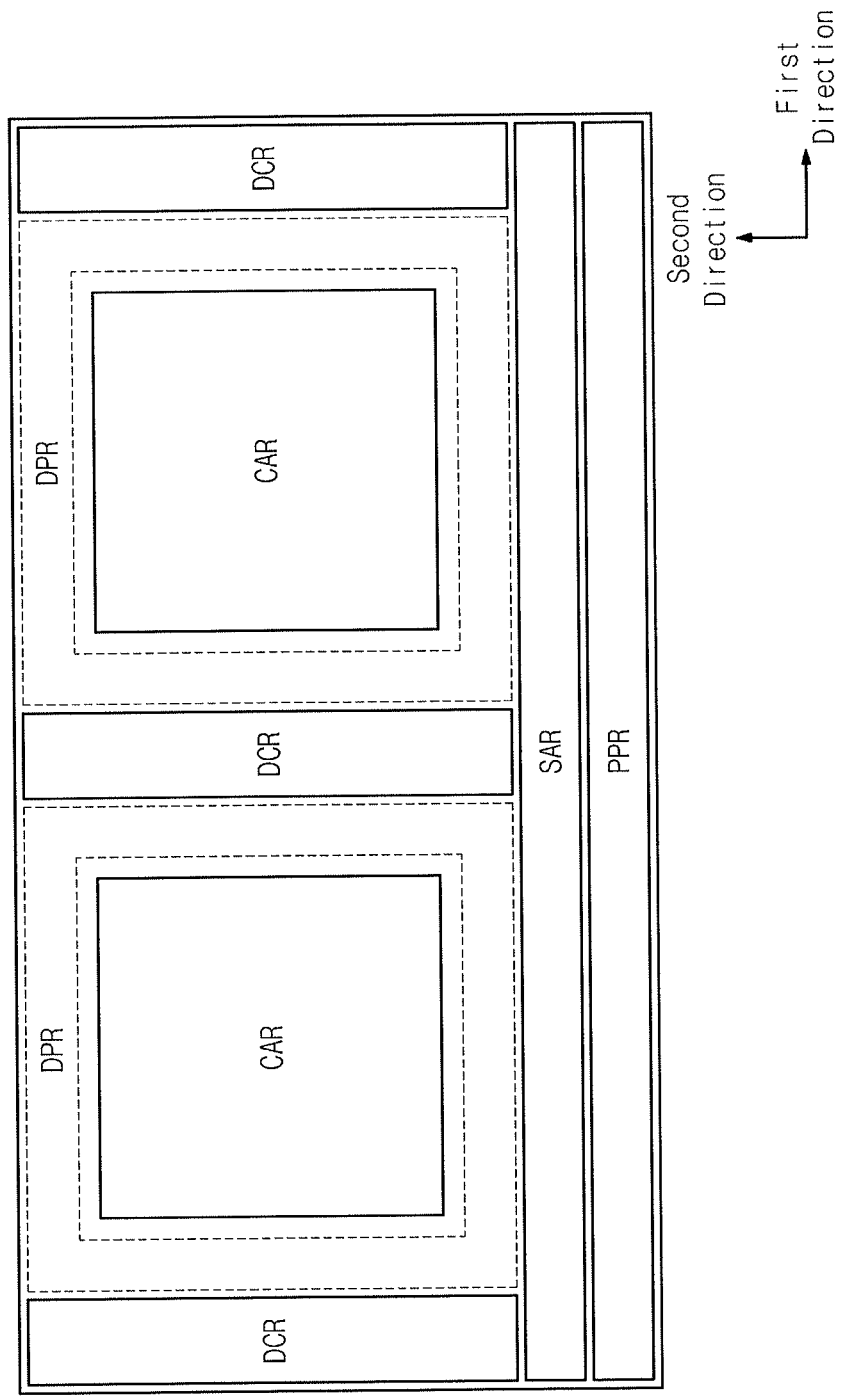
FIG. 1 illustrates a schematic layout of a semiconductor device according to an exemplary embodiment.

Korean Patent Application Nos. 10-2010-0007505 and 10-2008-0098896, filed on Jan. 27, 2010 and Oct. 9, 2008, respectively, in the Korean Intellectual Property Office, and entitled: "Semiconductor Device and Method of Fabricating the Same" and "Vertical-Type Semiconductor Device and Method of Manufacturing the Same," respectively, are incorporated by reference herein in their entireties.

Advantages and features of the present invention and methods of accomplishing the same may be understood more readily by reference to the following detailed description of exemplary embodiments and the accompanying drawings. The exemplary embodiments may be embodied in many different forms and should not be construed as being limited to the embodiments set forth herein. Rather, these embodiments are provided so that this disclosure will be thorough and complete and will fully convey the scope of the present invention to those skilled in the art. Like reference numerals refer to like elements throughout the specification.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when any layers such as a conductive layer, a semiconductor layer, and an insulating layer are referred to as being "on" another material layer or substrate, it may be directly on the other material layer or substrate or intervening elements or layers may be present. In addition, it will also be understood that when a layer is referred to as being "between" two layers, it can be the only layer between the two layers, or one or more intervening layers may also be present.

Example embodiments are described herein with reference to cross-sectional illustrations and/or plane illustrations that are schematic illustrations of exemplary embodiments. In drawings, the thickness of layers and regions may be exaggerated to effectively describe technical details. Accordingly, variations from the shapes of the illustrations as a result, e.g., of manufacturing techniques and/or tolerances, are to be expected. Thus, example embodiments should not be construed as limited to the shapes of regions illustrated herein, but are to include deviations in shapes that result, e.g., from manufacturing. For example, an etching region illustrated as a rectangle may have rounded or curved features. Thus, the regions illustrated in the figures are schematic in nature and their shapes are not intended to illustrate the actual shape of a region of a device, and are not intended to limit the scope of example embodiments.

Hereinafter, exemplary embodiments will be described with reference to the accompanying drawings. A semiconductor memory device according to the exemplary embodiments has a three-dimensional structure.

FIG. 1 is a schematic layout of a semiconductor device according to an exemplary embodiment.

Referring to FIG. 1, the semiconductor device may include a plurality of cell array regions CAR, a plurality of dummy pattern regions DPR, at least one peripheral circuit region PPR, at least one sense amplifier region SAR, and a plurality of decoding regions DCR. A plurality of memory cells may be disposed in each cell array region CAR. Bitlines and wordlines may be disposed in the cell array region CAR to make an electrical connection between the memory cells. Circuits may be disposed at the peripheral region PPR to drive the memory cells, and circuits may be disposed at the sense amplifier region SAR to read information stored in the memory cells. The dummy pattern region DPR may be disposed so as to surround the cell array region CAR. The dummy pattern region DPR may be disposed between the cell array region CAR and the decoding circuit region DCR and the cell array region CAR and the sense amplifier region SAR. The bitlines and the wordlines, which are disposed at the cell array region CAR, may be electrically connected to the decoding circuit region DCR and the sense amplifier region SAR by an interconnection structure that passes through a top of the dummy pattern region DPR.

The dummy pattern region DPR is not limited to the disposition of FIG. 1, e.g., the dummy pattern region DPR may be disposed so as to surround two or more cell array regions CAR. For example, at least two cell array regions CAR may be disposed within a region defined by the dummy pattern region DPR. The decoding circuit region DCR and/or the sense amplifier region SAR may be disposed in the dummy pattern region DPR.

Figure 2:
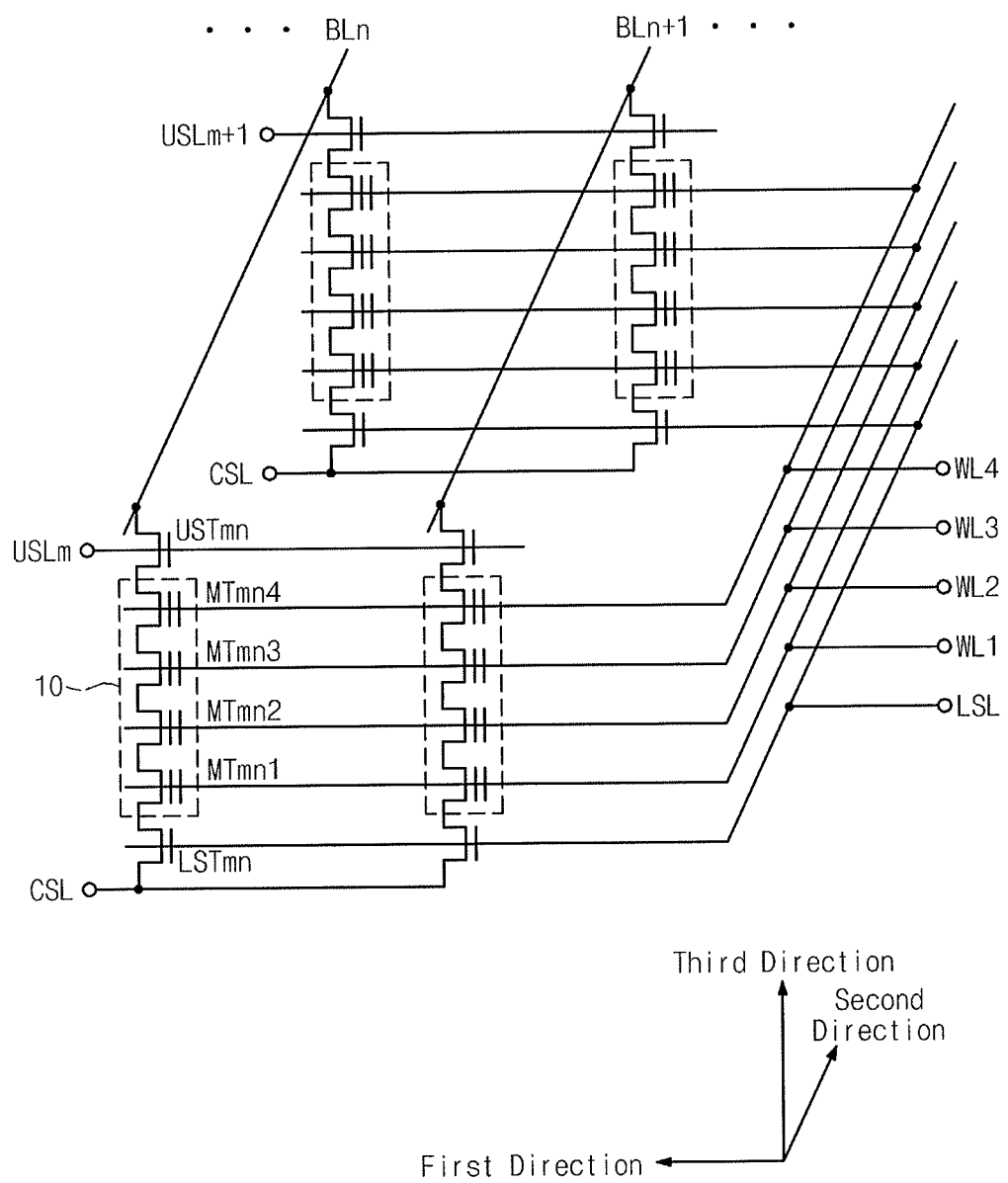
FIG. 2 illustrates a circuit diagram of the semiconductor device according to an exemplary embodiment.

With respect to a circuit diagram of the cell structure disposed in the cell array region CAR, it will now be described with reference to FIG. 2. FIG. 2 illustrates a circuit diagram of the semiconductor device according to an exemplary embodiment.

Referring to FIG. 2, the semiconductor device according to an exemplary embodiment includes a plurality of active pillars (not illustrated) extending vertically from a substrate of the cell array region. A plurality of wordlines WL1 to WL4 may be disposed at sides of the active pillars in a stacked structure. The adjacent wordlines may be isolated from each other through a gate interlayer insulating pattern (not illustrated). An information storage layer (not illustrated) may be disposed between the active pillar and the wordline. The information storage layer may include a charge trapping layer. The intersection of one active pillar with one wordline may provide one memory cell. The active pillar may provide a channel region, a source region, and a drain region of the memory cell. The memory cells MTmn1 to MTmn4, which are vertically disposed in a continuous manner, e.g., along a third direction as shown in FIG. 2, may be connected to each other in series through the active pillars. The serially-connected memory cells MTmn1 to MTmn4 may form a string 10. In the semiconductor device, memory cells may also be horizontally disposed in a continuous manner, e.g., along a first direction and a second direction as shown in FIG. 2.

One end of the string 10 may be connected to one end of a lower selective transistor LSTmn. The lower selective transistor LSTmn may include a lower selective line LSL, a lower selective active pattern (not illustrated) disposed to penetrate the lower selective line LSL, and a lower selective gate insulating layer (not illustrated) disposed between the lower selective active pattern and the lower selective line LSL. The other end of the lower selective transistor may be connected to a common source line CSL formed on the semiconductor substrate.

The other end of the string 10 may be connected to one end of an upper selective transistor USTmn. Another end of the upper selective transistor USTmn may electively be connected to a bitline BL. The upper selective transistor USTmn may also be connected to an upper selective line USLm. For instance, one memory cell MTmn4 of the string 10 may be selected by one wordline WL4, one upper selective line USLm, and one bitline BLn.

According to exemplary embodiments, the semiconductor device, the cell array region CAR, and the dummy pattern region DPR will now be described in detail.

First Exemplary Embodiment

Figure 3:
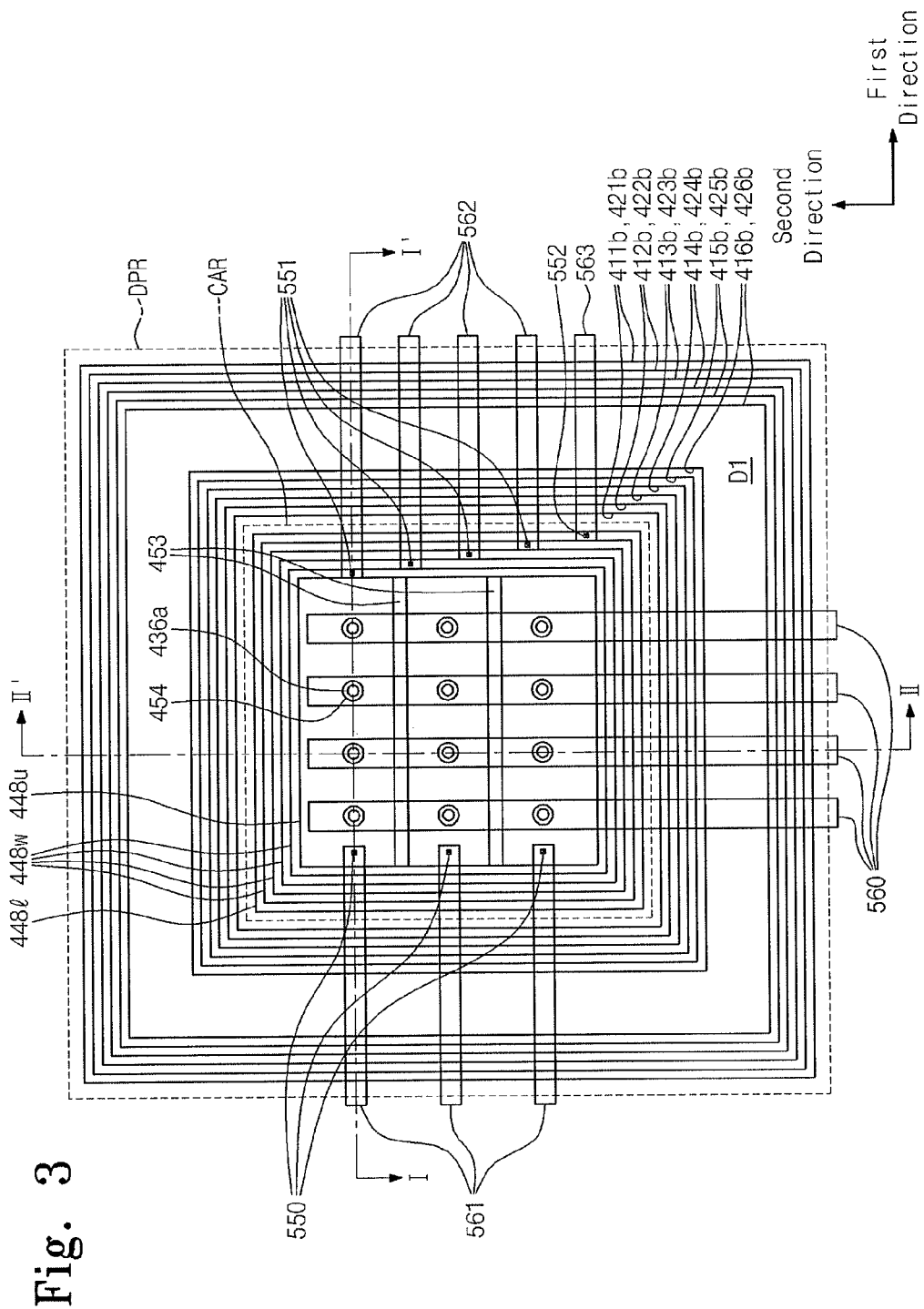
FIG. 3 illustrates a detailed plane view of a semiconductor device according to an exemplary embodiment.
Figure 4A:
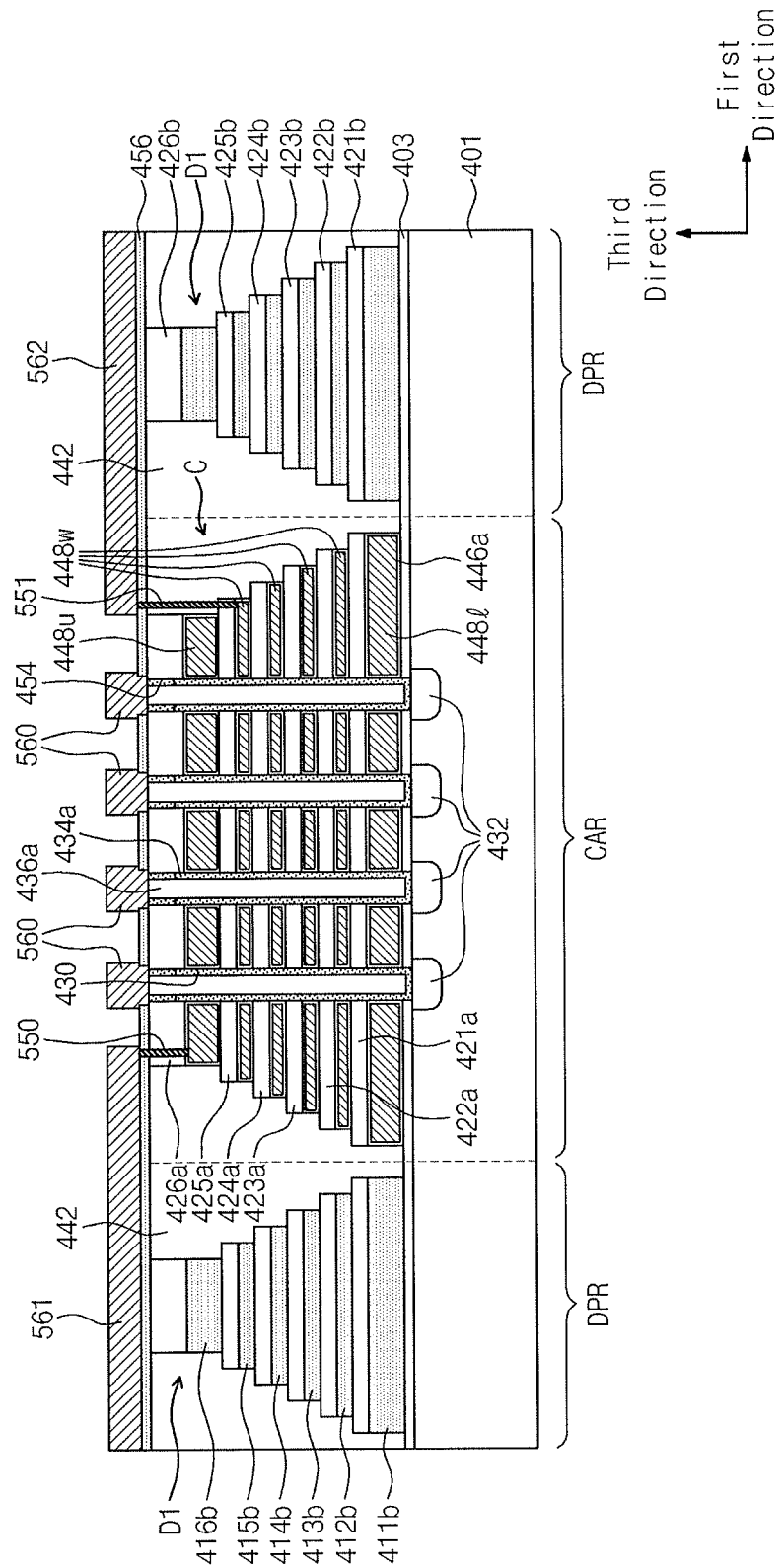
FIGS. 4A and 4B illustrate cross-sectional views taken along respective lines I-I' and II-II' of FIG. 3.
Figure 4B:
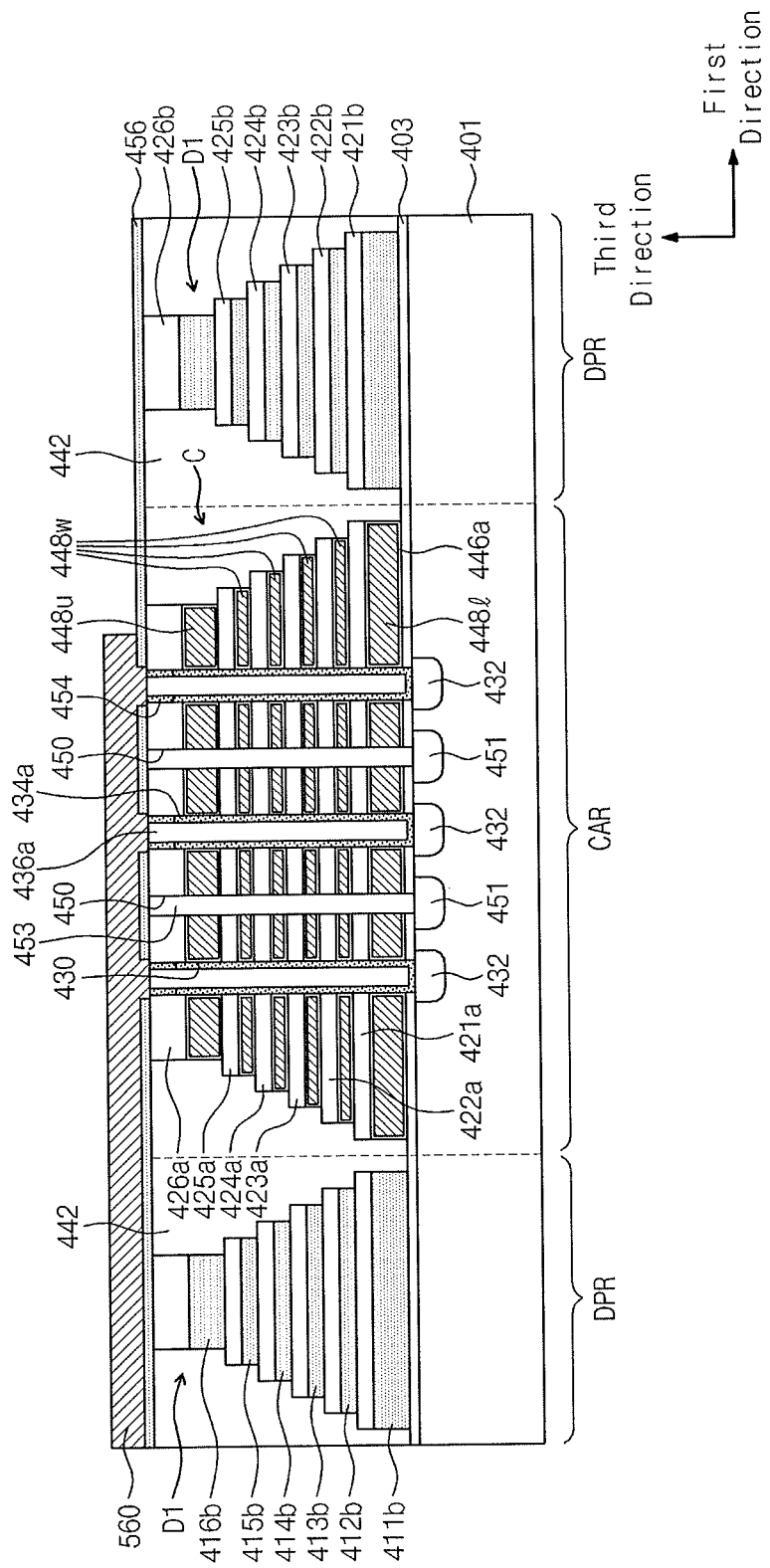

FIG. 3 illustrates a detailed plane view of a semiconductor device according to a first exemplary embodiment. FIGS. 4A and 4B illustrate cross-sectional views taken along the lines I-I' and II-II' of FIG. 3, respectively.

Referring to FIGS. 3, 4A, and 4B, the semiconductor device according to the first exemplary embodiment includes a semiconductor substrate 401 having the cell array region CAR and the dummy pattern surrounding the cell array region CAR. For example, a P-type impurity layer may be formed on the semiconductor substrate 401. A well region may be formed in the semiconductor substrate 401 (not shown). Substantially the entire surface of the semiconductor substrate 401 may be covered with a buffer layer 403. The buffer layer 403 may include at least one of a silicon oxide layer, a silicon nitride layer, and an oxynitride layer. The buffer layer 403 may protect the semiconductor substrate 401 and may act as an etching protective layer. A cell structure C may be disposed in the cell array region CAR, and a damp-proof structure D1 may be disposed in the dummy pattern region DPR. The cell structure C and the damp-proof structure D1 may be spaced apart from each other. The space between the cell structure C and the damp-proof structure D1 may be filled with an outer interlayer insulating layer 442. The damp-proof structure D1 may have a closed curve-shaped shape or plane surrounding the cell array region. For example, the damp-proof structure D1 may form a rectangle surrounding the cell array region. The cell structure C, the damp-proof structure D1, and the outer interlayer insulating layer 442 may have upper surfaces of the same height.

The cell structure C will now be described. The cell structure C may include a plurality of cell active pillars 434a, a plurality of cell gate patterns 448l, 448w, and 448u, and a plurality of cell gate interlayer insulating patterns 421a to 426a. The cell active pillars 434a vertically (third direction) extend from the cell array region CAR of the semiconductor substrate 401. The cell gate patterns 448l, 448w, and 448u and cell gate interlayer insulating patterns 421a to 426a may be stacked, e.g., alternately stacked, on sides of the cell active pillars 434a. In FIG. 3, the cell active pillars 434a may be disposed in the form of an island. The island-shaped cell active pillars 434a may be spaced apart from each other. An inner insulating pattern 453 parallel to a first direction may come in contact with the semiconductor substrate 401 by penetrating the cell gate patterns 448l, 448w, and 448u and the cell gate interlayer insulating patterns 421a to 426a. The inner insulating pattern 453 may be spaced apart from the cell active pillars 434a. The cell gate patterns 448l, 448w, and 448u may include a lower selective gate pattern 448l, a wordline gate pattern 448w, and an upper selective gate pattern 448u.

Each of the cell gate patterns 448l, 448w, and 448u may be disposed in parallel with the plane formed by a first direction and a second direction. The coplanar wordline gate patterns 448w may be connected to each other to form one wordline WL (see FIG. 2). The coplanar lower selective gate patterns 448l may be connected to each other to form one lower selective line LSL (see FIG. 2). The coplanar upper selective gate patterns 448u disposed at one side of the inner insulating pattern 453 may be connected to each other to form one upper selective line USL (see FIG. 2).

Ends of the cell gate patterns 448l, 448w, and 448u and the cell gate interlayer insulating patterns 421a to 426a may make a step-like shape. Alternatively, some sidewalls of the ends of the cell gate patterns 448l, 448w, and 448u and the cell gate interlayer insulating patterns 421a to 426a may be vertically aligned.

The cell active pillar 434a may have a hollow cup shape and may be formed of a silicon epitaxial layer or polysilicon layer undoped with impurities. A buried insulating pattern 436a may fill in the cell active pillar 434a. A drain region 454 may be disposed at the top of the cell active pillar 434a doped with some impurities.

An information storage layer 446a may be disposed between the cell active pillar 434a and the cell gate patterns 448l, 448w, and 448u. The information storage layer 446a may include a tunnel insulating layer, a charge trapping layer, and a blocking insulating layer. The information storage layer 446a, according to the first exemplary embodiment, may extend between the cell gate patterns 448l, 448w, and 448u and the cell gate interlayer insulating patterns 421a to 426a. For example, the information storage layer 446a may include a plurality of storage layers 446a that surround each of the cell gate patterns 448l, 448w, and 448u and the cell gate interlayer insulating patterns 421a to 426a. The information storage layer 446a may be interposed between the cell gate patterns 448l, 448w, and 448u and the outer interlayer insulating layer 442.

A first impurity implantation region 432 may be disposed in the semiconductor substrate 401 below the cell active pillar 434a. The first impurity implantation region 432 may be, e.g., P-type or N-type impurity implantation region. For the purpose of adjusting a threshold voltage of the lower selective transistor including the lower selective gate pattern 448l, the first impurity implantation region 432 may be disposed. A second impurity implantation region 451 may be disposed on the semiconductor substrate 401 below the inner insulating pattern 453. The second impurity implantation region 451 may be, e.g., an N+-type impurity implantation region and may act as a common source region.

The damp-proof structure D1 will now be described. The damp-proof structure D1 may include a plurality of dummy sacrificial patterns 411b to 416b and a plurality of dummy interlayer insulating patterns 421b to 426b, which are alternately stacked. Ends of the dummy sacrificial patterns 411b to 416b and the dummy interlayer insulating patterns 421b to 426b make a step-like shape. When some sidewalls of the ends of the cell gate patterns 448l, 448w, and 448u and the cell gate interlayer insulating patterns 421a to 426a are vertically aligned, some sidewalls of the ends of the dummy sacrificial patterns 411b to 416b and the dummy interlayer insulating patterns 421b to 426b may vertically be also aligned. The profile of the entire sidewalls in the damp-proof structure D1 may correspond to that of the entire sidewalls in the cell structure C.

The cell gate interlayer insulating patterns 421a to 426a include a first cell gate interlayer insulating pattern 421a to a sixth cell gate interlayer insulating pattern 426a. The dummy interlayer insulating patterns 421b to 426b include a first dummy interlayer insulating pattern 421b to a sixth dummy interlayer insulating pattern 426b. The cell gate interlayer insulating patterns 421a to 426a and the dummy interlayer insulating patterns 421b to 426b may contain the same materials, e.g., silicon oxide-based materials. The cell gate interlayer insulating patterns 421a to 426a and the dummy interlayer insulating patterns 421b to 426b may be formed simultaneously. The buried insulating pattern 436a, the inner insulating pattern 453, and the outer interlayer insulating layer 442 may contain silicon oxide-based materials.

The top of the damp-proof structure D1, the cell structure C, and the outer interlayer insulating layer 442 may be covered with a damp-proof layer 456. According to an exemplary embodiment, the damp-proof layer 456 and the dummy sacrificial patterns 411b to 416b contain the same materials. For example, the damp-proof layer 456 and the dummy sacrificial patterns 411b to 416b may all include a silicon nitride layer having excellent damp-proof and antifouling functions. Without intending to be bound by this theory, since the damp-proof layer 456 and the damp-proof structure D1 are each disposed at the top and the side of the cell structure C in the semiconductor device according to the first exemplary embodiment, damping or contamination of the top and the side of the cell structure C may be prevented and/or reduced.

The interconnection will now be described. In one end of the upper selective line, a first contact plug 550 may come into contact, e.g., direct contact, with the upper selective gate pattern 448u by penetrating the damp-proof layer 456, the sixth cell gate interlayer insulating pattern 426a, and the information storage layer 446a. The first contact plug 550 may come into contact with a first interconnection 561 extending in the first direction on the damp-proof layer 456. The first interconnection 561 may be connected to the decoding circuit region DCR of FIG. 1 by passing over the top of the damp-proof structure D1. In one end of the wordline, a second contact plug 551 may come into contact with the wordline gate pattern 448w by penetrating the damp-proof layer 456, the outer interlayer insulating layer 442, one of the second to fifth cell gate interlayer insulating pattern 422a to 425a, and the information storage layer 446a. The second contact plug 551 may come into contact with a second interconnection 562 extending in a direction opposite to the first interconnection 561 on the damp-proof layer 456. The second interconnection 562 may be connected to the decoding circuit region DCR of FIG. 1 by passing over the top of the damp-proof structure D1. In one end of the lower selective line, a third contact plug 552 may come into contact with the lower selective gate pattern 448l by penetrating the damp-proof layer 456, the outer interlayer insulating layer 442, the first cell gate interlayer insulating pattern 421a, and the information storage layer 446a. As shown in FIG. 3, the third contact plug 552 may be into contact with a third interconnection 563 extending in parallel with the second interconnection 562 on the damp-proof layer 456. The third interconnection 563 may be connected to the decoding circuit region DCR of FIG. 1 by passing through the top of the damp-proof structure D1. Each of bitlines 560 may come into contact with the drain region 454 of the upper part of the cell active pillar 434a by penetrating the damp-proof layer 456 and extending in the second direction. The bitlines 560 may be connected to the sense amplifier region SAR of FIG. 1 by passing through the top of the damp-proof structure D1. In drawings, even though the critical dimension of the contact plugs 550 to 552 is small, it is merely exaggerated for convenience of comprehension. The critical dimension of the contact plugs 550 to 552 may correspond to a minimum size capable of being realized in a photolithography process. The width of the contact plugs 550 to 552 may correspond to the width of the inner insulating pattern 453.

A method of fabricating the semiconductor device according to the first exemplary embodiment will now be described. FIGS. 5A, 6A, 7A, 8A, 9A, 10A, 11A, and 12A are cross-sectional views illustrating sequential processes of fabricating the semiconductor device having a cross-section of FIG. 4A. FIGS. 5B, 6B, 7B, 8B, 9B, 10B, 11B, and 12B are cross-sectional views illustrating sequential processes of fabricating the semiconductor device having a cross-section of FIG. 4B.

Figure 5A:
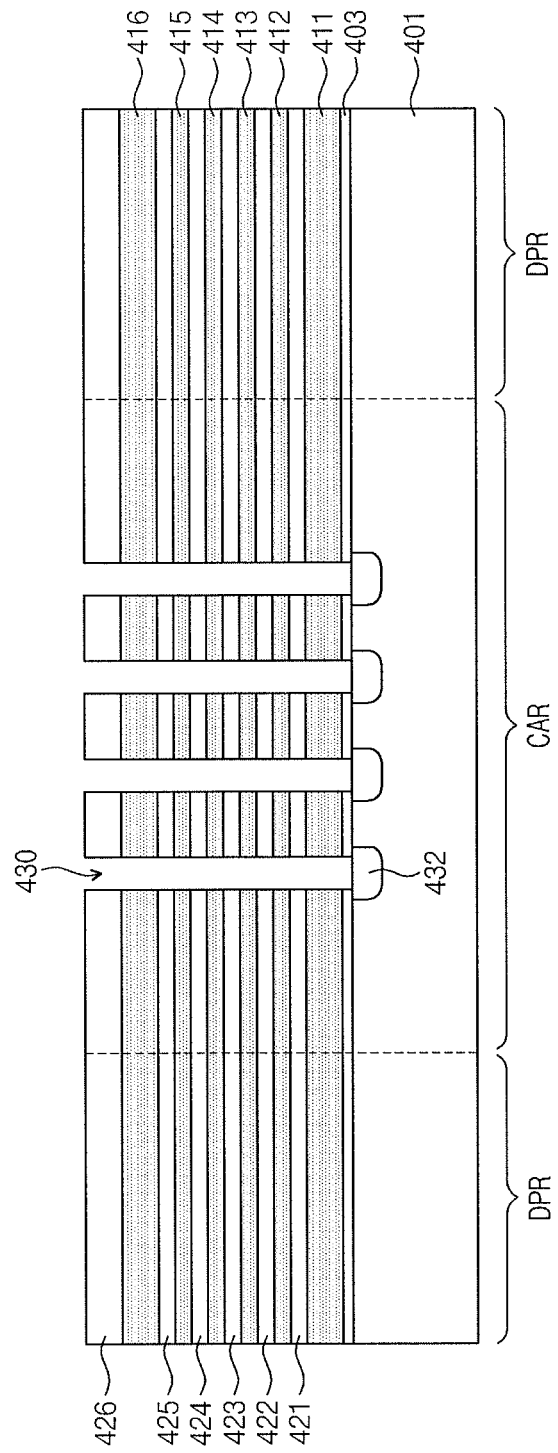
Figure 5B:
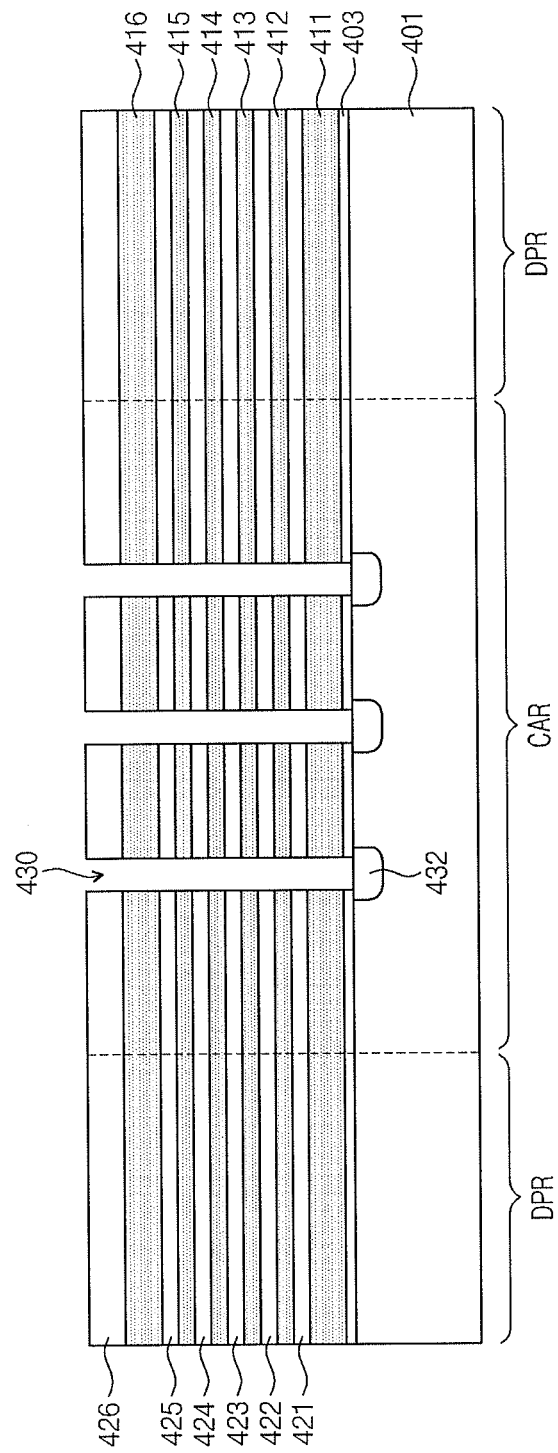
FIGS. 5B, 6B, 7B, 8B, 9B, 10B, 11B, and 12B illustrate cross-sectional views showing sequential processes of fabricating the semiconductor device of FIG. 3 along line II-II'.

Referring to FIGS. 5A and 5B, the buffer layer 403 may be formed, e.g., simultaneously formed, on the semiconductor substrate 401 including the cell array region CAR and the dummy pattern region DPR. The semiconductor substrate 401 may be doped with the P-type impurity. The buffer layer 403 may be formed by, e.g., a thermal oxidation process. Sacrificial layers 411 to 416 and interlayer insulating layers 421 to 426 may be alternately stacked on the buffer layer 403 to form a stacked structure. The sacrificial layers 411 to 416 may include a first sacrificial layer 411 to a sixth sacrificial layer 416. The interlayer insulating layers 421 to 426 may include a first interlayer insulating layer 421 to a sixth interlayer insulating layer 426. According to an exemplary embodiment, the sacrificial layers 411 to 416 may be formed of silicon nitrides. The interlayer insulating layers 421 to 426 may be formed of silicon oxide-based materials. In the cell array region CAR, the interlayer insulating layers 421 to 426, the sacrificial layers 411 to 416, and the buffer layer 403 may be sequentially patterned, thereby forming island-shaped active holes 430 spaced apart from each other. The semiconductor substrate 401 may be exposed by the active holes 430. At least one first impurity implantation region 432 may be formed in the semiconductor substrate 401, which is exposed by a corresponding active hole 430, through an ion implantation process. The first impurity implantation region 432 may be formed by doping the N-type or P-type impurity.

Figure 6B:
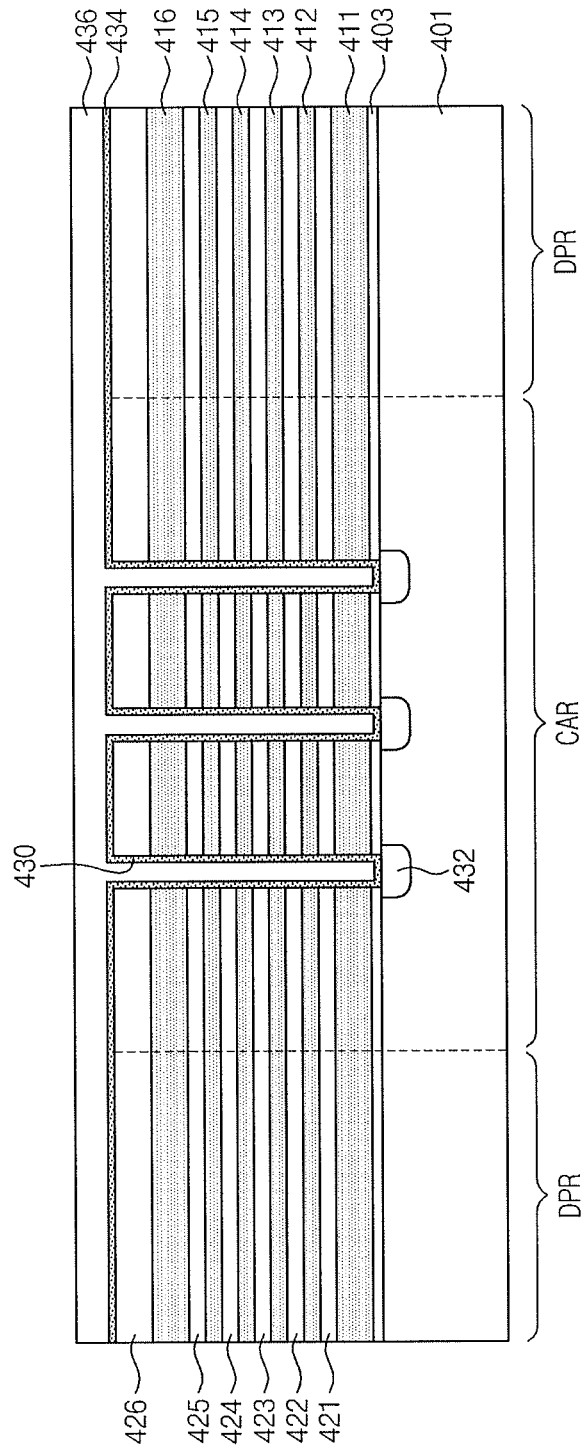

Referring to FIGS. 6A and 6B, an active layer 434 may be conformally formed on the entire surface of the semiconductor substrate 401. For example, the active layer 434 may cover an upper surface of an upper-most interlayer insulating layer, e.g., interlayer insulating layer 426, and may cover side walls and a bottom surface of each active hole 430. Using CVD (Chemical Vapor Deposition) or ALD (Atomic Layer Deposition), the active layer 434 may be formed by conformally depositing, e.g., a polysilicon layer undoped with impurities. In order to make the polysilicon layer into a monocrystalline silicon epitaxial layer, the thermal oxidation process may be performed. The active layer 434 may have a thickness such that the active holes 430 are not filled by the active layer 434. A buried insulating layer 436 may be stacked on the active layer 434. The buried insulating layer 436 may fill the remaining portions of the active holes 430 that are not filled by the active layer. As such, the active layer 434 and the buried insulating layer 436 may fill each active hole 430. The buried insulating layer 436 may be formed of, e.g., silicon oxide-based materials.

Figure 7B:
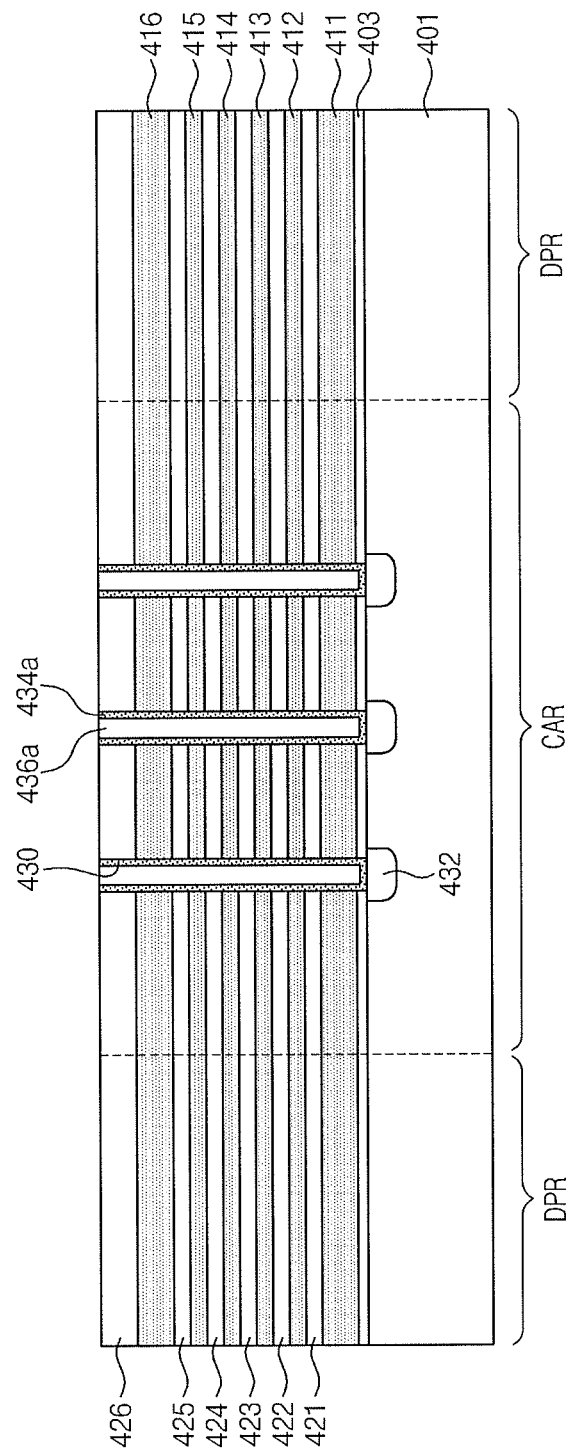

Referring to FIGS. 7A and 7B, the buried insulating layer 436 and the active layer 434 may be planarized and etched, thereby forming the cell active pillars 434a and the buried insulating patterns 436a in the active holes 430. The cell active pillars 434a may cover an inner wall and a bottom of the active holes 430, and the buried insulating patterns 436a may fill, e.g., substantially completely fill, a space between adjacent the cell active pillars 434a and the active holes 430. According to an exemplary embodiment, the sixth interlayer insulating layer 426 may act as a planarization and etch stop layer.

Figure 8A:
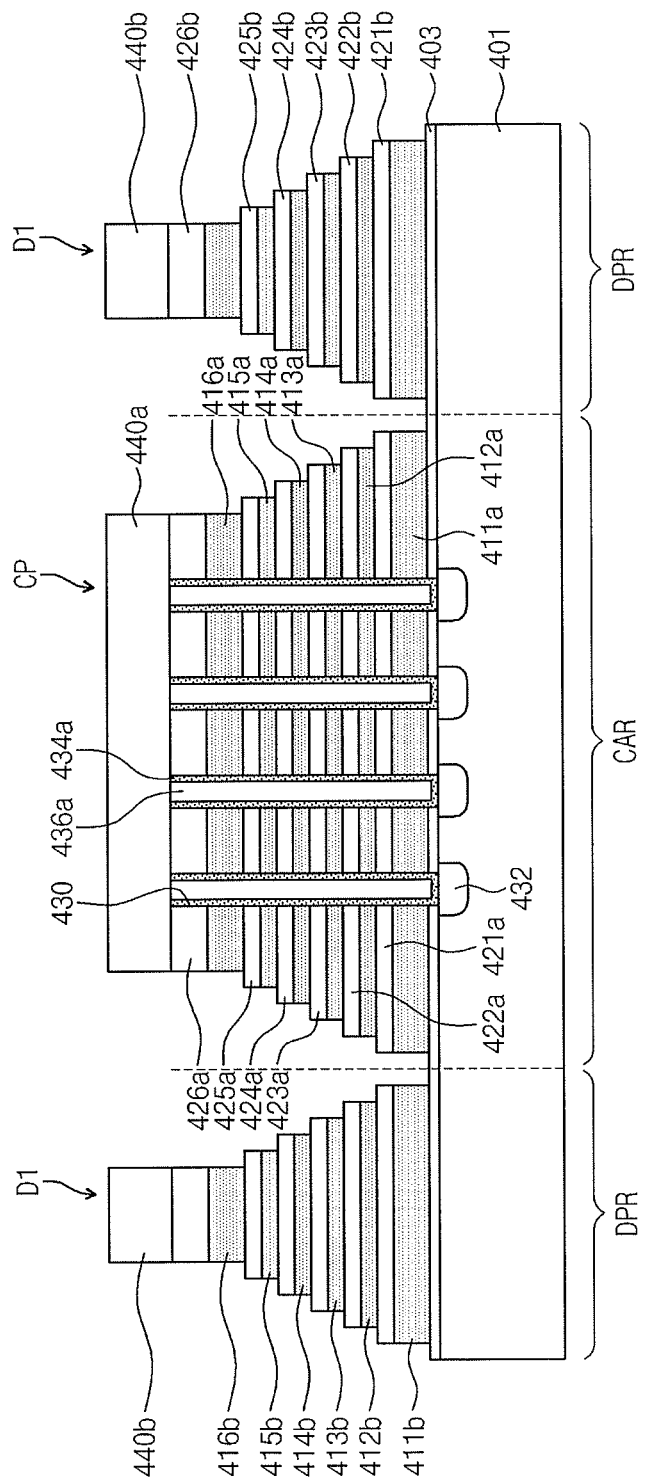
Figure 8B:
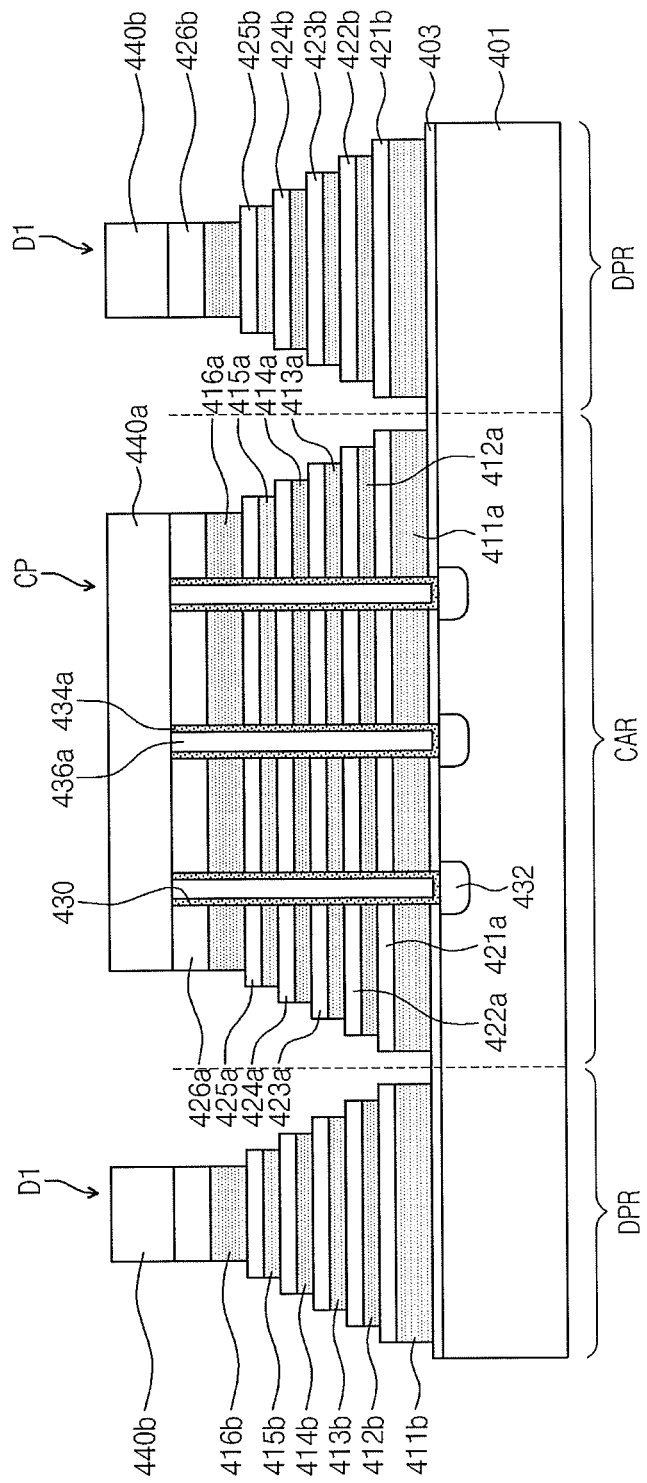

Referring to FIGS. 8A and 8B, sacrificial mask patterns 440a and 440b may be formed on the entire surface of the semiconductor substrate 401 in which the cell active patterns 434a and the buried insulating pattern 436a are formed. The sacrificial mask patterns 440a and 440b may include a cell sacrificial mask pattern 440a and a dummy sacrificial mask pattern 440b, which are formed in the cell array region CAR and the dummy pattern region DPR, respectively. For example, the sacrificial mask patterns 440a and 440b may be photoresist patterns. The sacrificial layers 411 to 416 and the interlayer insulating layer 421 to 426 may be patterned by using the sacrificial mask patterns 440a and 440b as an etch mask, thereby forming a cell preliminary structure CP provided with cell sacrificial patterns 411a to 416a and cell gate interlayer insulating patterns 421a to 426a in the cell array region CAR and forming the damp-proof structure D1 provided with dummy sacrificial patterns 411b to 416b and dummy interlayer insulating patterns 421b to 426b in the dummy pattern region DPR. The ends of the cell sacrificial patterns 411a to 416a and the cell gate interlayer insulating patterns 421a to 426a may be formed in the step-like shape. Furthermore, the ends of the dummy sacrificial patterns 411b to 416b and the dummy interlayer insulating patterns 421b to 426b may be formed in the step-like shape.

According to an exemplary embodiment, the cell preliminary structure CP and the damp-proof structure D1 having the step-like shape may be formed by performing an exhaustive etching process using the sacrificial mask patterns 440a and 440b as an etch mask. Specifically, the exhaustive etching process may be performed by alternately proceeding plural isotropic etching processes and anisotropic etching processes over and over again. For example, sacrificial mask patterns having the dimension of the lowermost sacrificial layer patterns 411a and 411b are formed, and the anisotropic etching process is performed by using the sacrificial mask patterns as an etch mask, thereby forming the lowermost sacrificial layer patterns 411a and 411b. Then, the sacrificial mask patterns are diminished in vertical and horizontal dimensions by the isotropic etching process. In addition, the isotropic etching process is performed by using the diminished sacrificial mask patterns as an etch mask, thereby forming the sacrificial layer patterns 412a and 412b directly above the lowermost sacrificial layer patterns 411a and 411b. By repeatedly performing the isotropic etching process and the anisotropic etching process, the sacrificial layer patterns may be formed in the step-like shape. In the exhaustive etching process, the final sacrificial mask patterns 440a and 440b have the dimension of the uppermost sacrificial layer patterns 416a and 416b.

Figure 9A:
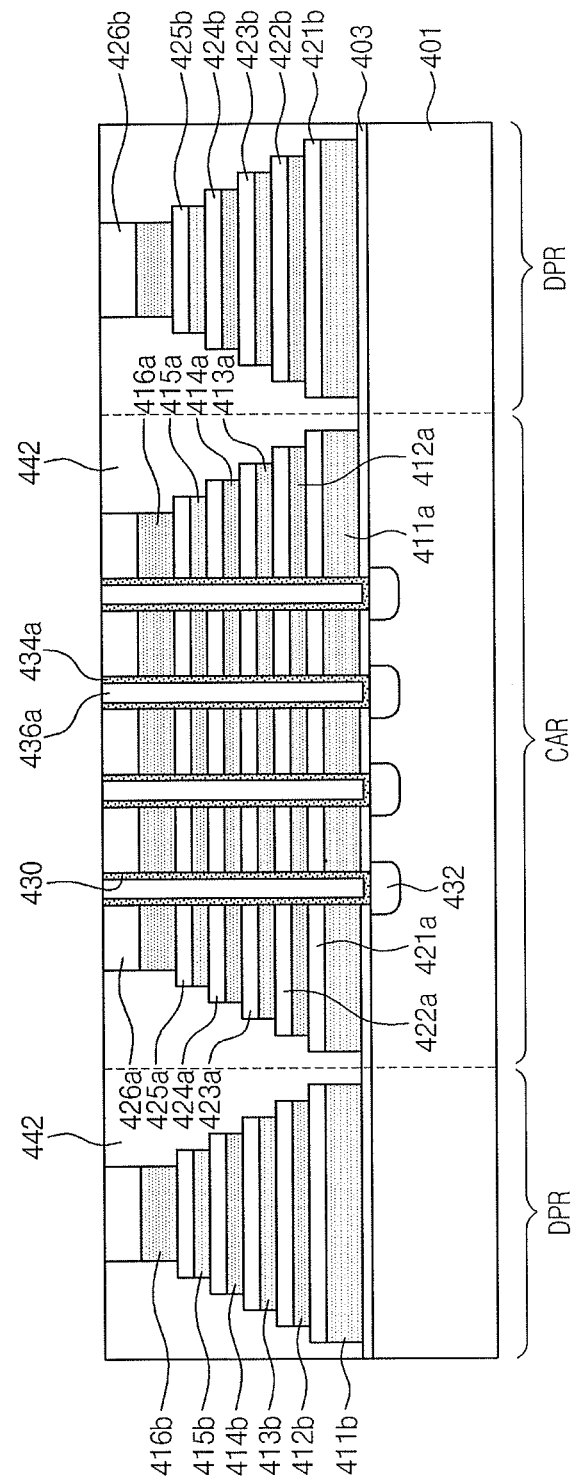
Figure 9B:
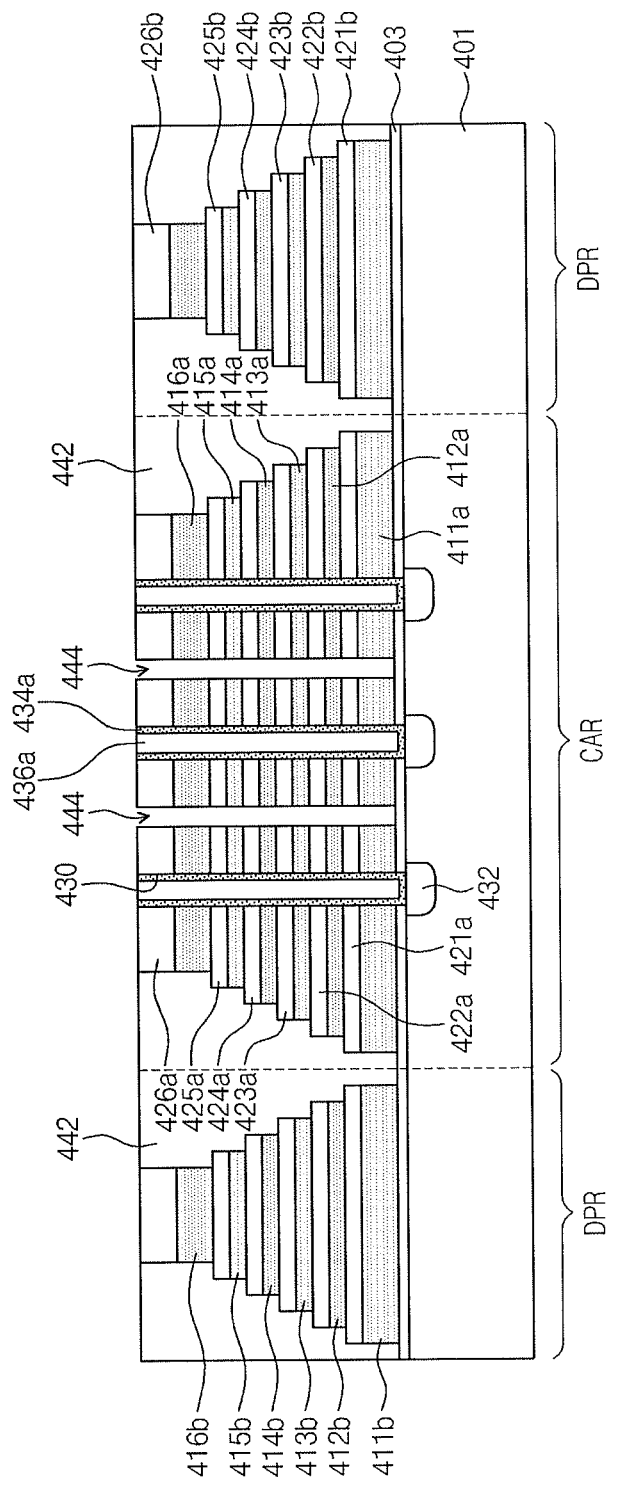

Referring to FIGS. 9A and 9B, after the sacrificial mask patterns 440a and 440b are removed, the outer interlayer insulating layers 442 may be formed on the entire surface of the semiconductor substrate 401 provided with the cell preliminary structure CP and the damp-proof structure D1. The outer interlayer insulating layers 442 may fill the gaps between the cell preliminary structure CP and the damp-proof structures D1. The upper surface of the cell active pillar 434a may be exposed by the planarization and etching of the outer interlayer insulating layer 442. According to an exemplary embodiment, the damp-proof structure D1 may be located between the peripheral circuit regions DCR, SAR, and PPR having a low pattern density and the cell array region SAR having a high pattern density. Without intending to be bound by this theory, it may be possible to reduce and/or prevent a dishing phenomenon that can occur during the planarization and etching process. The outer interlayer insulating layer 442 may be formed of, e.g., silicon oxide-based materials.

Referring to FIG. 9B, the cell gate interlayer insulating patterns 421a to 426a and the cell sacrificial patterns 411a to 416a may be etched in a region between the adjacent cell active pillars 434a, thereby forming at least one first groove 444 that exposes the upper surface of the buffer layer 403. The first groove 444 may be formed at the location corresponding to the inner insulating pattern 453 of FIG. 3.

Figure 10A:
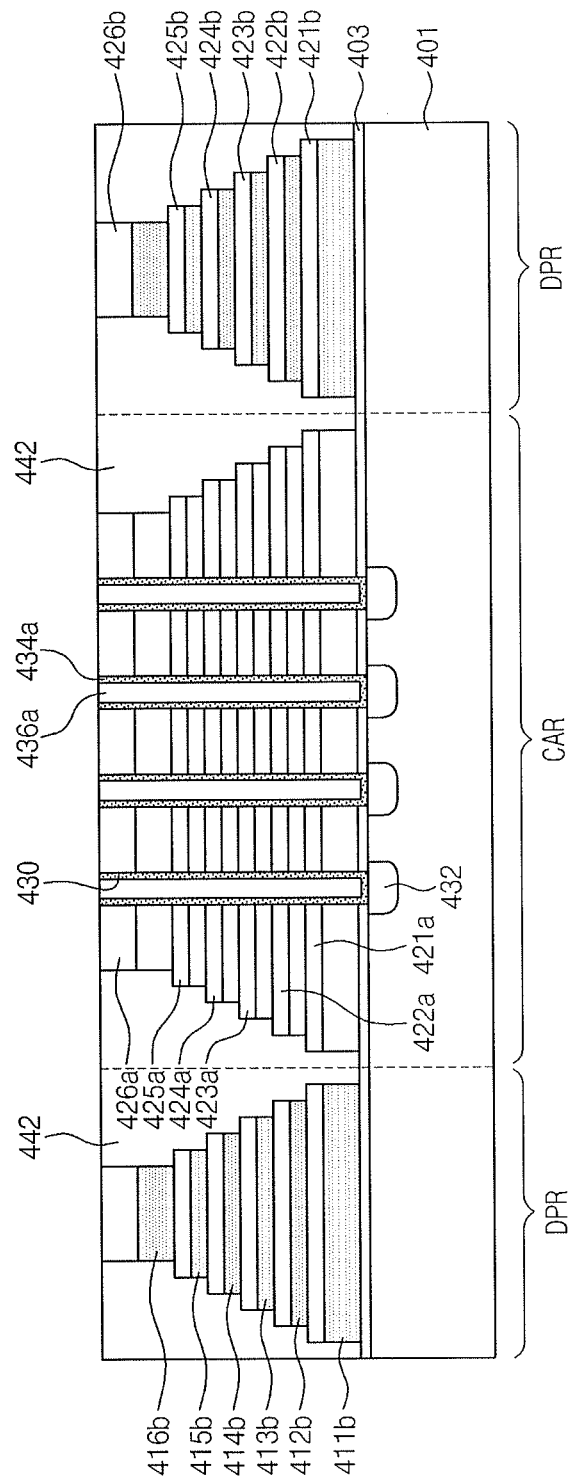
Figure 10B:
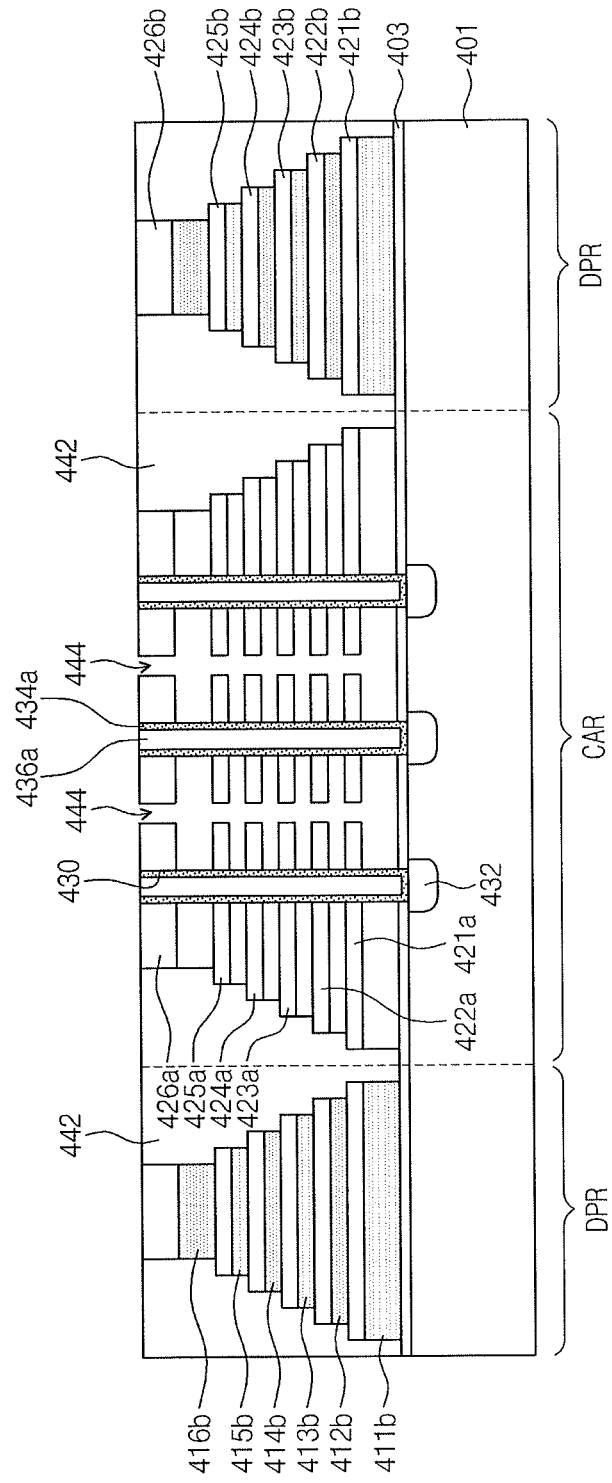

Referring to FIGS. 10A and 10B, the cell sacrificial patterns 411a to 416a, which have lateral sides exposed by the first groove 444, may be selectively removed. The cell sacrificial patterns 411a to 416a may be selectively removed by the isotropic etching process using an etching gas or etchant. When the cell sacrificial patterns 411a to 416a are formed of, e.g., the silicon nitride, the cell sacrificial patterns 411a to 416a may be selectively removed by using a phosphoric acid solution. Without intending to be bound by this theory, since one sidewall of the dummy sacrificial patterns 411b to 416b may come in contact with the outer interlayer insulating layer 442, the etching gas or etchant may not reach the dummy sacrificial patterns 411b to 416b. Accordingly, the dummy sacrificial patterns 411b to 416b may not be removed. The cell gate interlayer insulating patterns 421a to 426a, may not be removed by the etching gas or etchant. As shown in FIG. 10B, one sidewall of the outer interlayer insulating layer 442, the upper and lower surfaces of the cell gate interlayer insulating patterns 421a to 426a, and one sidewall of the cell active pillars 434a may be exposed by the isotropic etching process.

Figure 11A:
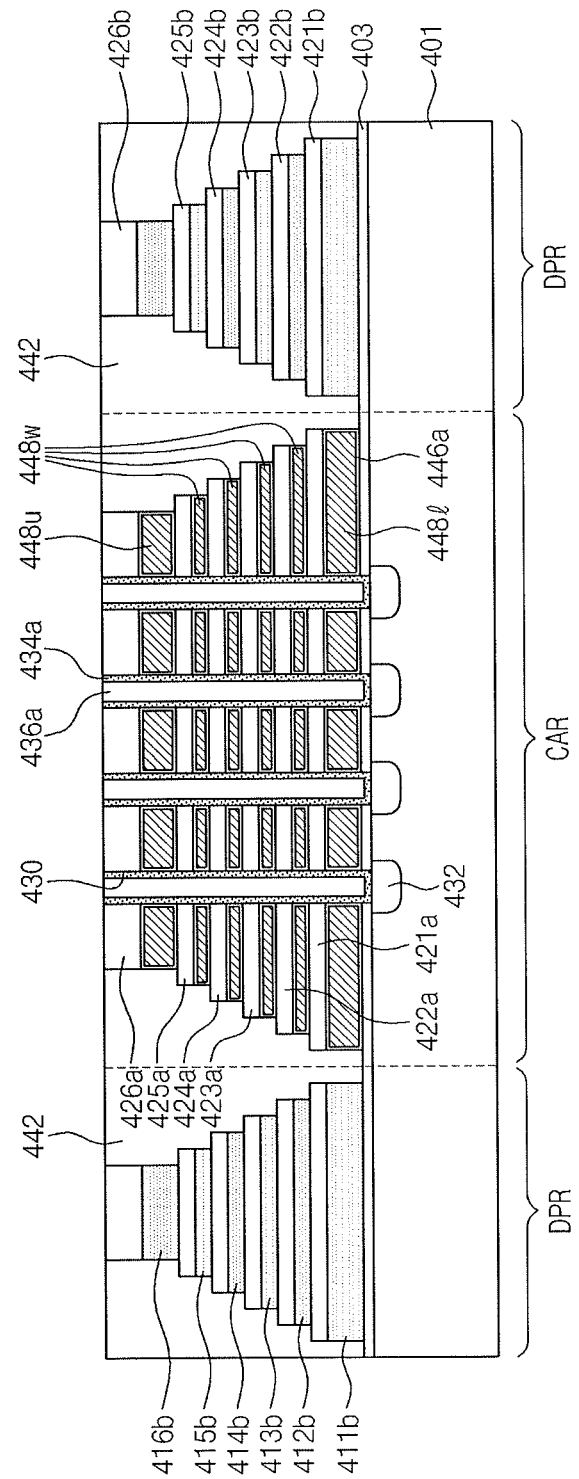
Figure 11B:
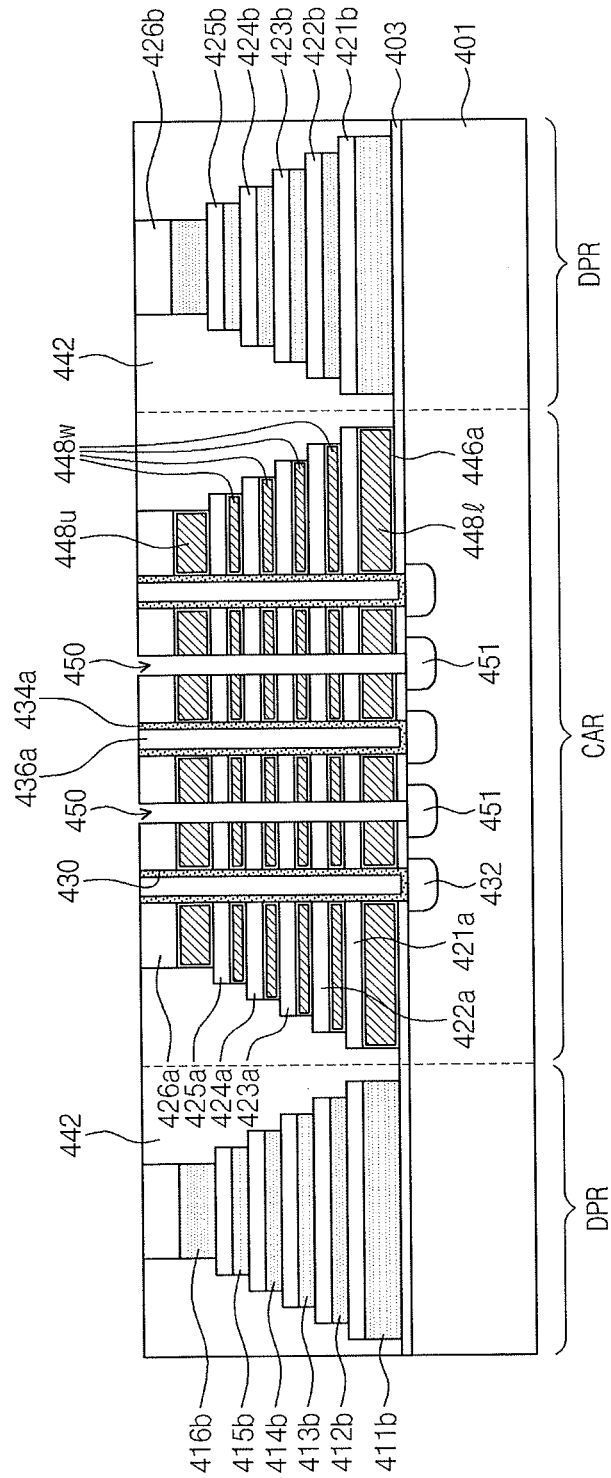

Referring to FIGS. 11A and 11B, the information storage layer 446a may be conformally formed. The information storage layer 446a may include at least one of a tunnel insulating layer, a charge trapping layer, and a blocking insulating layer. The tunnel insulating layer may be formed by, e.g., a deposition process such as a thermal oxidation process or CVD. The tunnel insulating layer may be formed of, e.g., a silicon oxide or ONO (oxide/nitride/oxide). The charge trapping layer may be formed of, e.g., the silicon nitride through the deposition process. Alternatively, the charge trapping layer may be formed of, e.g., at least one of silicon nitride (SiN), aluminum oxide ($Al_2O_3$), hafnium aluminum oxide ($HfAlO_x$), hafnium aluminum oxynitride (HfAlON), hafnium silicon oxide ($HfSiO_x$), and hafnium silicon oxynitride (HfSiON). The blocking insulating layer may be formed of, e.g., silicon oxide through the deposition process and/or a high dielectric material. The information storage layer 446a may be conformally formed along one sidewall of the outer interlayer insulating layer 442, the upper and lower surfaces of the cell gate interlayer insulating patterns 421a to 426a, and one sidewall of the cell active pillars 434a, which are exposed. After the information storage layer 446a is formed, a conductive layer may be stacked. The stacked conductive layer may be planarized and etched, thereby filling the gap between the first groove 444 and the area surrounding the cell gate interlayer insulating patterns 421a to 426a. The conductive layer may be, e.g., polysilicon and/or metal containing layer doped with impurities. The conductive layer and the buffer layer 403 therebelow may be patterned at the location overlapped with the first groove 444, thereby forming a second groove 450 to expose the semiconductor substrate 401. When the second groove 450 is formed, the cell gate patterns 448l, 448w, and 448u may be formed at the same time. After the second groove 450 is formed, a second impurity implantation region 451 may be formed in the semiconductor substrate 401 exposed by the second groove 450 through the ion implantation process. The second impurity implantation region 451 may be an N+-type impurity implantation layer and may act as a common source region.

Figure 12A:
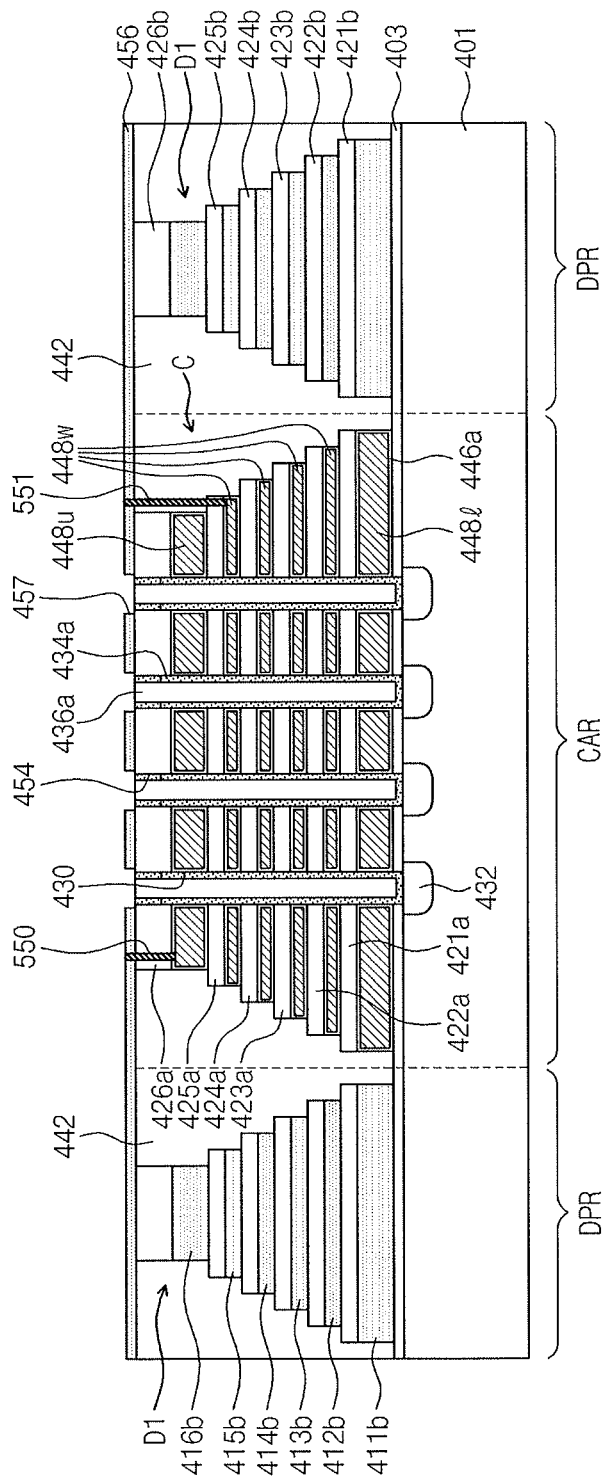
Figure 12B:
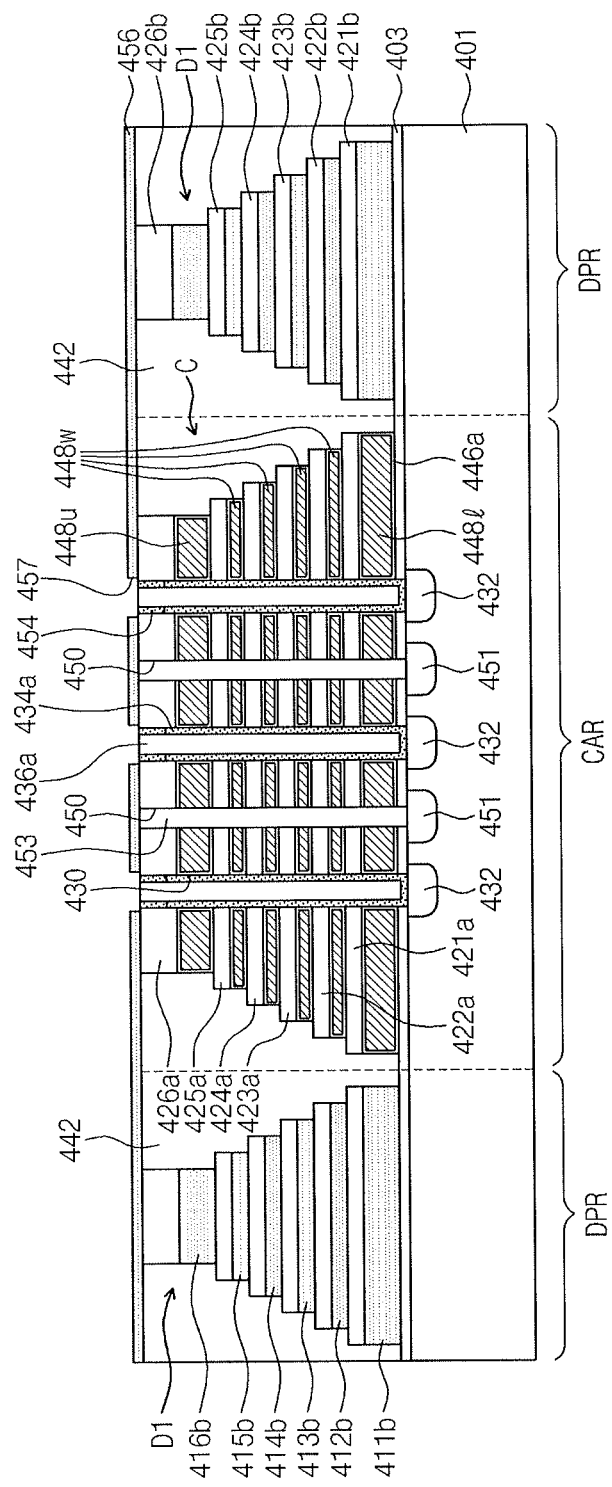

Referring to FIGS. 12A and 12B, the inner insulating pattern 453 may be formed to fill the second groove 450. The inner insulating pattern 453 may be formed of, e.g., at least one of silicon oxide, silicon nitride, and silicon oxynitride. The damp-proof layer 456 may be formed on substantially the entire surface of the semiconductor substrate 401. The damp-proof layer 456 may be, e.g., formed of silicon nitride. The contact plugs 550 to 552 may be formed to penetrate the damp-proof layer 456. By the removal of the damp-proof layer 456 on the cell active pillars 434a, the upper surfaces of the cell active pillars 434a may be exposed. The drain region 454 may be formed on the cell active pillars 434a through the ion implantation process. For example, the drain region 454 may be the N+-type impurity implantation layer. A contact pad (not shown) may be formed on the drain region 454 by using the conductive layer.

Subsequently, with reference to FIGS. 3, 4A, and 4B, the conductive is stacked and patterned, thereby forming the bitlines 560 and the interconnections 561 to 563. Accordingly, the semiconductor device according to the first exemplary embodiment may be fabricated.

Second Exemplary Embodiment

Figure 13:
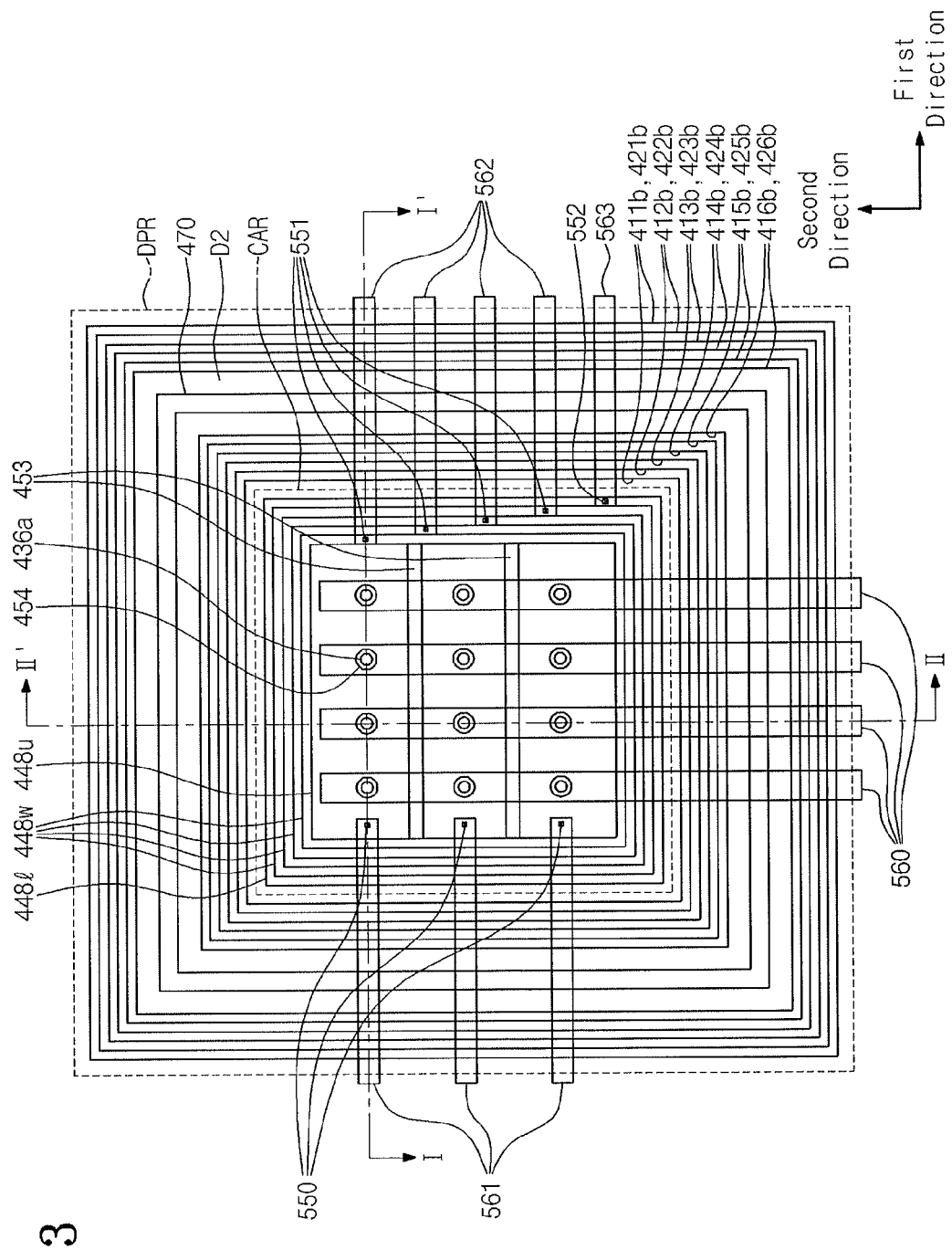
FIG. 13 illustrates a detailed plane view of a semiconductor device according to an exemplary embodiment.
Figure 14A:
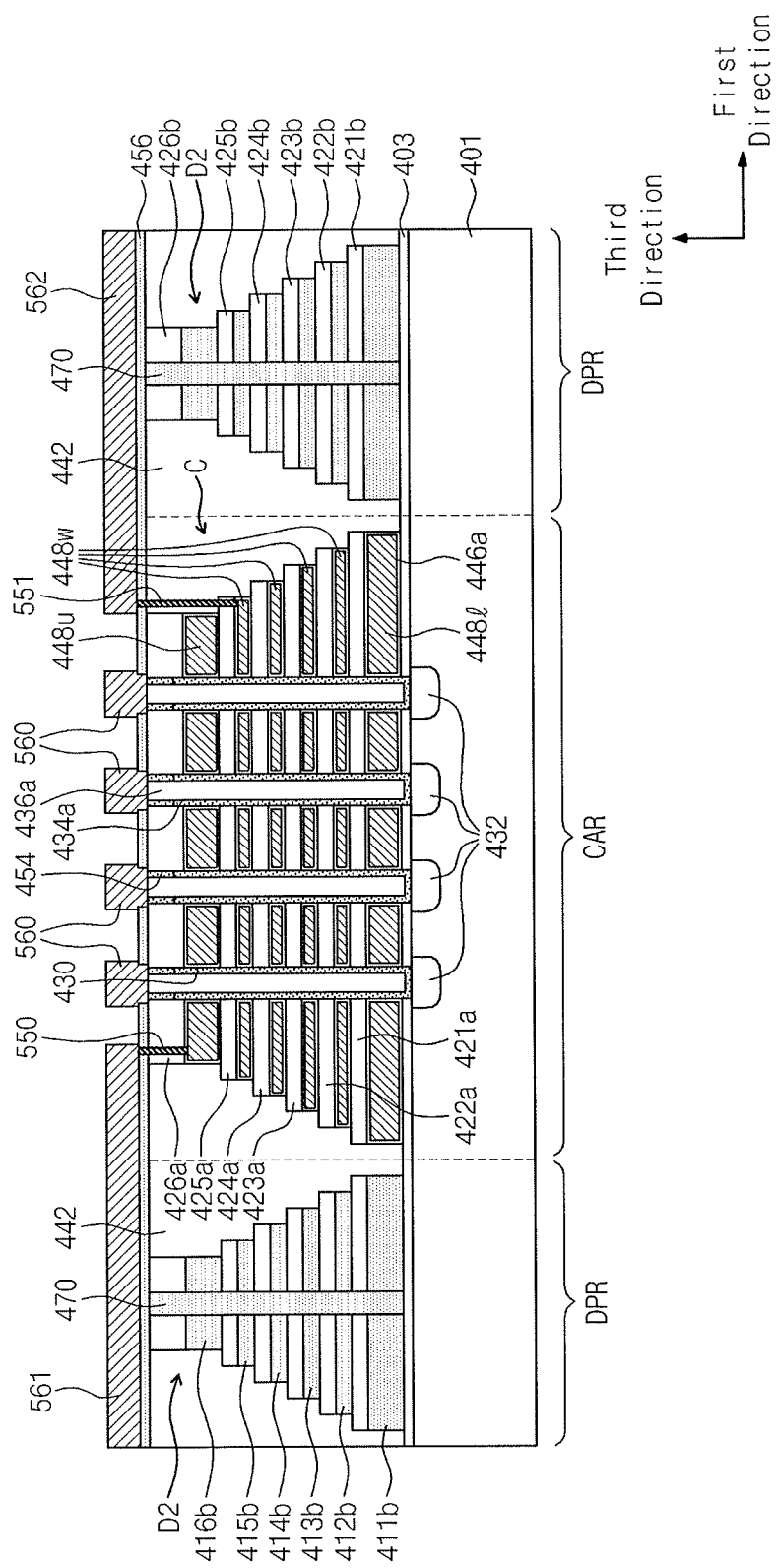
FIGS. 14A and 14B illustrate cross-sectional views taken along respective lines I-I' and II-II' of FIG. 13.
Figure 14B:
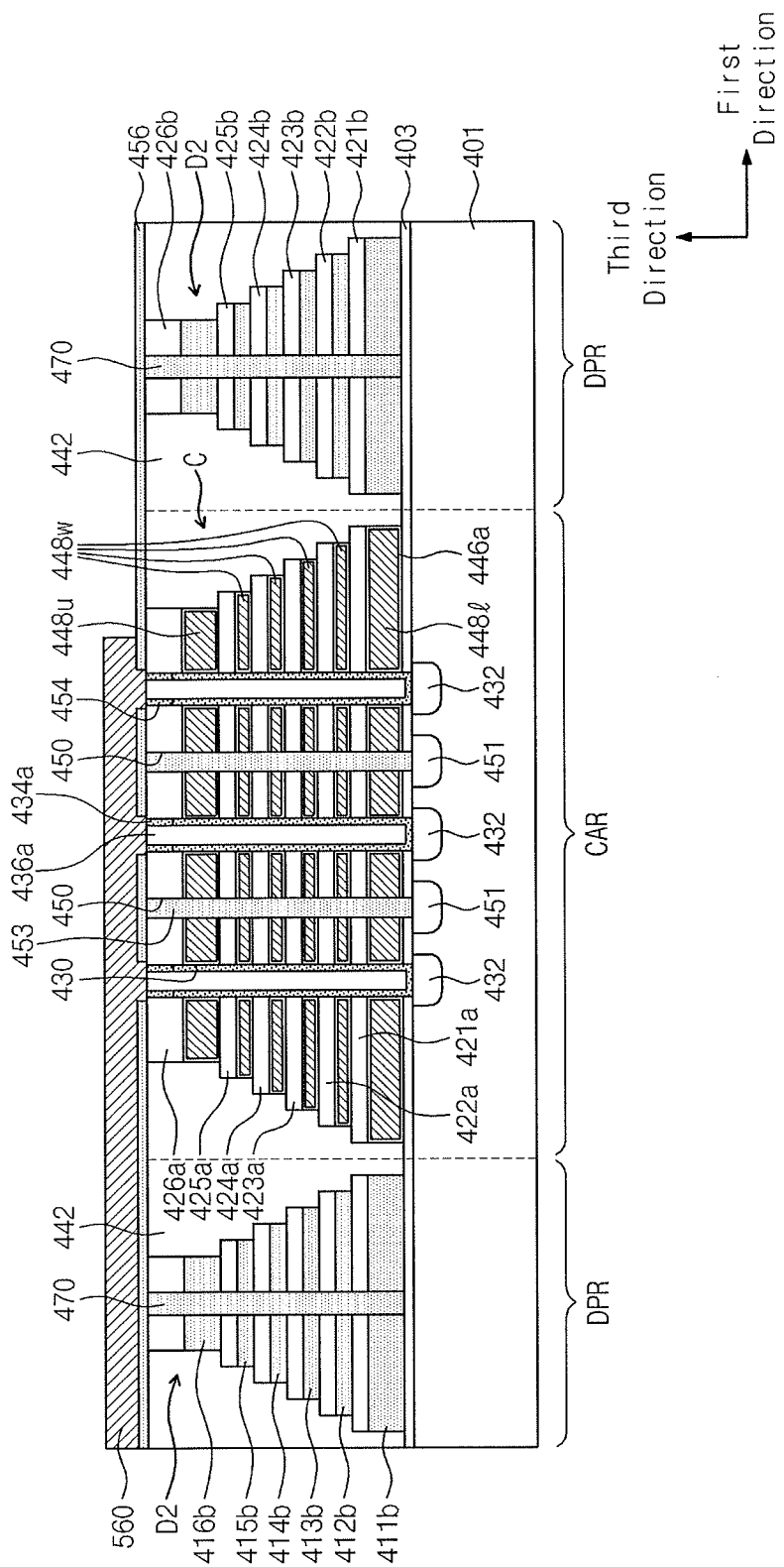

FIG. 13 is a detailed plane view of a semiconductor device according to a second exemplary embodiment. FIGS. 14A and 14B are cross-sectional views taken along the lines I-I' and II-II' of FIG. 13, respectively.

In the semiconductor device according to the second exemplary embodiment, referring to FIGS. 13, 14A, and 14B, a damp-proof structure D2 may include a damp-proof reinforcement structure 470 penetrating the dummy sacrificial patterns 411b to 416b and the dummy interlayer insulating patterns 421b to 426b, which are alternately stacked. An upper surface of the damp-proof reinforcement structure 470 may come in contact with the damp-proof layer 456. The damp-proof reinforcement structure 470 may include, e.g., a silicon nitride layer. The damp-proof reinforcement structure 470 may be disposed so as to surround the cell structure C.

It is possible to form the damp-proof reinforcement structure 470 by forming a third groove (not illustrated) in the dummy pattern region DPR. The third groove may be formed when forming the second groove 450, as described with reference to FIGS. 11A and 11B. The damp-proof reinforcement structure 470 may be formed of silicon nitride. For example, silicon nitride may be filled in the third groove at the same time the second groove 450 is filled with the silicon nitride. The inner insulating pattern 453 may also be formed of the silicon nitride.

Others configurations and the fabricating ways may be equal and similar to those described in the first exemplary embodiment.

Third Exemplary Embodiment

Figure 15:
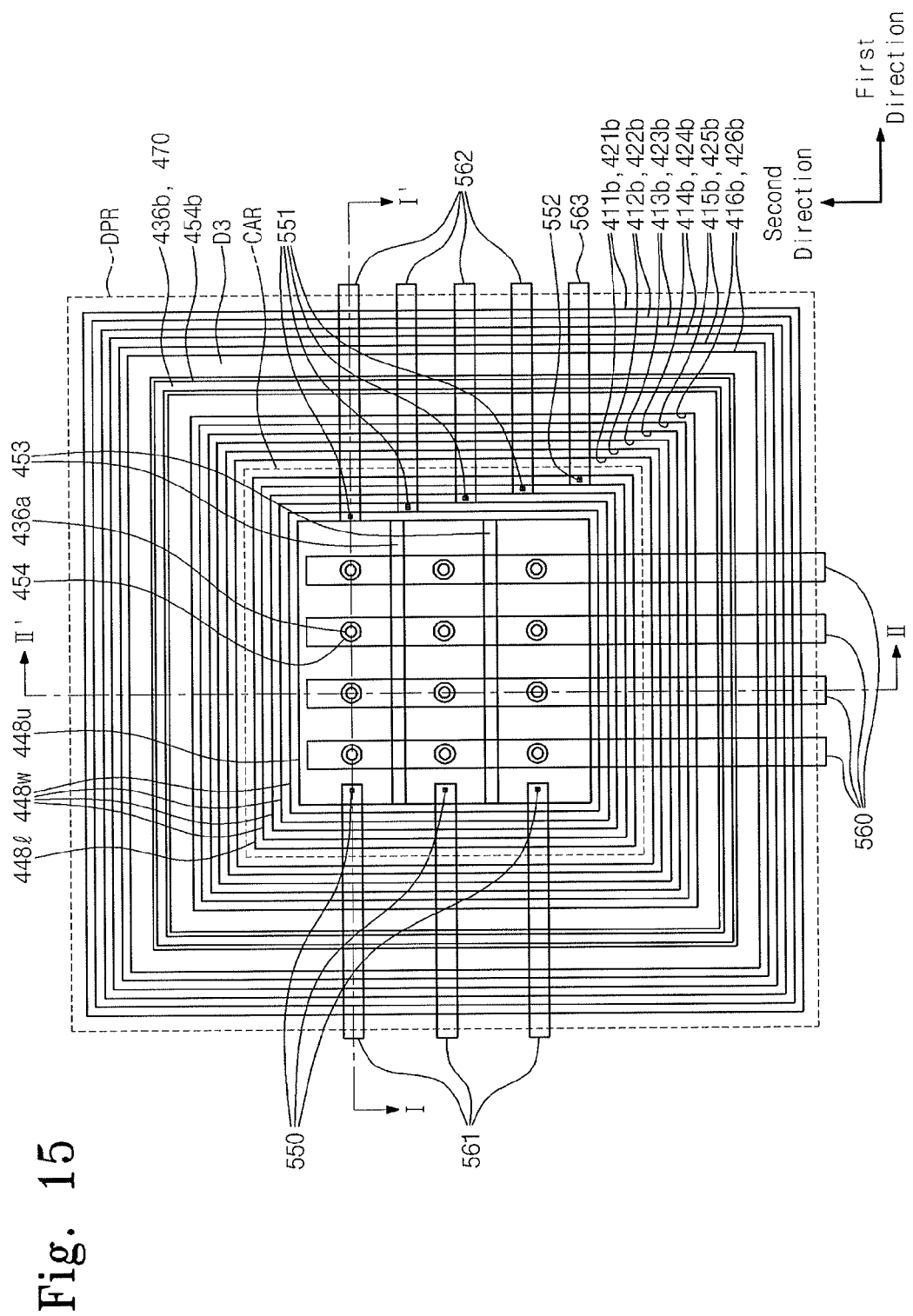
FIG. 15 illustrates a detailed plane view of a semiconductor device according to an exemplary embodiment.
Figure 16A:
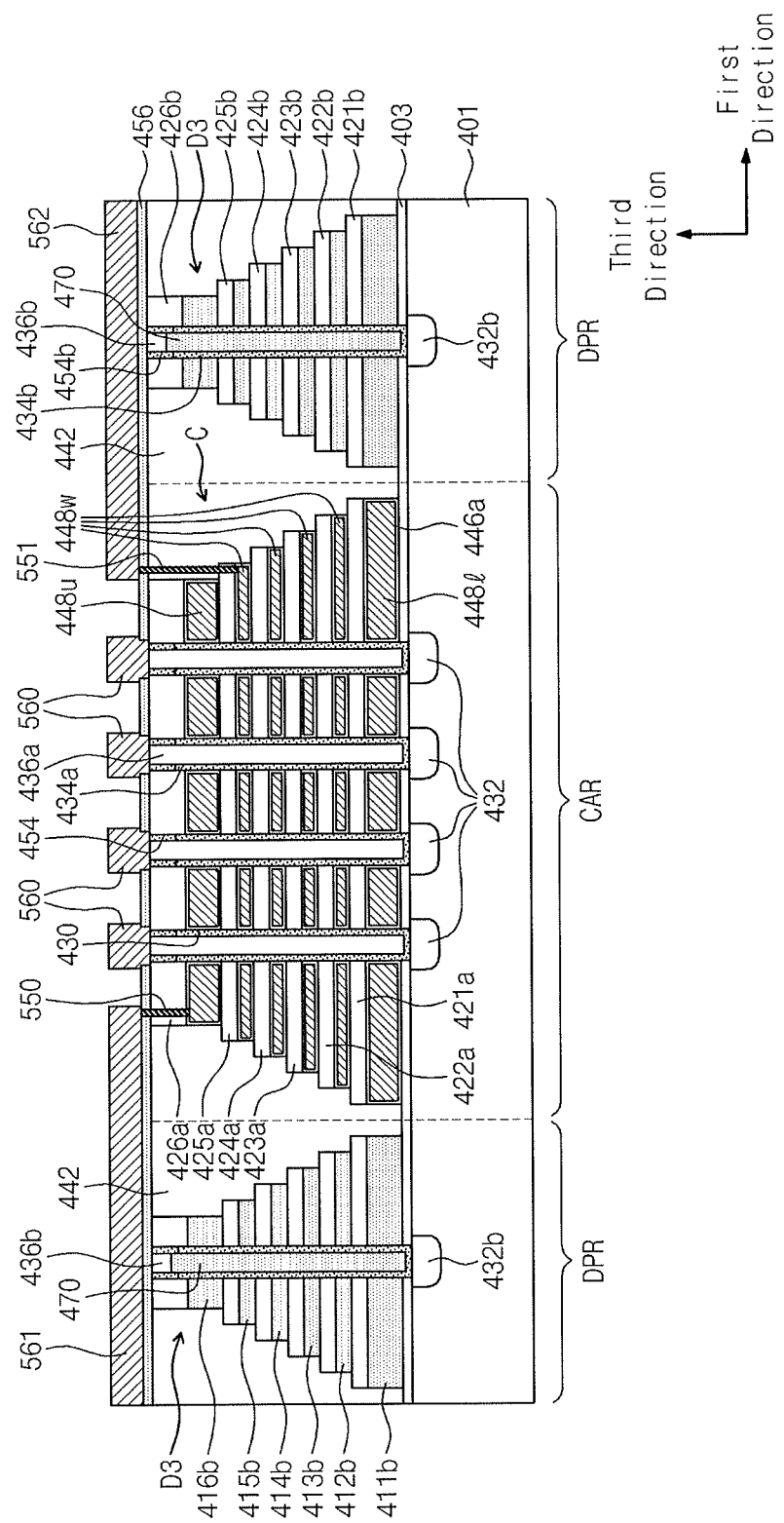
FIGS. 16A and 16B illustrate cross-sectional views taken along respective lines I-I' and II-II' of FIG. 15.
Figure 16B:
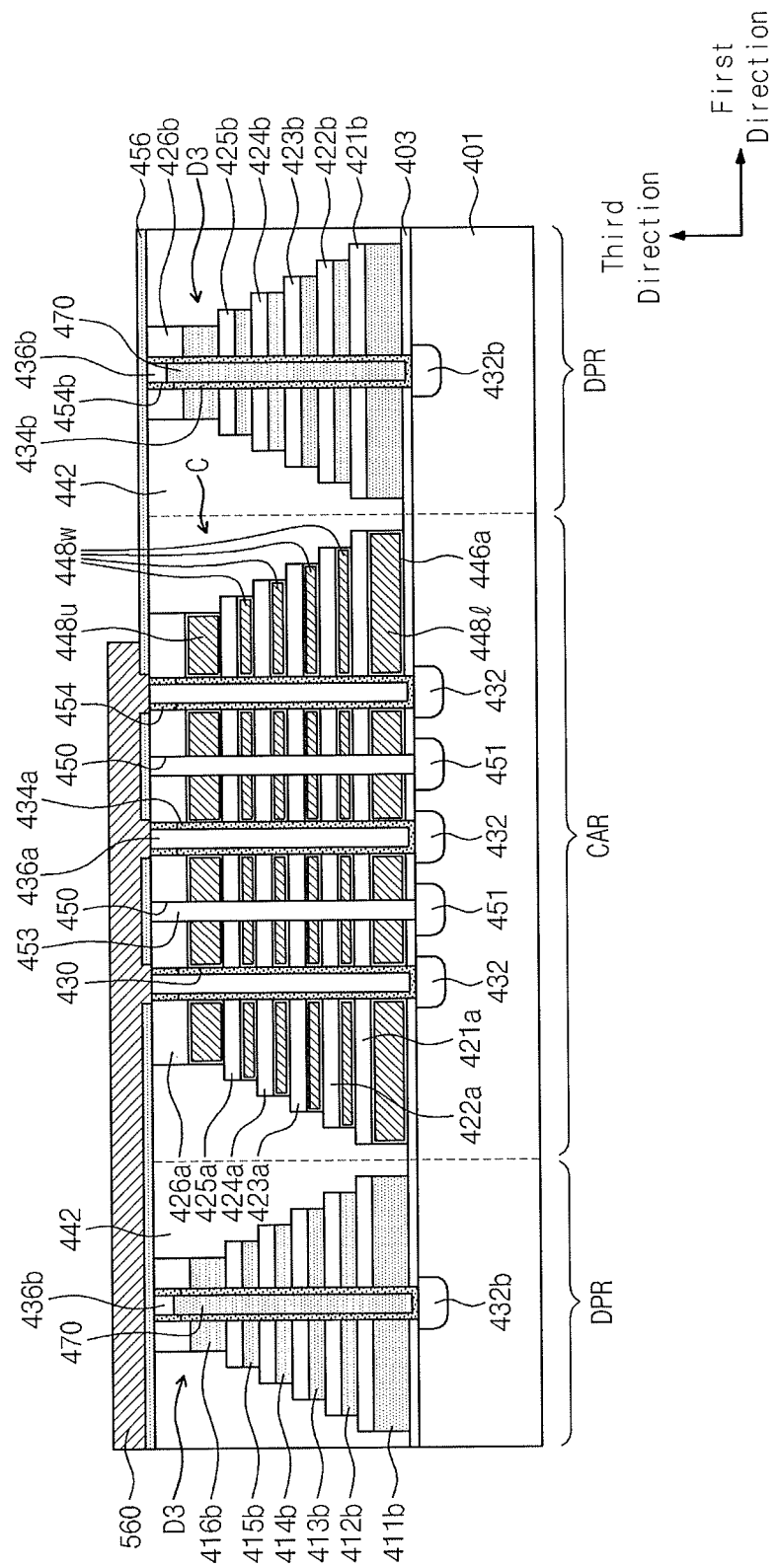

FIG. 15 is a detailed plane view of a semiconductor device according to a third exemplary embodiment. FIGS. 16A and 16B are cross-sectional views taken along the lines I-I' and II-II' of FIG. 15, respectively.

In the semiconductor device according to the third exemplary embodiment, referring to FIGS. 15, 16A, and 16B, a damp-proof structure D3 may include the damp-proof reinforcement structure 470 penetrating the dummy sacrificial patterns 411b to 416b and the dummy interlayer insulating patterns 421b to 426b, which are alternately stacked. Furthermore, the damp-proof structure D3 may include a dummy active pattern 434b interposed between the damp-proof reinforcement structure 470 and the dummy sacrificial patterns 411b to 416b and between the damp-proof reinforcement structure 470 and the dummy interlayer insulating patterns 421b to 426b. An upper surface of the damp-proof reinforcement structure 470 may be lower than that of the dummy active pattern 434b. A protective insulating pattern 436b may be disposed on the damp-proof reinforcement structure 470. In this case, the upper surface of the protective insulating pattern 436b may be disposed at the same height as that of the dummy active pattern 434b, i.e., a total height of the damp-proof reinforcement structure 470 and the protective insulating pattern 436b may be equal to a height of the dummy active pattern 434b. The protective insulating pattern 436b may be formed of the same material as the buried insulating pattern 436a. The dummy active pattern 434b may be formed of the same material as the cell active pillar 434a. A dummy drain region 454b may be disposed on the dummy active pattern 434b. A dummy impurity implantation region 432b may be disposed in the semiconductor substrate 401 below the dummy active pattern 434b. The dummy impurity implantation region 432b may be doped with impurities having the same type and concentration as the first impurity implantation region 432. Others configurations may be equal to those of the first exemplary embodiment.

A method of fabricating the semiconductor device according to the third exemplary embodiment will now be described. FIGS. 17A, 18A, 19A, 20A, 21A, 22A, and 23A are cross-sectional views illustrating sequential processes for fabricating of the semiconductor device having a cross-section of FIG. 16A. FIGS. 17B, 18B, 19B, 20B, 21B, 22B, and 23B are cross-sectional views illustrating sequential processes of fabricating the semiconductor device having a cross-section of FIG. 16B.

Figure 17A:
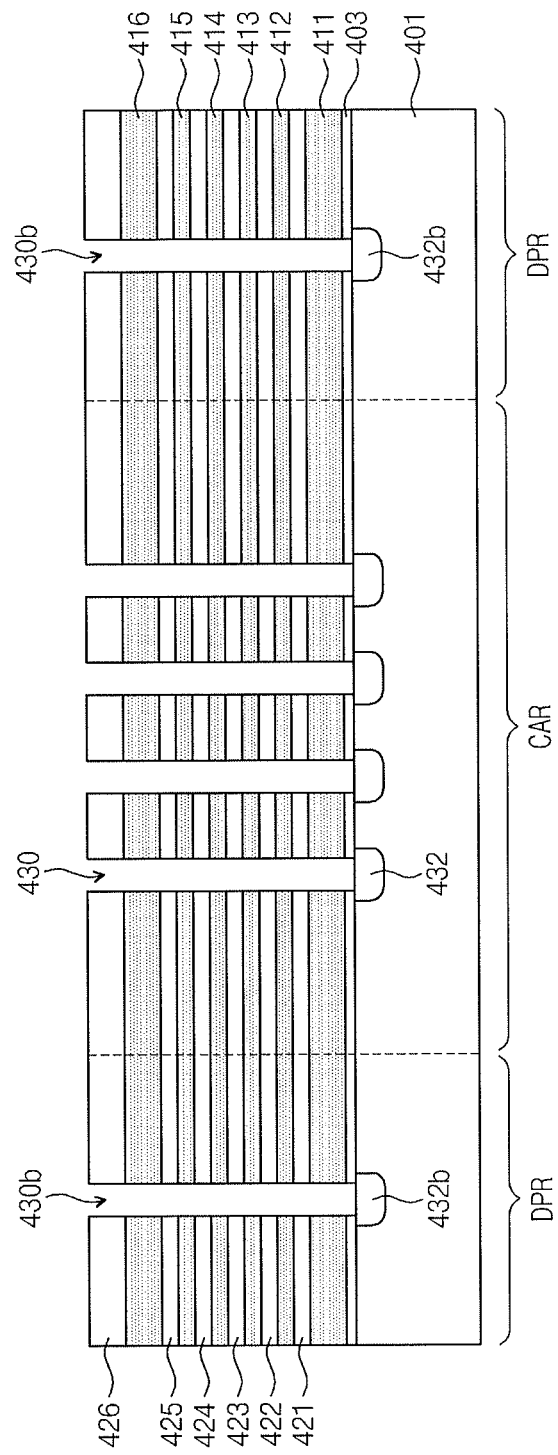
FIGS. 17A, 18A, 19A, 20A, 21A, 22A, and 23A illustrate cross-sectional views showing sequential processes of fabricating the semiconductor device of FIG. 15 along lines I-I'.

Referring to FIGS. 17A and 17B, the buffer layer 403 may be formed on the semiconductor substrate 401 including the cell array region CAR and the dummy pattern region DPR. The semiconductor substrate 401 may be doped with the P-type impurity. The buffer layer 403 may be formed by, e.g., a thermal oxidation process. The sacrificial layers 411 to 416 and the interlayer insulating layers 421 to 426 may be alternately stacked on the buffer layer 403. The sacrificial layers 411 to 416 may include a first sacrificial layer 411 to a sixth sacrificial layer 416.

The interlayer insulating layers 421 to 426 may include a first interlayer insulating layer 421 to a sixth interlayer insulating layer 426. The sacrificial layers 411 to 416 may be formed of, e.g., silicon nitrides. The interlayer insulating layers 421 to 426 may be formed of, e.g., silicon oxide-based materials. The interlayer insulating layers 421 to 426, the sacrificial layers 411 to 416, and the buffer layer 403 may be sequentially patterned, thereby forming the island-shaped active holes 430 spaced apart from each other. The island-shaped active holes 430 may expose the semiconductor substrate 401 in the cell array region CAR and form the dummy active groove 430b exposing the semiconductor substrate 401 in the dummy pattern region DPR. The dummy active groove 430b may be formed in the closed curve shape surrounding the cell array region CAR. For example, the dummy active groove 430b may be in a shape of a rectangle surrounding the cell array region CAR. The first impurity implantation region 432 and the dummy impurity implantation region 432b may be formed in the semiconductor substrate 401, which is exposed by the active holes 430 and the dummy active groove 430b, through an ion implantation process. The first impurity implantation region 432 and the dummy impurity implantation region 432b may be formed by doping the substrate 401 with N-type or P-type impurities.

Figure 18A:
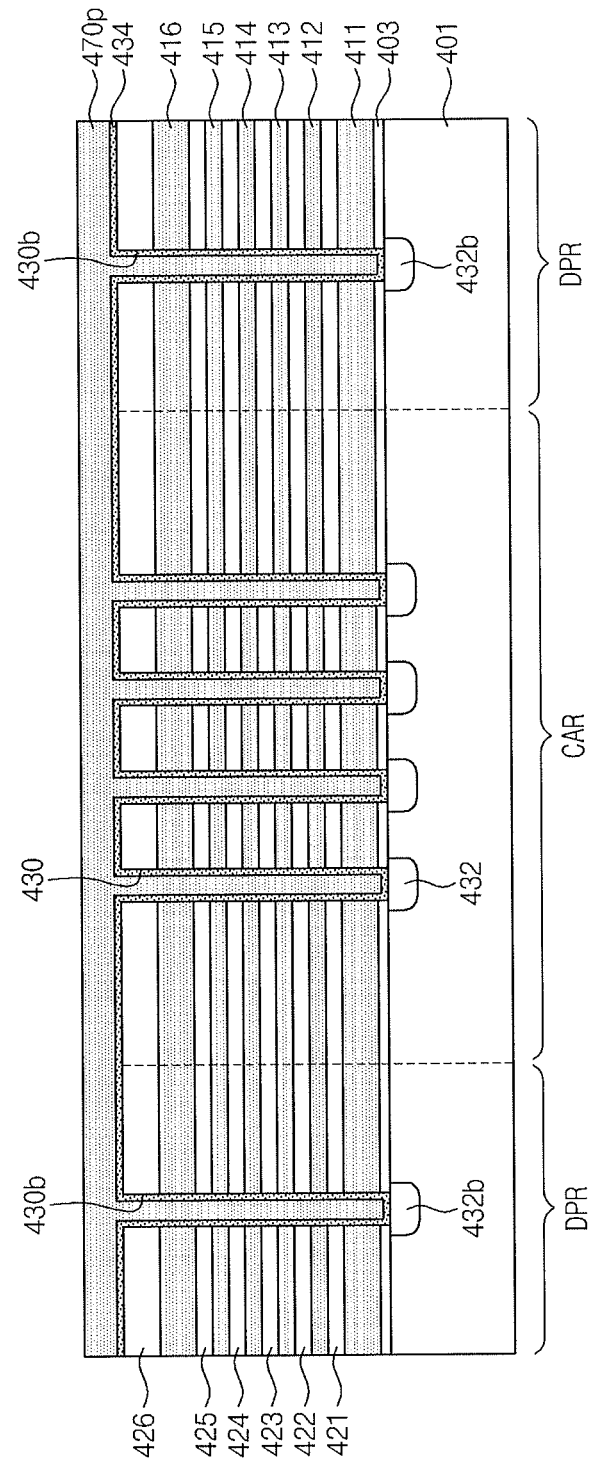
Figure 18B:
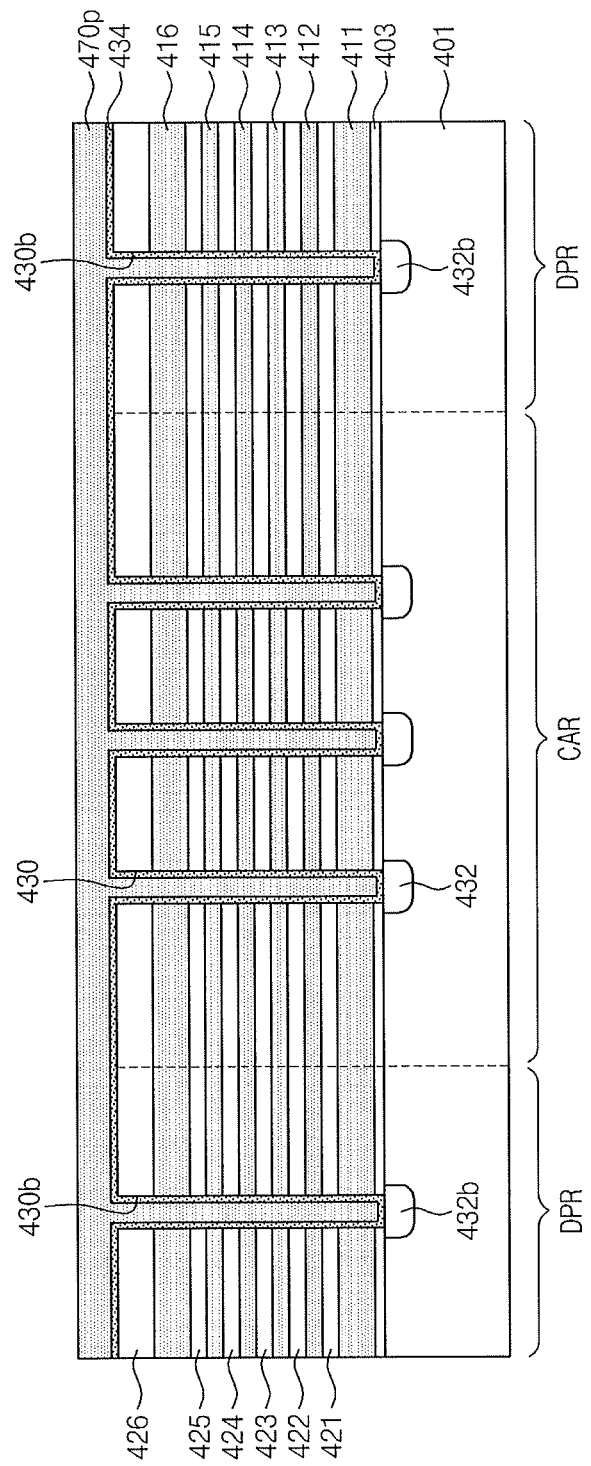

Referring to FIGS. 18A and 18B, the active layer 434 may be conformally formed on substantially the entire surface of the semiconductor substrate 401. Using CVD (Chemical Vapor Deposition) or ALD (Atomic Layer Deposition), the active layer 434 may be formed by conformally depositing, e.g., a polysilicon layer undoped with impurities. In order to make the polysilicon layer into the monocrystalline silicon epitaxial layer, the thermal oxidation process may additionally be performed on the polysilicon layer. The active layer 434 may have a thickness such that the active holes 430 and the dummy active groove 430b are not filled by the active layer 434. A damp-proof reinforcement layer 470p may be stacked on the active layer 434 to fill the remaining portions of the active holes 430 and the dummy active groove 430b that are not filled by the active layer. The damp-proof reinforcement layer 470p may be formed of, e.g., silicon nitrides.

Figure 19A:
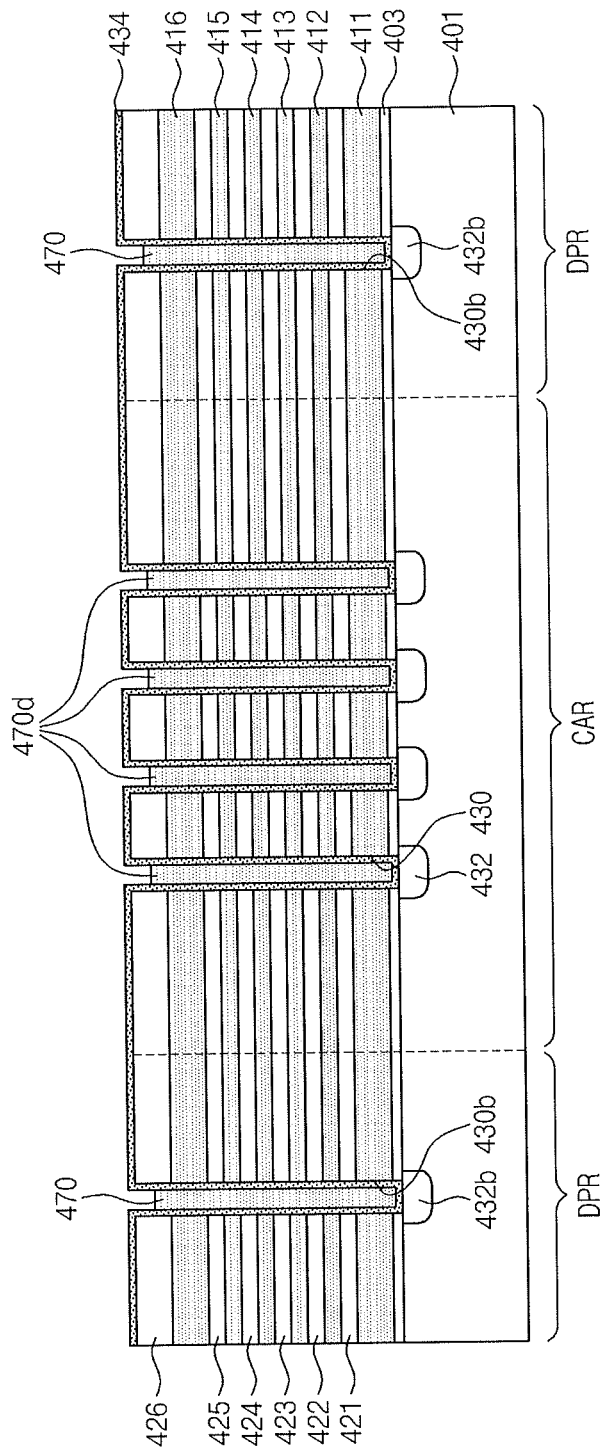
Figure 19B:
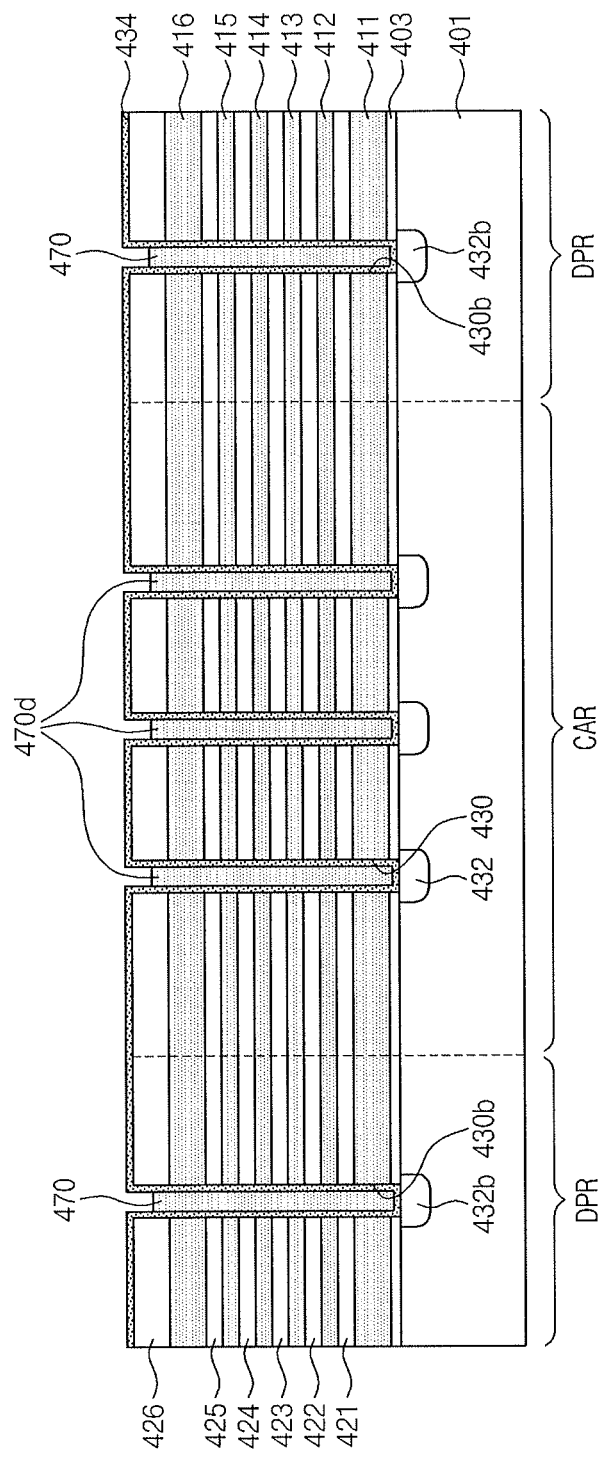

Referring to FIGS. 19A and 19B, an etch-back process may be performed on the entire surface of the damp-proof reinforcement layer 470p to expose the upper surface of the active layer 434. At this time, dummy damp-proof reinforcement patterns 470d and the damp-proof reinforcement structure 470 are formed in the active holes 430 and the dummy active groove 430b, respectively. The upper surface of the dummy damp-proof reinforcement pattern 470d and the damp-proof reinforcement structure 470 may be lower than that of the sixth interlayer insulating layer 426.

Figure 20A:
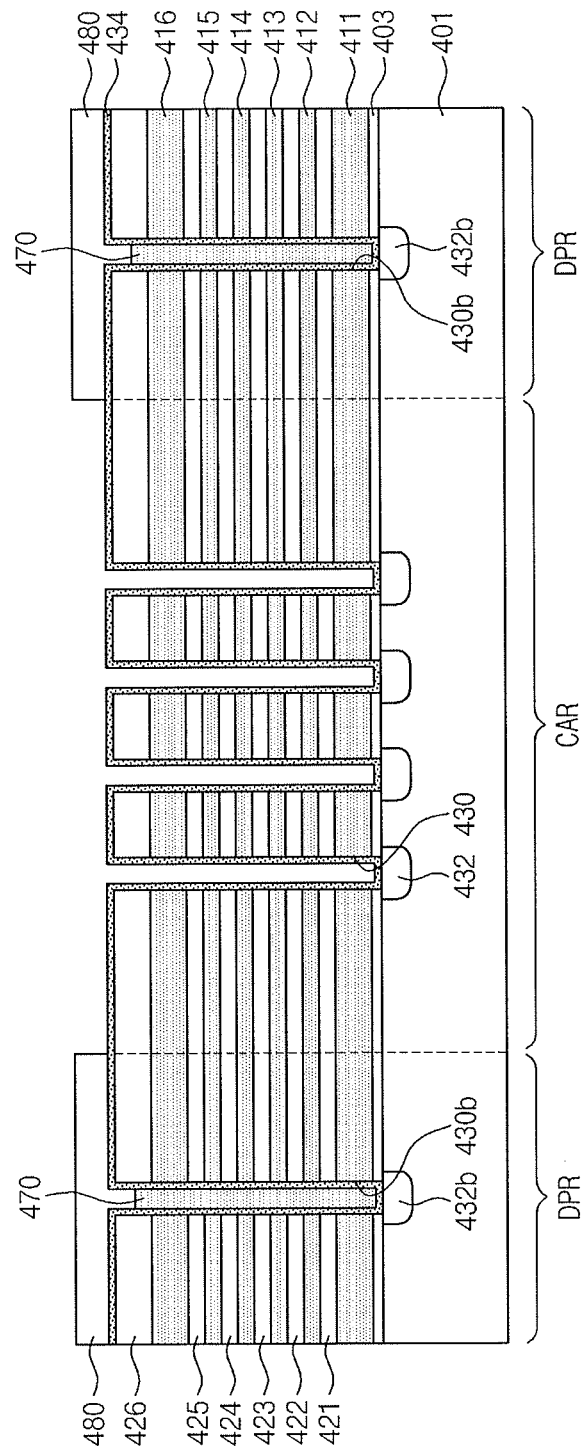
Figure 20B:
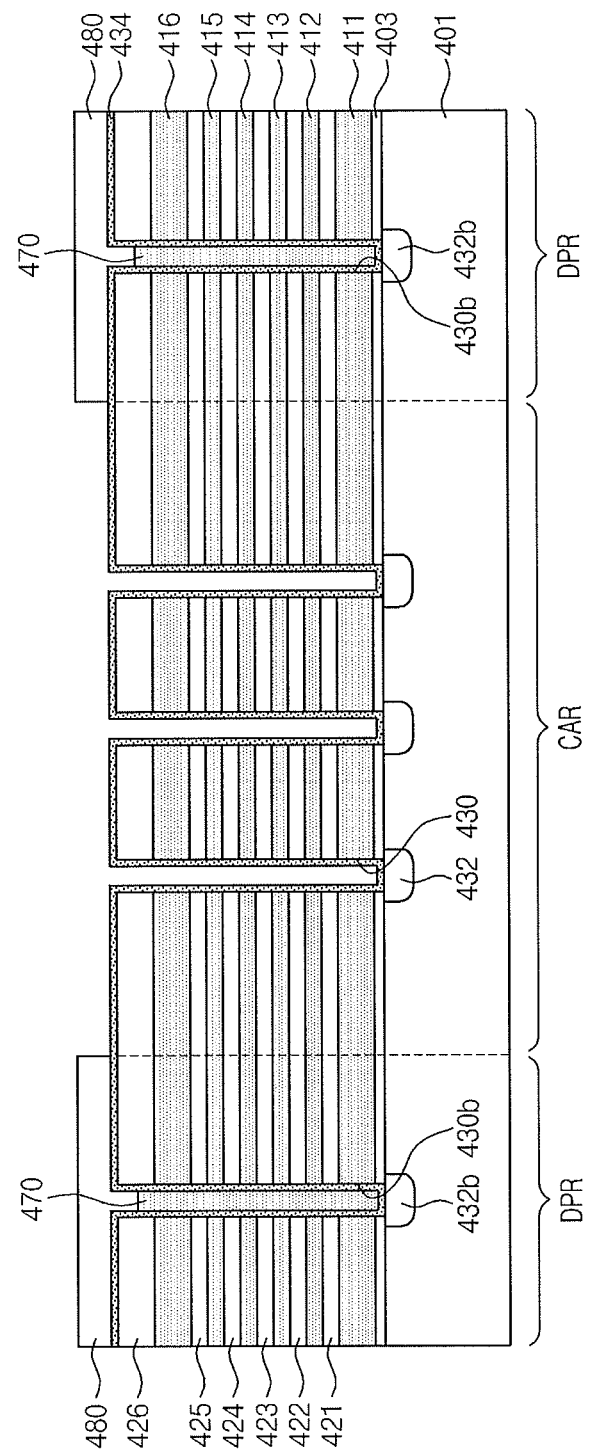

Referring to FIGS. 20A and 20B, a mask pattern 480 may be formed on the active layer 434 to cover the dummy pattern region DPR and expose the cell array region CAR. In the cell array region CAR, the dummy damp-proof reinforcement pattern 470d within the active holes 430 may be removed by the isotropic etching process using the mask pattern 480 as an etch mask.

Figure 21A:
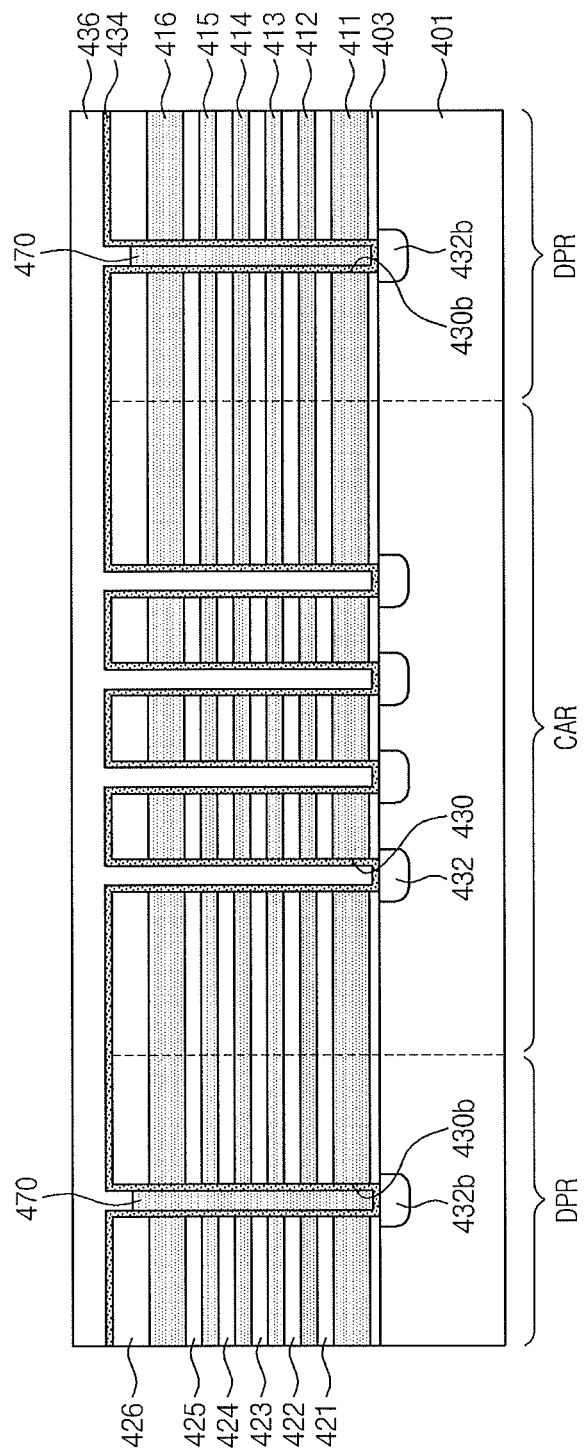
Figure 21B:
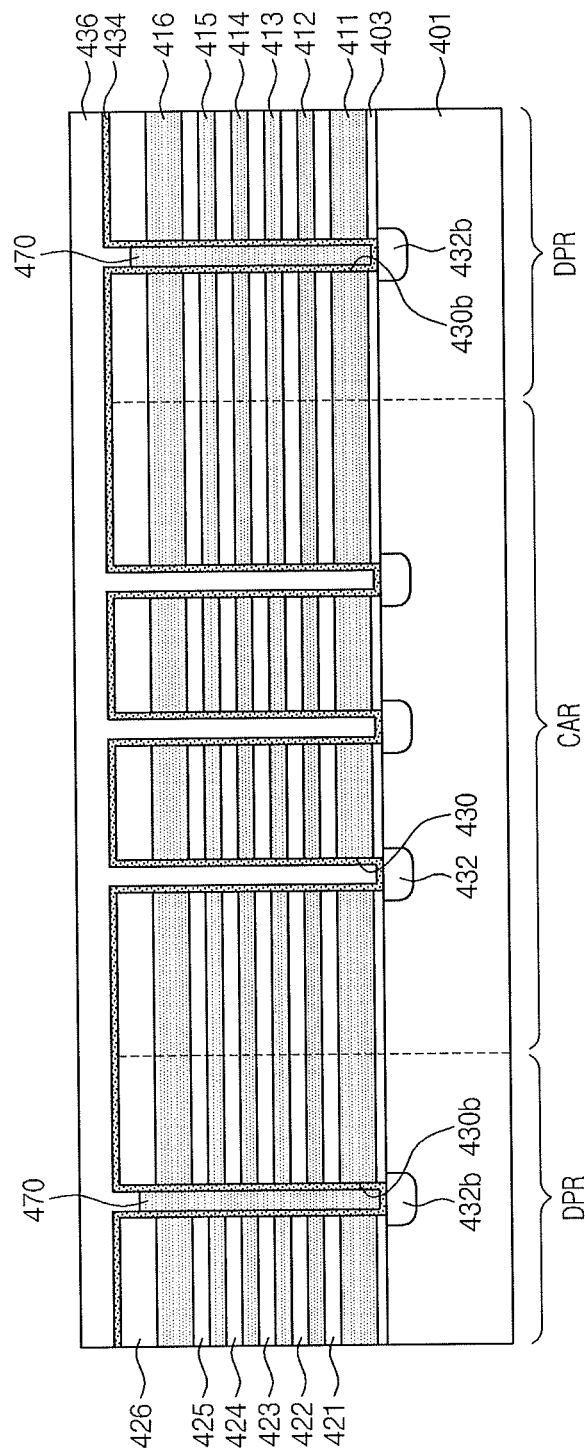

Referring to FIGS. 21A and 21B, after the mask pattern 480 is removed, the buried insulating layer 436 may be stacked on substantially the entire surface of the semiconductor substrate 401 to fill the active holes 430 and to fill the top of the dummy active groove 430b. The buried insulating layer 436 may be formed of, e.g., silicon oxide-based materials.

Figure 22A:
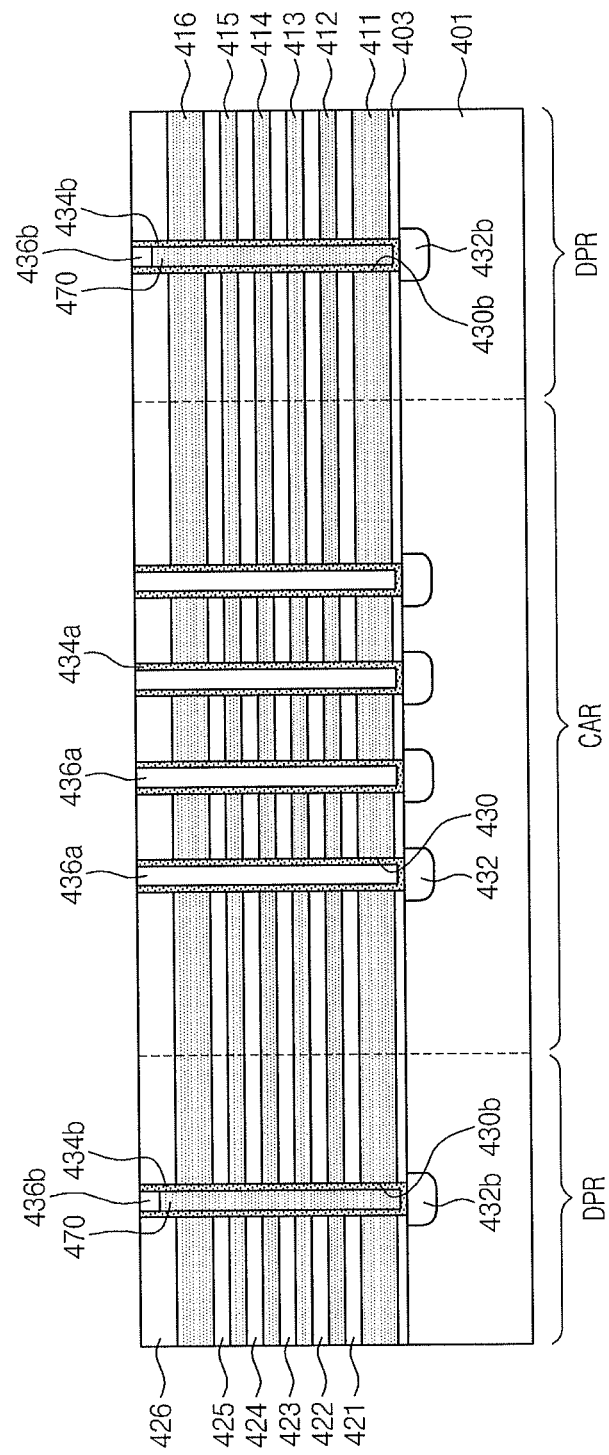
Figure 22B:
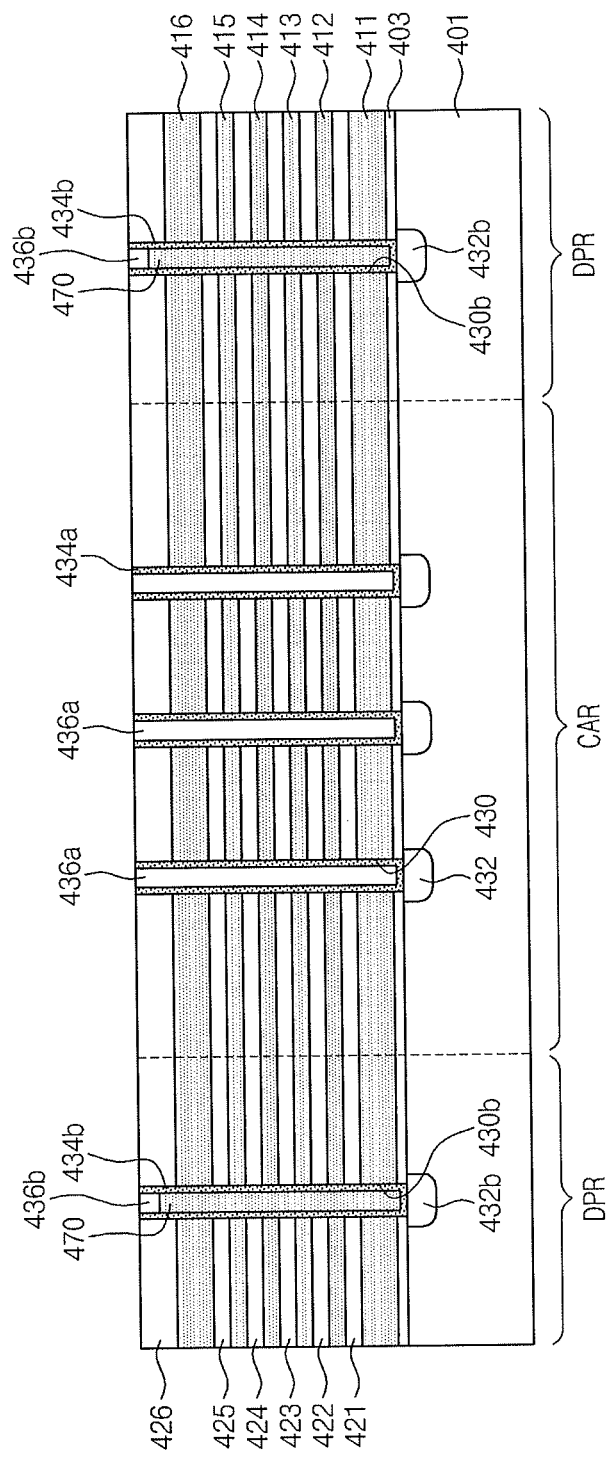

Referring to FIGS. 22A and 22B, the buried insulating layer 436 and the active layer 434 may be planarized and etched to form the cell active pillars 434a covering the inner walls and the bottoms of the active holes 430 and to form the buried insulating patterns 436a filling the active holes 430. At the same time, the protective insulating pattern 436b may be formed in the dummy active groove 430b. As such, the dummy active pattern 434b, the damp-proof reinforcement structure 470, and the protective insulating pattern 436b may be formed in the dummy active groove 430b. The damp-proof reinforcement structure 470 and the protective insulating pattern 436b may fill the dummy active groove 430b.

Figure 23A:
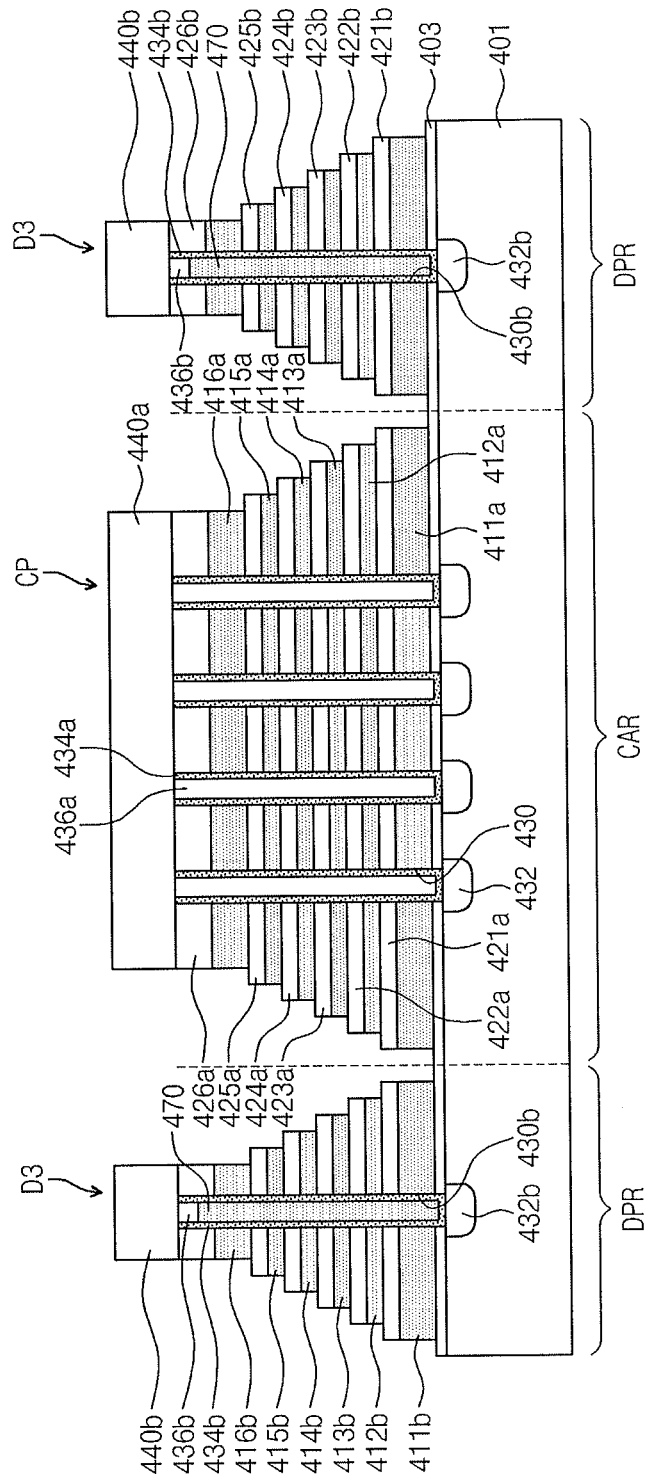
Figure 23B:
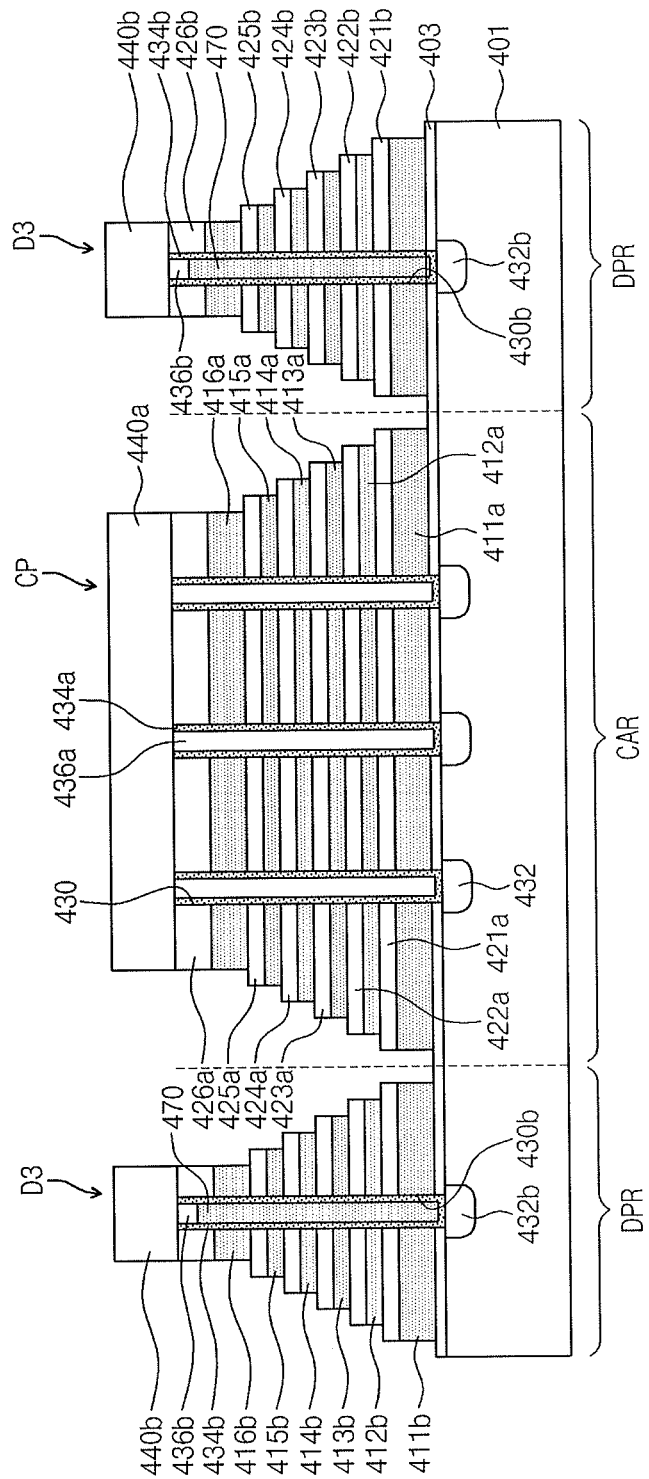

Referring to FIGS. 23A and 23B, the sacrificial mask patterns 440a and 440b may be formed on substantially the entire surface of the semiconductor substrate 401. The sacrificial mask patterns 440a and 440b may include the cell sacrificial mask pattern 440a and the dummy sacrificial mask pattern 440b, which are formed in the cell array region CAR and the dummy pattern region DPR, respectively. The dummy sacrificial mask pattern 440b may be formed so as to overlap the dummy active pattern 434b, the damp-proof reinforcement structure 470, and the protective insulating pattern 436b. As in the first exemplary embodiment, it is possible to form the cell preliminary structure CP including the cell sacrificial patterns 411a to 416a and the cell gate interlayer insulating patterns 421a to 426b in the cell array region CAR. It is also possible to the damp-proof structure D3 including the dummy sacrificial patterns 411b to 416b, the dummy interlayer insulating patterns 421b to 426b, the dummy active pattern 434b, the damp-proof reinforcement structure 470, and the protective insulating patterns 436b in the dummy pattern region DPR.

Subsequently, the semiconductor device according to the third exemplary embodiment may be fabricated by the same processes as those in the first exemplary embodiment.

Fourth Exemplary Embodiment

Figure 24:
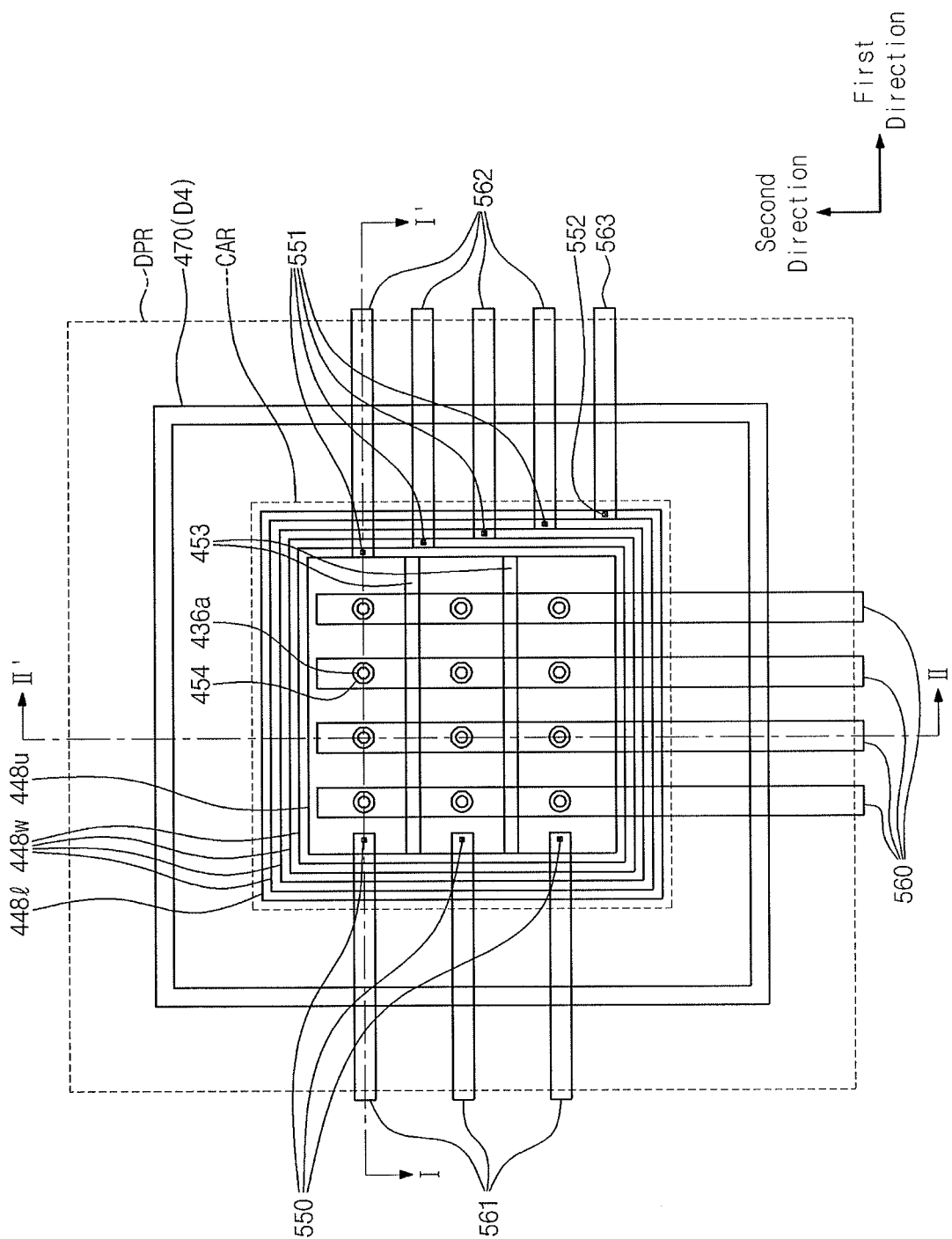
FIG. 24 illustrates a detailed plane view of a semiconductor device according to an exemplary embodiment.
Figure 25B:
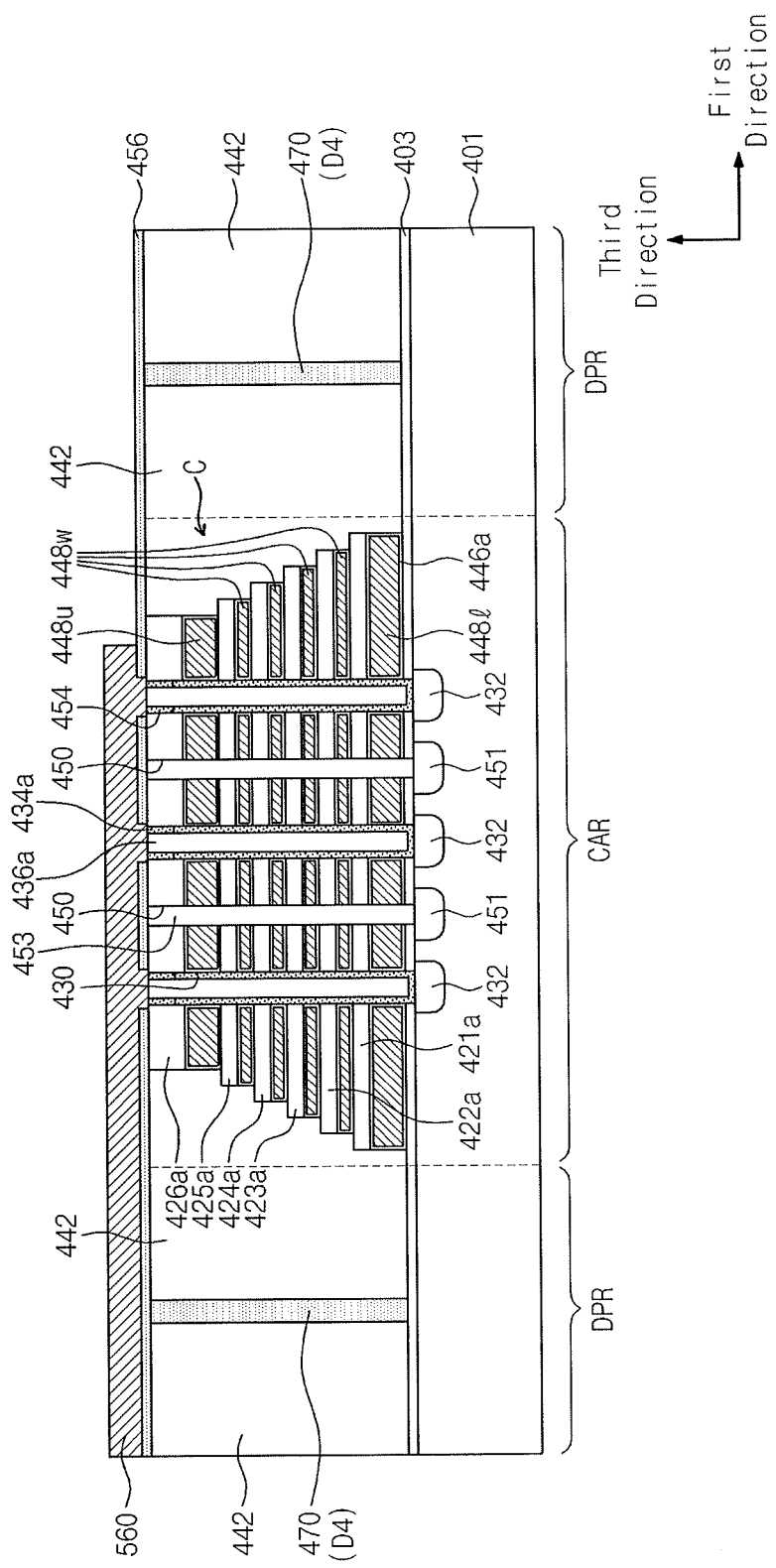

FIG. 24 is a detailed plane view of a semiconductor device according to a fourth exemplary embodiment. FIGS. 25A and 25B are cross-sectional views taken along the lines I-I' and II-II' of FIG. 24, respectively.

Referring to FIGS. 24, 25A, and 25B, a damp-proof structure D4, which is disposed in the dummy pattern region DPR of the semiconductor device according to the fourth exemplary embodiment, may include only the damp-proof reinforcement structure 470. In this semiconductor device, only the cell structure C is fabricated in the cell array region CAR, e.g., as illustrated in FIGS. 12A and 12B, without forming the damp-proof structure D1, e.g., as in the process described with reference to FIGS. 8A and 8B. For example, it is possible to form this semiconductor device by patterning the outer interlayer insulating layer 442 to form a groove. Then the groove may be filled with the damp-proof reinforcement layer, before the damp-proof layer 456 is disposed on the substrate.

Others configurations and fabricating processes may be equal to those of the first exemplary embodiment.

Modified Example

Figure 26:
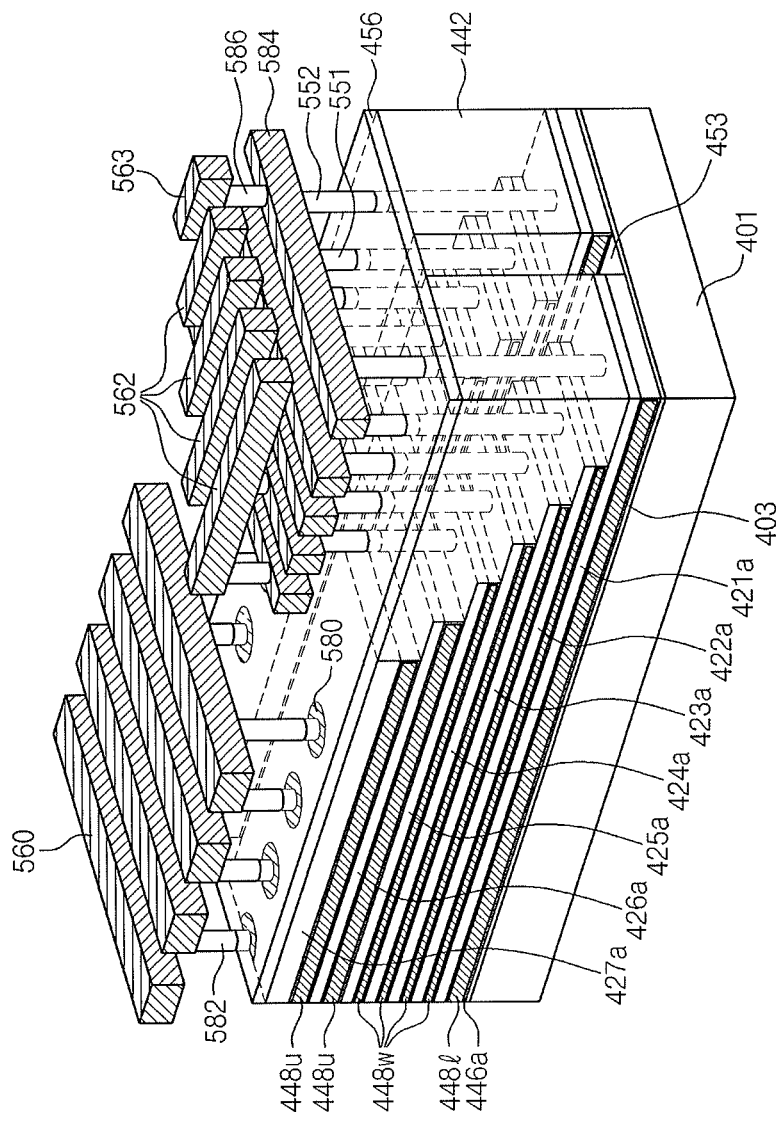
FIG. 26 illustrates a perspective partial view of a semiconductor device according to an exemplary embodiment.

FIG. 26 is a perspective partial view illustrating a semiconductor device according to a modified exemplary embodiment.

Referring to FIG. 26, one end of the cell structure C may be modified in the cell array region CAR. In the semiconductor device according to the modified exemplary embodiment, the upper selective gate pattern 448u may be disposed in at least two adjacent planes. For example, at least two upper selective transistors may exist in one cell string. The semiconductor device may include a seventh cell gate interlayer insulating pattern 427a. The semiconductor device may include conductive contact pads 580. The contact pads 580 may come in contact with the top of the drain region 454. The bitlines 560 may be electrically connected to the conductive contact pads 580 through bitline contact plugs 582, which may penetrate the damp-proof layer 456. The inner insulating pattern 453 may extend to the end of the lower selective gate patterns 448l to isolate adjacent coplanar lower selective gate patterns 448l from each other. For this reason, the coplanar wordline gate patterns 448w may be isolated from each other. Each of the wordline gate patterns 448w may be connected to the second contact plug 551, and each of the lower selective gate patterns 448l may be connected to the third contact plug 552. The coplanar cell gate patterns 448w and 448l may be electrically connected to one of the interconnections 562 and 563. Intermediate interconnections 584 and intermediate plugs 586 may further be disposed between the interconnections 562 and 563 and between the contact plugs 551 and 552, respectively.

Fifth Embodiment

Figure 27:
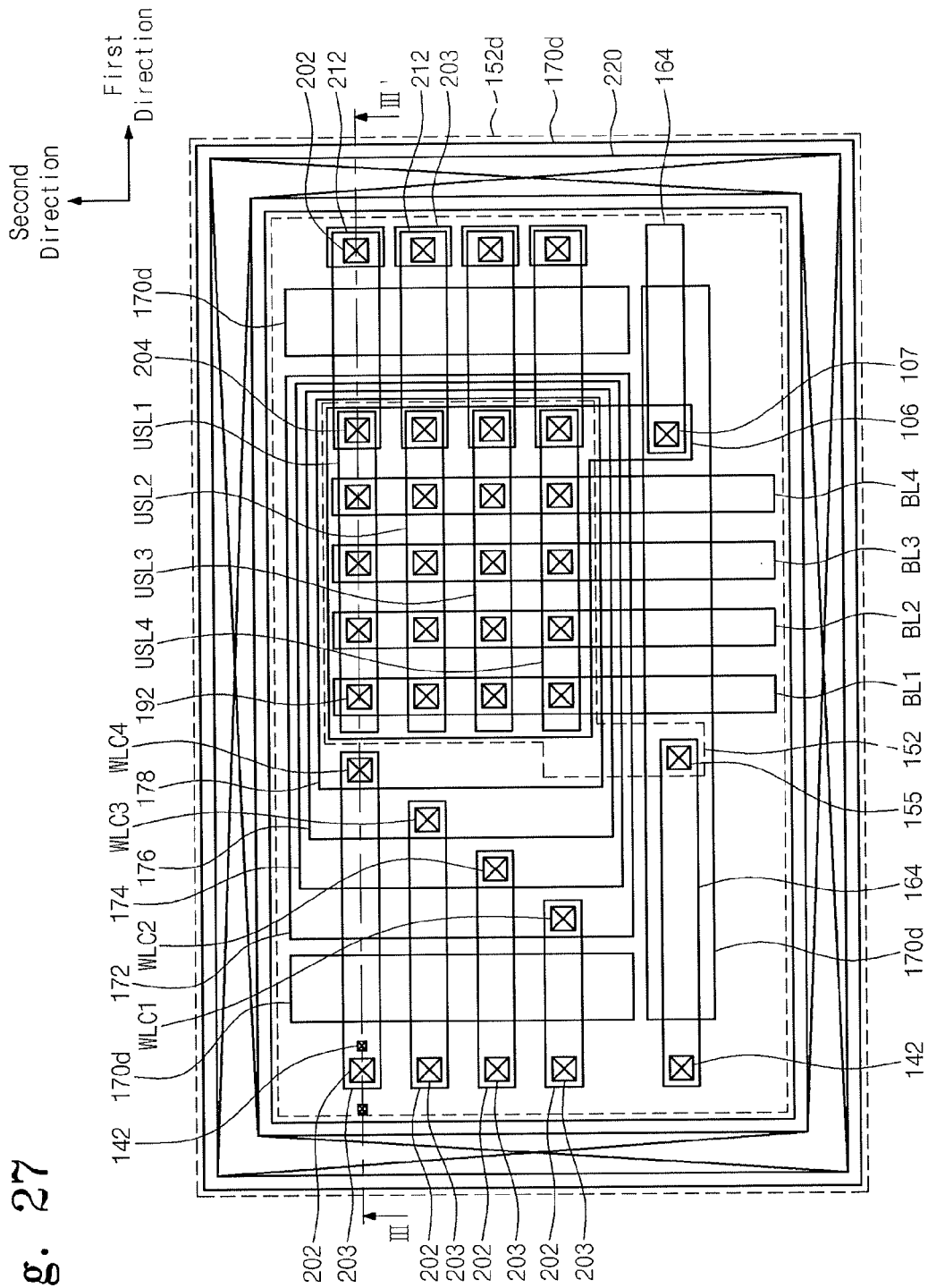
FIG. 27 illustrates a detailed plane view of a semiconductor device according to an exemplary embodiment.
Figure 28:
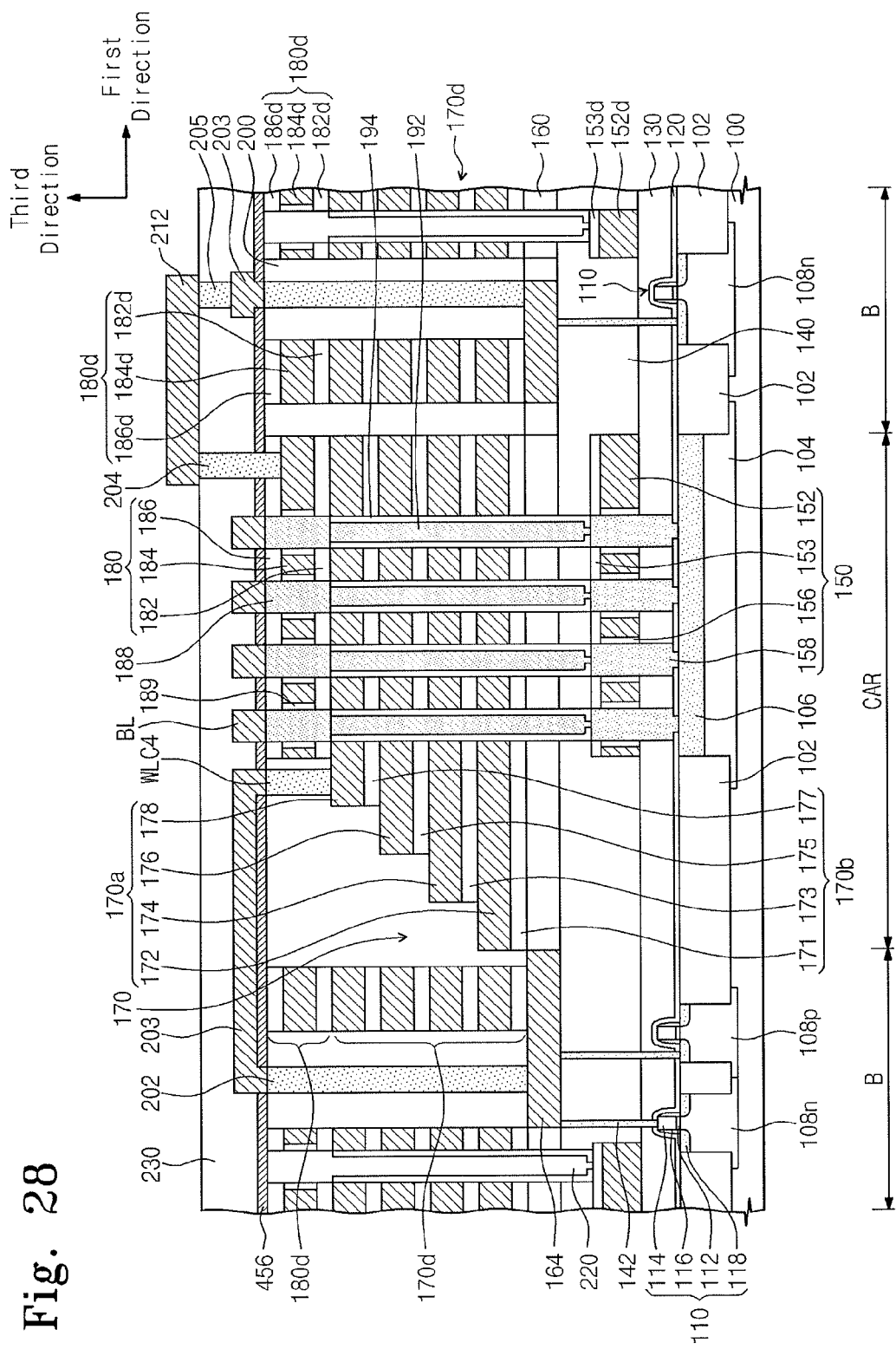
FIG. 28 illustrates a cross-sectional view taken along line III-III' of FIG. 27.

FIG. 27 is a detailed plane view of a semiconductor device according to a fifth exemplary embodiment. FIG. 28 is a cross-sectional view taken along the lines III-III' of FIG. 27.

Referring to FIGS. 27 and 28, a semiconductor substrate 100 may include the cell array region CAR provided with vertical memory cells and a peripheral circuit region B provided with the peripheral circuit for driving the vertical memory cells. In this exemplary embodiment, the peripheral circuit region B may include the decoding circuit region DCR, the sense amplifier region SAR, and the peripheral circuit region PPR illustrated in FIG. 1. The cell array region CAR of the semiconductor substrate 100 may be surrounded by an isolation layer 102. The isolation layer 102 may also be disposed at the peripheral circuit region. The isolation layer 102 may define an active region. The upper surface of the isolation layer 102 may have substantially the same height as the semiconductor substrate 100. The isolation layer 102 may be performed by, e.g., a shallow trench isolation process. The isolation layer 102 may include, e.g., at least one silicon oxide layer.

The cell array region CAR may be doped with P-conductive type to form a P-well 104. NMOS and/or PMOS may be disposed at the peripheral circuit region B. P-well 108p may be formed at the region at which the NMOS is disposed, and N-well 108n may be formed at the region at which the PMOS is disposed. A common source region 106 doped with N-type impurities may be disposed on the P-well 104 of the cell array region CAR. The common source region 106 may act as a conductive layer. The common source region 106 may perform the function of the common source line CSL. The common source region 106 may be disposed in the form of a plate. The common source region 106 may form a diode by P—N junction with the P-well 104.

A peripheral circuit transistor 110 may be disposed at the peripheral circuit region B. The peripheral circuit transistor 110 may include a peripheral circuit gate insulating layer 112, a peripheral circuit gate electrode 114, a peripheral circuit spacer 116, and source/drain 118. The peripheral circuit gate insulating layer 112 may be, e.g., a silicon oxide layer. The peripheral circuit gate insulating layer 112 may include a high-voltage gate insulating layer and a low-voltage gate insulating layer. The thickness of the high-voltage gate insulating layer may larger than that of the low-voltage gate insulating layer.

The peripheral circuit gate electrode 114 may contain, e.g., polysilicon doped with impurities. In addition, the peripheral circuit gate electrode 114 may be a multi-layered structure. The peripheral circuit gate electrode 114 may be a stacked structure of, e.g., silicon/metal compound. The metal compound may include, e.g., metal silicide. The peripheral circuit spacer 116 may be, e.g., a silicon nitride layer. The source/drain 118, which may be a N-type or P-type impurity region, may be formed at both sides of the peripheral circuit gate electrode 114 on the semiconductor substrate 100.

A first etch stop layer 120 may be disposed on the peripheral circuit transistor 110 and the common source region 106. The first etch stop layer 120 may be, e.g., a silicon nitride layer. A first interlayer insulating layer 130 may be disposed on the first etch stop layer 120. The upper surface of the first interlayer insulating layer 130 may be planarized. The first interlayer insulating layer 130 may include, e.g., a silicon oxide layer.

A lower selective structure 150 may be disposed on the first interlayer insulating layer 130 of the cell array region CAR. The lower selective structure 150 may be disposed on the common source region 106. The lower selective structure 150 may include the lower selective transistor LSTmn (see FIG. 1). The lower selective transistor LSTmn may include a plate-shaped lower selective line 152, a lower selective active pattern 158 penetrating the lower selective line 152, and a lower selective gate insulating layer 156 disposed between the lower selective active pattern 158 and the lower selective line 152.

The lower selective line 152 may include, e.g., polysilicon doped with impurities. The lower selective line 152 may be disposed in the form of a plate. A second etch stop layer 153 may be disposed on the lower selective line 152. The second etch stop layer 153 may include, e.g., a silicon nitride layer. The second etch stop layer 153 and the lower selective line 152 may be aligned. The lower selective active pattern 158 may be disposed so as to penetrate the second etch stop layer 153, the lower selective line 152, the first interlayer insulating layer 130, and the first etch stop layer 120. The lower selective active pattern 158 may be, e.g., a crystalline or polycrystalline semiconductor. The lower selective active pattern 158 may be doped with impurities. The lower selective line 152, the lower selective gate insulating layer 156, and the lower selective active pattern 158 may form a vertical lower selective transistor LSTmn. One end of the lower selective active pattern 158 may come in contact with the common source region 106. The lower selective active pattern 158 may be formed in island shapes spaced apart from each other and may penetrate the lower selective line 152.

According to the modified exemplary embodiment, the lower selective transistor LSTmn may be realized in a vertical-type or horizontal-type on the semiconductor substrate 100. The vertical lower selective transistor may have a vertical structure as in the memory cell.

A dummy lower selective line 152d may be disposed on the first interlayer insulating layer 130 of the peripheral circuit region B. The dummy lower selective line 152d may be formed of, e.g., polysilicon doped with impurities. A second dummy etch stop pattern 153d may be disposed on the dummy lower selective line 152d. The second dummy etch stop pattern 153d may be, e.g., a silicon nitride layer. The side of the second dummy etch stop pattern 153d and the dummy lower selective line 152d may be aligned. The upper surface of the second dummy etch stop pattern 153d may be the same height as that of the second stop pattern 153.

A second interlayer insulating layer 140 may be disposed on the resultant structure in which the dummy lower selective line 152d and the lower selective line 152 are formed. The second interlayer insulating layer 140 may be disposed on the first interlayer insulating layer 130, the second etch stop layer 153, and the second dummy etch stop layer 153d. The upper surface of the second interlayer insulating layer 140 may be planarized.

A lower contact plug 142 may penetrate the second interlayer insulating 140, the first interlayer insulating layer 130, and the first etch stop layer 120 so as to be connected to the peripheral circuit gate electrode 114 and/or the source/drain region 118 of the peripheral circuit transistor 110. A common source contact plug 107 may be disposed so as to be come in contact with the common source region 106 of the cell array region CAR, as shown in FIG. 27. A lower selective contact plug 155 may be disposed so as to be come in contact with the lower selective line 152, as shown in FIG. 27.

A lower interconnection 164 may be disposed on the lower contact plug 142, the common source contact plug 107, or the lower selective contact plug 155. The lower interconnection 164 may be, e.g., a metal or a doped semiconductor. The at least two of the upper surface of the lower contact plug 142, the common source contact plug 107, and the lower selective contact plug 155 may have coplanar upper surfaces and may be disposed at the same height in the semiconductor device.

The common source contact plug 107 may be disposed on the common source region 106 of the cell array region CAR. The common source region 106 or the common source line CSL may be electrically connected to devices of the peripheral circuit through the common source contact plug 107 and the lower interconnection 164. The side of the lower interconnection 164 may be filled with a third interlayer insulating layer 160. The third interlayer insulating layer 160 may be disposed on the second interlayer insulating layer 140. The upper surface of the third interlayer insulating layer 10 may have the same height as that of the lower interconnection 164.

A wordline structure 170 may be disposed on the third interlayer insulating layer 160. The wordline structure 170 may include a first wordline insulating pattern 171, a first wordline 172, a second wordline insulating pattern 173, a second wordline 174, a third wordline insulating pattern 175, a third wordline 176, a fourth wordline insulating pattern 177, and a fourth wordline 178. At least one side of the wordline structure 170 may be formed in the step-like shape. In the step-like shaped wordline structure 170, the sides of the first wordline insulating pattern 171 and the first wordline 172 may be aligned to each other. In the step-like shaped wordline structure 170, the sides of the second wordline insulating pattern 173 and the second wordline 174 may be aligned to each other. In the step-like shaped wordline structure 170, the sides of the third wordline insulating pattern 175 and the third wordline 176 may be aligned to each other. In the step-like shaped wordline structure 170, the sides of the fourth wordline insulating pattern 177 and the fourth wordline 178 may be aligned to each other. Alternatively, all sides of the wordline structure 170 may have a profile of the step-like shape. The first to fourth wordline insulating patterns 170*b* may be, e.g., a silicon oxide layer. The first to fourth wordline 170*a* may be, e.g., a doped polysilicon. A thickness of the wordlines 172, 174, 176, and 178 may be larger than a thickness of the wordline insulating patterns 171, 173, 175, and 177. The wordlines 172, 174, 176, and 178 may have a plate shape.

Cell active pillars 192 may be disposed by penetrating the wordline structure 170. The cell active pillars 192, which are formed in island shaped spaced apart from each other, may be disposed so as to penetrate a plane provided with the wordlines. An information storage layer 194 may be disposed between the cell active pillar 192 and the wordlines 172, 174, 176, and 178. The information storage layer 194 may be disposed between the cell active pillar and the wordline structure 170.

The information storage layer 194 may include a charge trapping layer. The intersection of the cell active pillar 192 with one wordline may provide one memory cell. The cell active pillar 192 may provide a channel region, a source region, and a drain region of the memory cell. The cell active pillar 192 may extend so as to be disposed by penetrating the third interlayer insulating layer 160 and the second interlayer insulating layer 140. One end of the cell active pillar 192 may come in contact with the lower selective active pattern 158. The cell active pillar 192 may be, e.g., a monocrystalline or polycrystalline semiconductor.

According to the modified exemplary embodiment, the cell active pillar 192 may have a cylindrical shape or macaroni shape. The cylinder may be filled by an insulating layer.

A dummy wordline structure 170*d* may be disposed in the peripheral circuit region B. The dummy wordline structure 170*d* may have a vertical structure as in the wordline structure 170. The dummy wordline structure 170*d* may be disposed on the third interlayer insulating layer 160 and/or the lower interconnection 164. The upper surface of the dummy wordline structure 170*d* may have the same height as that of the wordline structure 170. The dummy wordline structure 170*d* may be disposed in the peripheral circuit region B formed in the vicinity of the cell array region CAR. The dummy wordline structure 170*d* may have a closed curve shape surrounding the cell array region CAR. The dummy wordline structure 170*d* may be disposed at an edge of the peripheral circuit region B. The dummy wordline structure 170*d* may have damp-proof and antifouling functions which reduce and/or prevent damp or contamination of the cell array region.

An upper selective line structure 180 may be disposed on the wordline structure 170. The upper selective structure 180 may include an upper selective insulating pattern 182, an upper selective line 184, and a string selective capping pattern 186. Sides of the upper selective insulating pattern 182, the upper selective line 184, and the string selective capping pattern 186 may be aligned to one another. An upper selective active pattern 188 may be disposed by penetrating the upper selective line structure 180. An upper selective gate insulating layer 189 may be disposed between the upper selective active pattern 188 and the upper selective line 184. The gap between the upper selective line 184 and the upper selective capping pattern 186 may be filled by a fifth interlayer insulating layer (not illustrated). The upper surface of the fifth interlayer insulating layer may coincide with that of the upper selective capping pattern 186.

One end of the upper selective active pattern 188 may come in contact with the cell active pillar 192. The other end of the upper selective active pattern 188 may electrically be connected to a bitline BL. The upper selective line 184, the upper selective gate insulating layer 189, and the upper selective active pattern 188 may form the upper selective transistor USTmn (see FIG. 1). The upper selective line 184 may extend in a first direction. The upper selective line 184 may include a plurality of upper selective lines USL1, USL2, USL3, and USL4. The upper selective lines USL1, USL2, USL3, and USL4 may electrically be isolated from one another. The bitline BL may be patterned in the form of a line to extend in a second direction intersecting with the first direction. The upper selective line 184 may be connected to an upper interconnection 313 through an upper selective contact plug 204.

A dummy upper selective line structure 180*d* may be disposed on the dummy wordline structure 170*d* of the peripheral circuit region B. The dummy upper selective line structure 180*d* may have the same vertical structure as the upper selective line structure 180. The dummy upper selective line structure 180*d* may include a dummy upper selective insulating pattern 182*d*, a dummy upper selective line 184*d*, and a dummy upper selective capping pattern 186*d*. Sides of the dummy upper selective insulating pattern 182*d*, the dummy upper selective line 184*d*, and the dummy upper selective capping pattern 186*d* may be aligned to one another. The side profile of the dummy word line structure 170*d* may have a step-like shape as in the side profile of the damp-proof structures D1 to D4 in the first to fourth exemplary embodiments.

Sides of the wordline structure 170 and the upper selective line structure 180 may be filled by a fourth interlayer insulating layer 200. The upper surface of the fourth interlayer insulating layer 200 may have the same height as that of the upper selective line structure 180. The upper surface of the fourth interlayer insulating layer 200 may have the same height as that of the dummy upper selective line structure 180*d*. Without intending to be bound by this theory, the dummy wordline structure 170*d* and/or the dummy upper selective line structure 180*d* may act as a dummy pattern that reduces and/or prevents the dishing phenomenon by uniformly maintaining the upper surface of the fourth interlayer insulating layer 200 during the planarization of the fourth interlayer insulating layer 200.

A damp-proof structure 220 may be disposed inside the dummy wordline structure 170d and the dummy upper selective line structure 180d of the peripheral circuit region B. The damp-proof structure 220 may be disposed by penetrating the dummy wordline structure 170d. The damp-proof structure 220 may include, e.g., a silicon nitride layer. The damp-proof structure 220 may firmly reduce and/or prevent the contamination or damp from being permeated into the peripheral circuit region. The damp-proof structure 220 may extend to penetrate the dummy upper selective line structure 180d. The damp-proof structure 220 may extend to penetrate the third interlayer insulating layer 160 and the second interlayer insulating layer 140.

According to the modified exemplary embodiment, the damp-proof structure 220 may be disposed at an inner side of a through hole (not illustrated) penetrating the dummy wordline structure 170d.

Wordline contact plugs WLC1, WLC2, WLC3, and WLC4 may be disposed in the planarized fourth interlayer insulating layer 200. The wordline contact plugs WLC1, WLC2, WLC3, and WLC4 may be disposed on the step-like shaped structure. The first to fourth wordline contact plugs WLC1, WLC2, WLC3, and WLC4 may come in contact with first to fourth wordlines 172, 174, 176, and 178 by penetrating the fourth interlayer insulating layer 200. The upper surfaces of the first to fourth wordline contact plugs WLC1, WLC2, WLC3, and WLC4 may have the same height.

In the peripheral circuit region B, an upper interconnection contact plug 202 may come into contact with the lower interconnection 164. The upper interconnection contact plug 202 may be disposed by penetrating the fourth interlayer insulating layer 200.

The damp-proof layer 456 may be disposed on substantially the entire surface of the semiconductor substrate 100 including the planarized fourth interlayer insulating layer 200. The damp-proof layer 456 may contain the same material as the damp-proof reinforcement structure 220.

The bitline BL may be disposed on the damp-proof layer 456. The bitline BL may extend in the second direction and may come into contact with the upper selective active pattern 188 by penetrating the damp-proof layer 456 in the cell array region CAR. An interconnection 203 may be disposed at the plane coplanar with the bitline BL. The interconnection 203 may electrically come into contact with the wordline contact plugs and/or the upper interconnection contact plug 202.

A sixth interlayer insulating layer 230 may be disposed to cover the bitline BL and the interconnection 203. An upper selective contact plug 204 may be disposed to come in contact with the upper selective line 184 by penetrating the sixth interlayer insulating layer 230 and the upper selective capping pattern 186. The string contact plug 204 may be electrically connected to the interconnection 203 through a via 205.

FIGS. 29 through 44 are cross-sectional views illustrating sequential process steps of fabricating the semiconductor device having a cross-section of FIG. 28.

Referring to FIG. 29, a buffer oxide layer (not illustrated) and a silicon nitride layer (not illustrated) may be formed on the semiconductor substrate 100. The buffer oxide layer, the silicon nitride layer, and the semiconductor substrate 100 may be successively patterned to form a buffer oxide pattern (not illustrated), a silicon nitride pattern (not illustrated), and a trench (not illustrated). The trench may be filled by the isolation layer 102 through, e.g., a plasma chemical vapor deposition process. The isolation layer 102 may be planarized such that the silicon nitride pattern is exposed. The isolation layer 102 may be formed by a shallow trench isolation process. The isolation layer 102 may be formed in the cell array region CAR and the peripheral circuit region B.

A sacrificial oxide layer (not illustrated) may be formed on the semiconductor substrate 100. The sacrificial oxide layer may be patterned by using a photoresist. Ions may be implanted into the patterned sacrificial oxide layer to form the P-well 104 in the cell array region CAR. Furthermore, the P-well 108p may be formed in the peripheral circuit region B by using the patterning and ion implantation techniques of, e.g., NMOS. The N-well 108n may be formed in the peripheral circuit region B by using the patterning and ion implantation techniques of, e.g., PMOS. Using the patterning and ion implantation techniques, the common source region 106 may be formed in the cell array region CAR. The common source region 106 may be densely doped with an N-type dopant. The common source region 106 may be used as a common source line CSL. The P-well 104 and the common source region 106 may form a diode by P-N junction.

The peripheral circuit gate insulating layer 112 may be disposed on the semiconductor substrate 100. The peripheral circuit gate insulating layer 112 may be, e.g., a silicon oxide layer. The silicon oxide layer may be, e.g., a thermal oxide layer. The peripheral circuit gate insulating layer 112 may include a gate insulating layer for high voltage and a gate insulating layer for low voltage. The thickness of the gate insulating layer for high voltage may larger than that of the gate insulating layer for low voltage.

Referring to FIG. 30, a peripheral circuit gate conductive layer (not illustrated) may be formed on the peripheral circuit gate insulating layer 112. The peripheral circuit gate conductive layer may contain, e.g., polysilicon doped with impurities. The peripheral circuit gate conductive layer may have a multi-layered structure. The multi-layered structure may include, e.g., a silicon/metal silicide structure. The peripheral circuit gate conductive layer may be patterned to form the peripheral circuit gate electrode 114. The peripheral circuit spacer 116 may be disposed at the side of the peripheral circuit gate electrode. The peripheral circuit spacer 116 may be formed by the deposition of, e.g., silicon nitride layer, and by anisotropic etching. The source/drain region 118 may be formed at the sides of the peripheral circuit gate electrode 114 on the semiconductor substrate 100. The source/drain region 118 may be doped with at least one of N-type impurity and P-type impurity. In the case of NMOS, the source/drain region 118 may be doped with the N-type impurity. In the case of PMOS, the source/drain region 118 may be doped with the P-type impurity. The source/drain region 118 may include a LDD (Lightly Doped Drain) structure.

The peripheral circuit transistor 110 may include the peripheral circuit gate insulating layer 112, the peripheral circuit gate electrode 114, the peripheral circuit spacer 116, and the source/drain region 118. The first etch stop layer 120 may conformally be formed on the peripheral circuit transistor 110. The first etch stop layer 120 may be, e.g., at least one of a silicon nitride layer and a silicon oxynitride layer.

Referring to FIG. 31, the first interlayer insulating layer 130 may be formed on the first etch stop layer 120. The first interlayer insulating layer 130 may be, e.g., a silicon oxide layer. The upper surface of the silicon oxide layer may be planarized. A lower selective conductive layer 152a may be formed on the first interlayer insulating layer 130. A second etch stop layer 153a may be disposed on the lower selective conductive layer 152a. The lower selective conductive layer 152a may be, e.g., monocrystalline or polycrystalline silicon.

Amorphous silicon may be formed to mono-crystallize or poly-crystallize the lower selective conductive layer 152a by post-treatment. The second etch stop layer 153a may be at least one of a silicon nitride layer and a silicon oxynitride layer.

The second etch stop layer 153a, the lower selective conductive layer 152a, and the first interlayer insulating layer 130 may be successively patterned to form a lower selective hole 157. The lower selective hole 157 may be two-dimensionally arranged in the form of a matrix in the cell array region CAR.

Referring to FIG. 32, the semiconductor substrate 100 provided with the lower selective hole 157 may be heat-treated to form the lower selective gate insulating layer 156 at the side of the lower selective hole 157. The lower selective gate insulating layer 156 may be, e.g., a silicon oxide layer.

A lower selective spacer layer (not illustrated) may be conformally formed on the semiconductor substrate provided with the lower selective gate insulating layer 156. The lower selective spacer layer may be, e.g., at least one of a silicon oxynitride layer and a silicon layer. The lower selective spacer layer may be anisotropically etched to form a lower selective spacer 159 at the inner side of the lower selective hole 157. Subsequently, the lower selective hole 157 formed with the lower selective spacer 159 may be anisotropically etched to remove the first etch stop layer 120 disposed below the lower selective hole 157. As a result, the common source region 106 may be exposed.

Referring to FIG. 33, the lower selective spacer 159 may be selectively removed by using an isotropic etching. The lower selective hole 157 may be filled with the lower selective active pattern 158. The lower selective active pattern 158 may be formed by using, e.g., a selective epitaxial growth technique or by planarizing a semiconductor layer formed on the semiconductor substrate 100 through chemical vapor deposition.

Referring to FIG. 34, the second etch stop layer 153a and the lower selective conductive layer 152a may be patterned to form the second etch stop pattern 153 and the lower selective line 152 in the cell array region CAR and to form the second etch stop pattern 153d and the dummy lower selective line 152d in the peripheral circuit region B. The upper surface of the second dummy etch stop pattern 153d may have the same height as that of the second etch stop pattern 153. The second dummy etch stop pattern 153d may be disposed at the outermost part of the peripheral circuit region B. The lower selective line 152 may have a plate shape. The lower selective structure 150 may include the lower selective line 152, the lower selective active pattern 158, and the lower selective gate insulating layer 156 to form the lower selective transistor LSTmn.

According to the modified exemplary embodiment, the lower selective transistor LSTmn is not limited to a vertical type. For example, the lower selective transistor LSTmn may be horizontally formed with respect to the semiconductor substrate. The lower selective transistor LSTmn may be formed using variously processes.

Figure 35:
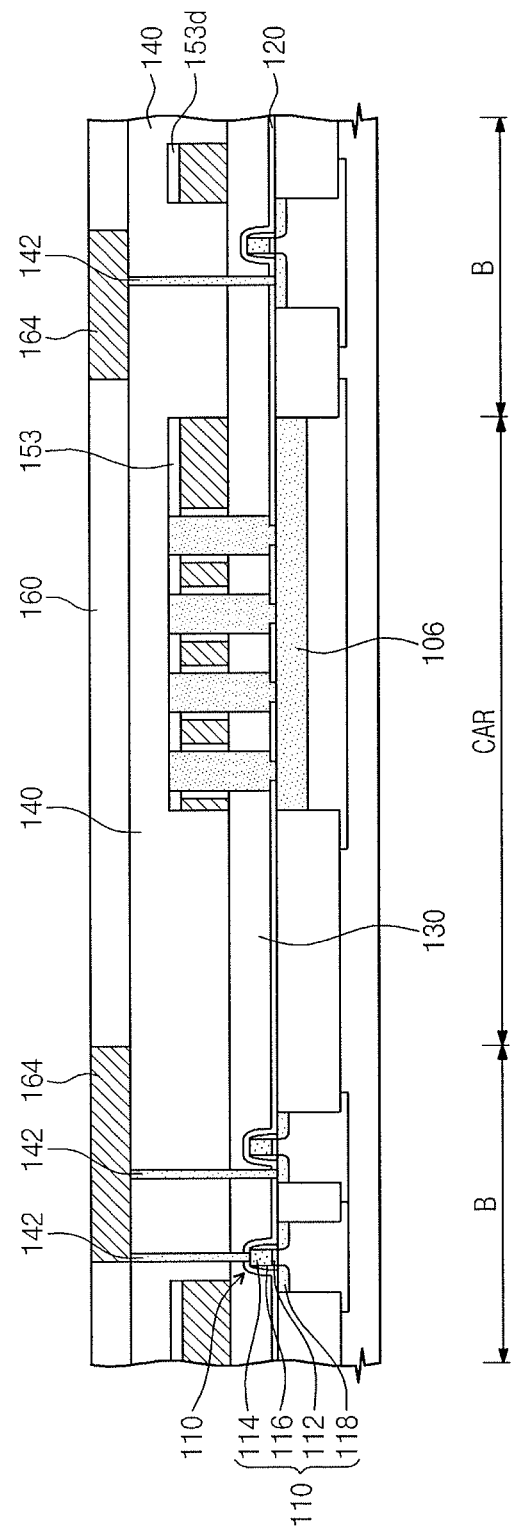

Referring to FIG. 35, the second interlayer insulating layer 140 may be formed on the resultant structure formed with the second dummy etch stop pattern 153d and the second etch stop pattern 153. The second interlayer insulating layer 140 may be, e.g., a silicon oxide layer. The upper surface of the second interlayer insulating layer 140 may be planarized. A lower interconnection contact hole (not illustrated) may be formed on the peripheral circuit gate electrode 114 or the source/drain region 118 of the peripheral circuit transistor 110 by penetrating the second interlayer insulating layer 140 and the first interlayer insulating layer 130. A metal layer may be formed on the semiconductor substrate 100 to fill the lower interconnection contact hole. Subsequently, the metal layer may be planarized to form a lower interconnection contact plug 142. The lower interconnection contact plug 142 may substantially fill the lower interconnection contact hole.

Referring to FIGS. 27 and 35, the common source contact plug 107 may be disposed on the common source region 106 by penetrating the second interlayer insulating layer 140 and the first interlayer insulating layer 130. The common source contact plug 107 may be disposed at an edge of the common source region 106. Referring to FIG. 27, the lower selective contact plug 155 may be disposed so as to come in contact with the lower selective line 152 by penetrating the second interlayer insulating layer 140 and the second etch stop pattern 153.

Referring again to FIG. 35, a lower interconnection layer (not illustrated) may be formed on the second interlayer insulating layer 140 to come in contact with the lower interconnection contact plug 142. The lower interconnection layer may be patterned to form the lower interconnection 164. The third interlayer insulating layer 160 may be formed on the resultant structure provided with the lower interconnection 164. The third interlayer insulating layer 160 may be, e.g., a silicon oxide layer. The upper surface of the third interlayer insulating layer 160 may be planarized. The upper surface of the third interlayer insulating layer 160 may have the same height as that of the lower interconnection 164.

Figure 36:
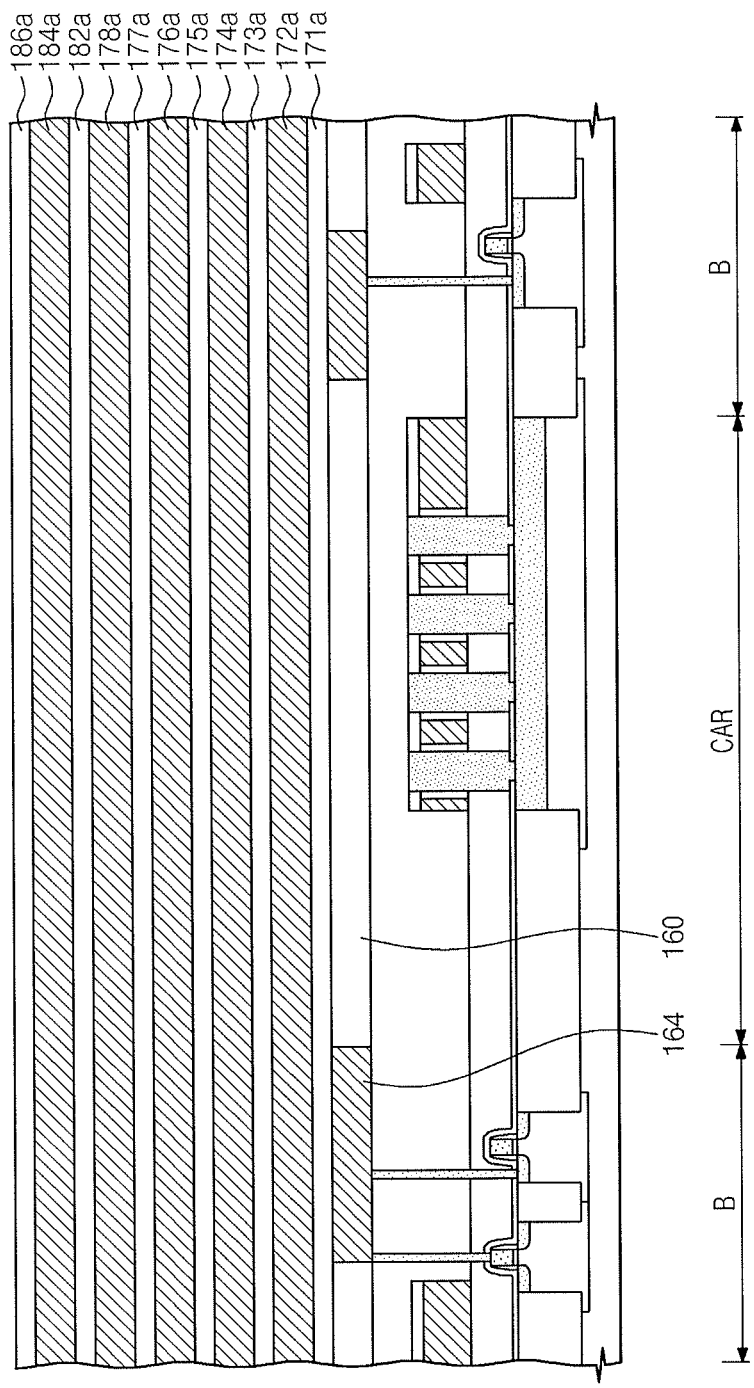

Referring to FIG. 36, a first wordline insulating layer 171a, a first wordline conductive layer 172a, a second wordline insulating layer 173a, a second wordline conductive layer 174a, a third wordline insulating layer 175a, a third wordline conductive layer 176a, a fourth wordline insulating layer 177a, and a fourth wordline conductive layer 178a are sequentially stacked on the third interlayer insulating layer 160. The first to fourth wordline conductive layer 172a, 174a, 176a, and 178a may include, e.g., the doped silicon. The first to fourth wordline insulating layer 171a, 173a, 175a, and 177a may include, e.g., a silicon oxide layer.

An upper selective insulating layer 182a, an upper selective conductive layer 184a, and an upper selective capping layer 186a may be stacked on the fourth wordline conductive layer 178a. The upper selective insulating layer 182a may be, e.g., a silicon oxide layer. The upper selective conductive layer 184a may include, e.g., doped silicon. The upper selective capping layer 186a may be, e.g., a silicon nitride layer.

Figure 37:
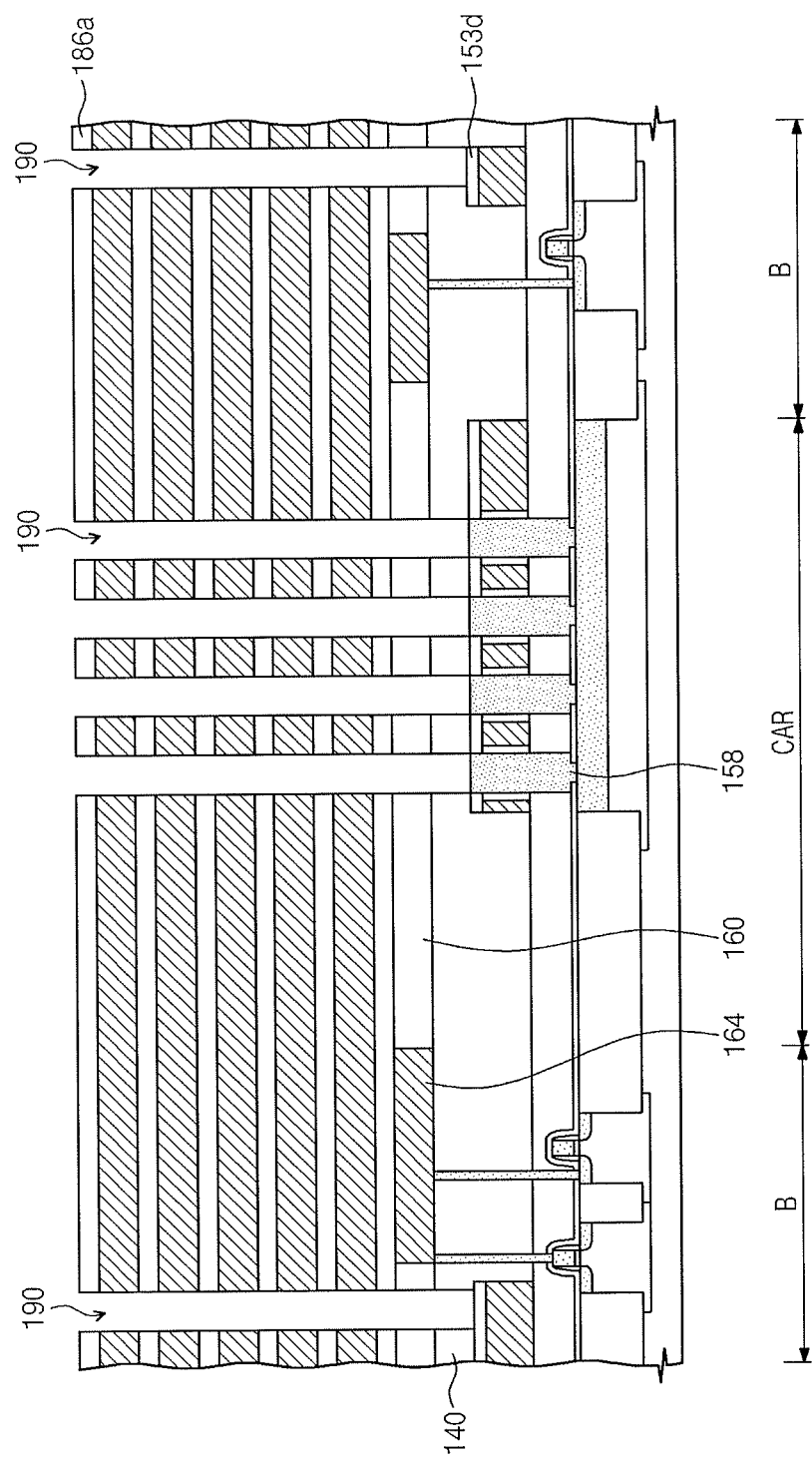

Referring to FIG. 37, lower structures below the upper selective capping layer 186a may be patterned to form a string contact hole 190. The string contact hole 190 may be formed in a matrix shape at the cell array region CAR. The string contact hole 190 may be formed at an edge of the peripheral circuit region B. The string contact hole 190 may penetrate at least the wordline conductive layers 172a, 174a, 176a, and 178a and the wordline insulating layer 171a, 173a, 175a, and 177a. The string contact hole 190 may extend to penetrate the third interlayer insulating layer 160 and the second interlayer insulating layer 140. The string contact hole 190 may expose the lower selective active pattern 158 at the cell array region CAR. The string contact hole 190 may be disposed so as to be aligned with the lower selective active pattern 158. The string contact hole 190 may expose the second dummy etch stop pattern 153d at the peripheral circuit region B.

Figure 38:
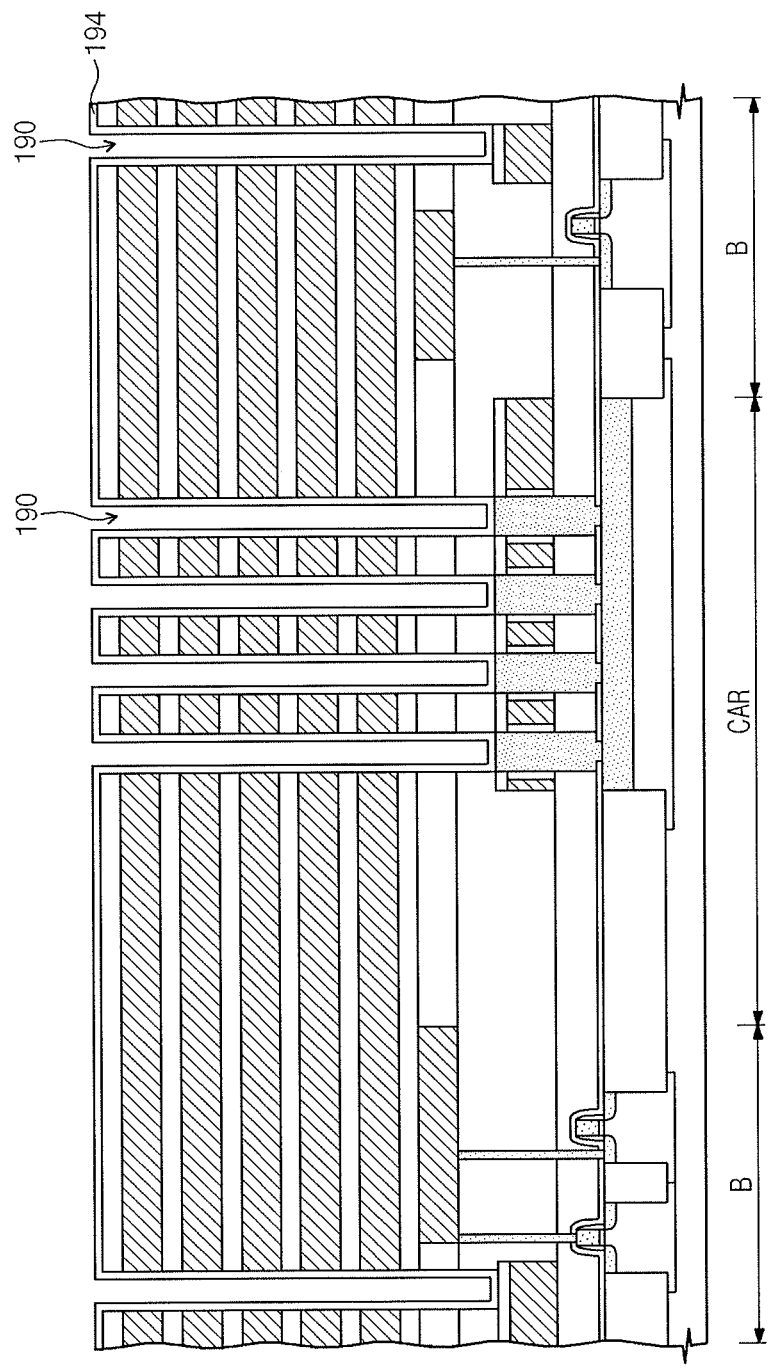

Referring to FIG. 38, the information storage layer 194 may be conformally formed on the semiconductor substrate 100 provided with the string contact hole 190. The gate insulating layer may include a charge storage layer. The gate insulating layer may be a multi-layered structure including, e.g., tunnel insulating layer/charge storage layer/blocking insulating layer. The gate insulating layer may be, e.g., an ONO multi-layered structure of silicon oxide layer/silicon nitride layer/silicon oxide layer. The charge storage layer may be, e.g., a silicon nitride layer. The charge storage layer may trap charges. The tunnel insulating layer may be, e.g., a thermal oxide layer. The structure and material of the gate insulating layer may be variously modified.

Figure 39:
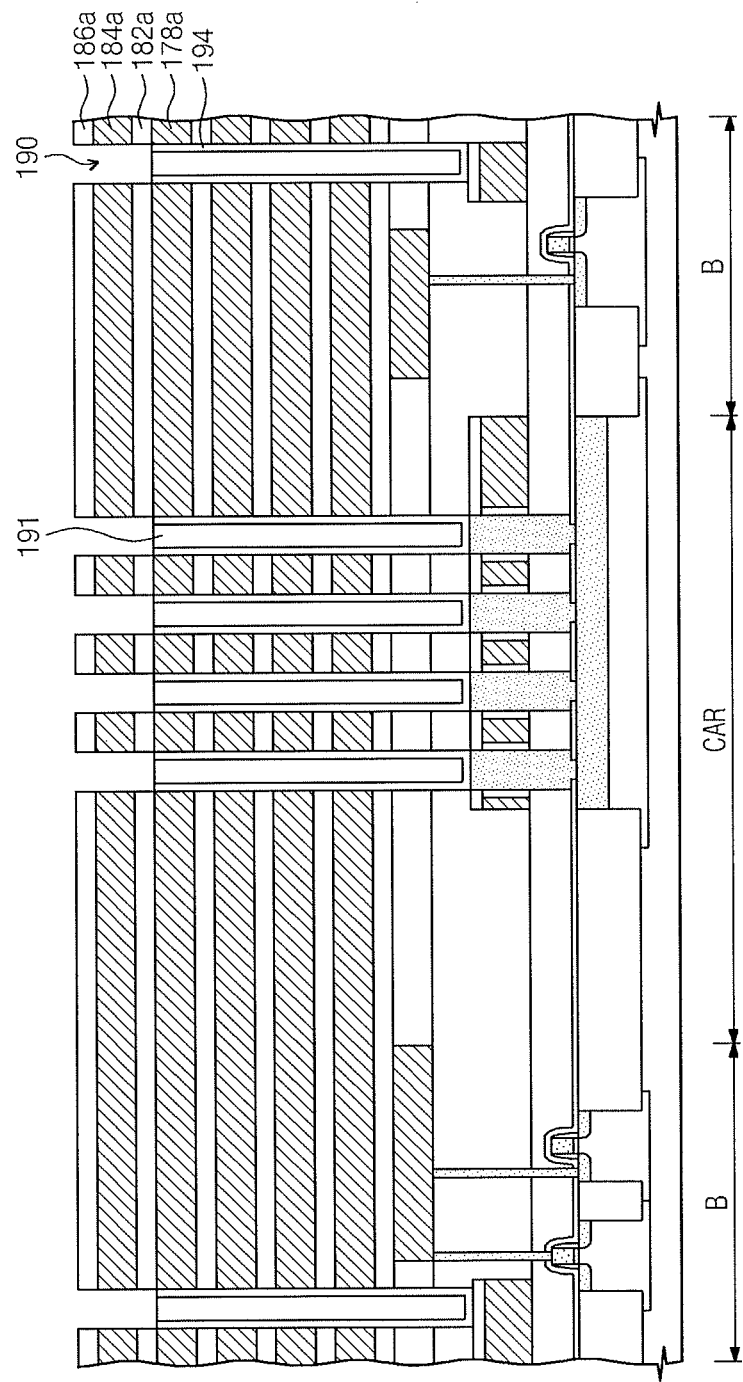

Referring to FIG. 39, a photoresist 191 may be formed on the semiconductor substrate 100 provided with the information storage layer 194. The upper surface of the photoresist 191 may substantially coincide with that of the fourth wordline conductive layer 178a by an etch-back process. Subsequently, the semiconductor substrate 100 may be wet-etched to remove the exposed information storage layer 194.

Figure 40:
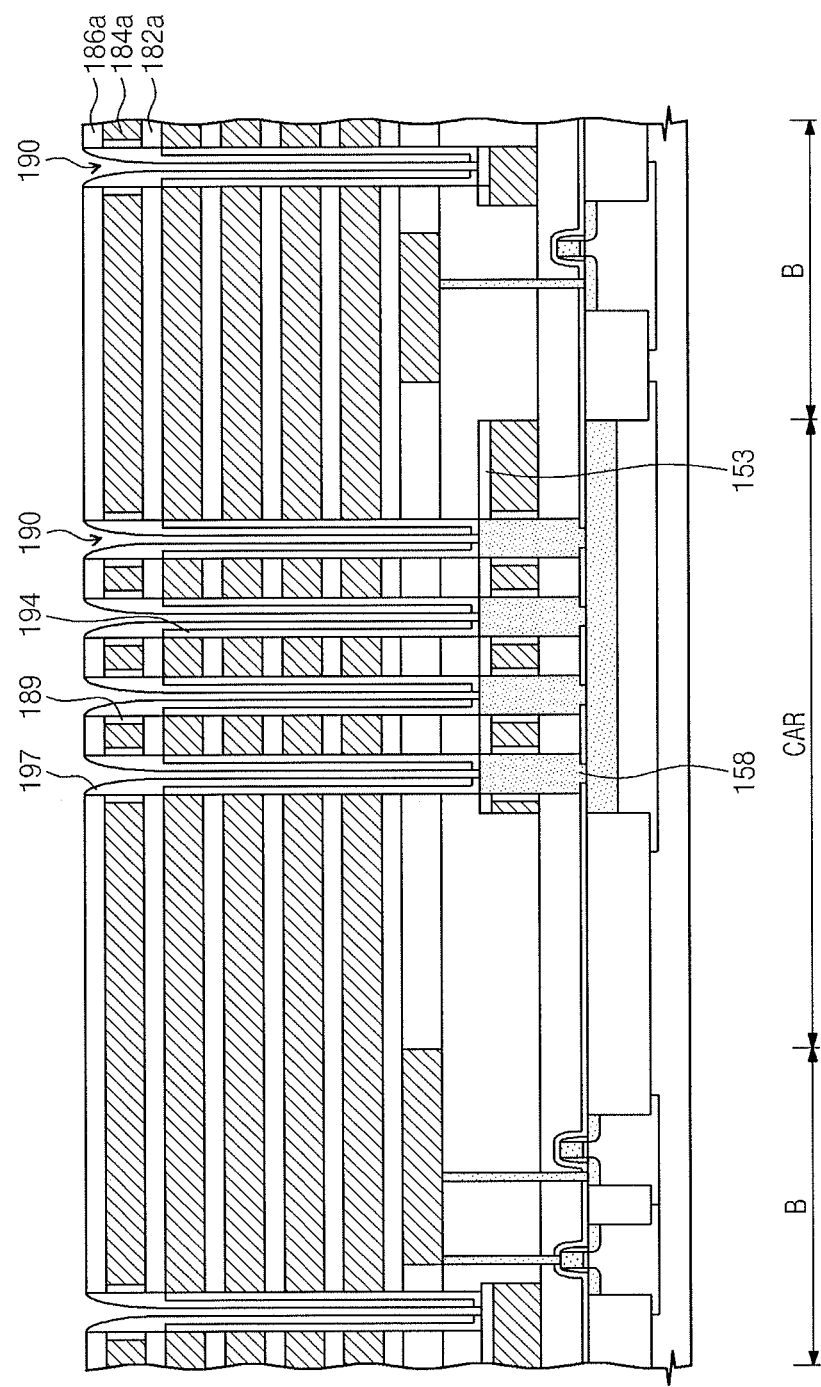

Referring to FIG. 40, the photoresist 191 filled in the string contact hole 190 may be removed. The upper selective conductive layer 184a may be thermally oxidized to form the upper selective gate insulating layer 189. Subsequently, the string spacer layer (not illustrated) may be conformally formed on the semiconductor substrate 100. The string spacer layer may be, e.g., at least one of a silicon nitride layer, a silicon oxynitride layer, and silicon. The string spacer layer may be anisotropically etched to form string spacers 197 at sides of the string contact hole 190. The string spacers 197 may expose a part of the information storage layer 194. The information storage layer 194 disposed on the lower selective active pattern 158 may be removed by using the string spacer 197 and the upper selective capping layer 186a as an etch mask. For this reason, the lower selective active pattern 158 may be exposed.

Figure 41:
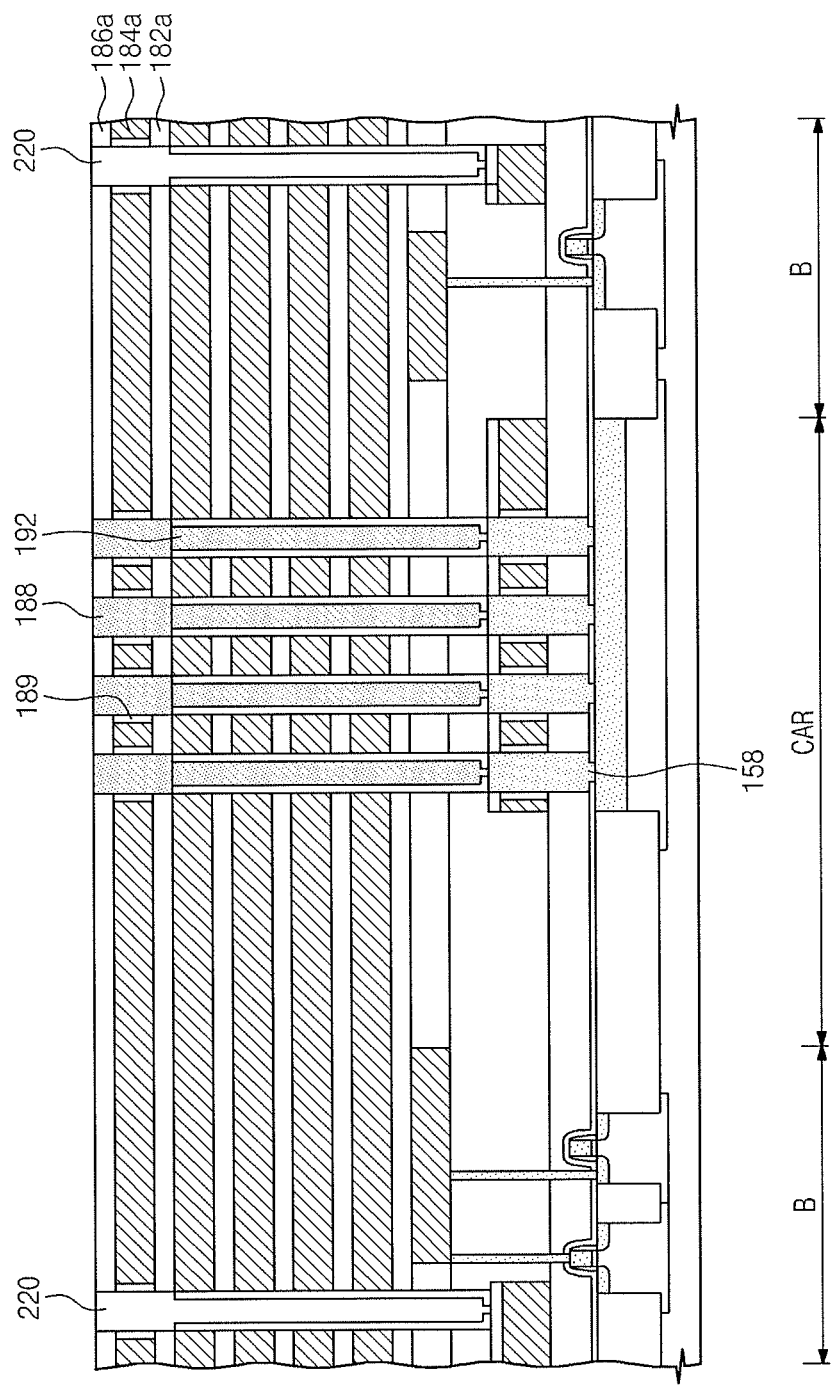

Referring to FIG. 41, the string spacer 197 may be selectively removed by using an isotropic etching. The cell active pillars 192 may be grown in a pillar shape by using the selective epitaxial growth process on the lower selective active pattern 158 exposed in the cell array region CAR. The cell active pillars 192 may be, e.g., silicon doped or undoped with impurities. The cell active pillars 192 may extend to fill the string contact hole 190. Subsequently, the semiconductor substrate formed with the cell active pillars 192 may be planarized. The top of the semiconductor structure may form the upper selective active pattern 188.

The lower selective active pattern 158 may not be disposed below the string contact hole 190 of the peripheral circuit region B. Consequently, the semiconductor structure may not be formed in the string contact hole 190 by the selective epitaxial growth process. A damp-proof reinforcement layer (not illustrated) may be formed on the semiconductor substrate 100 to fill the string contact hole 190 of the peripheral circuit region B. The semiconductor substrate formed with the damp-proof reinforcement layer may be planarized to form the damp-proof reinforcement structure 220. The damp-proof reinforcement layer may include, e.g., at least one of a silicon nitride layer, a silicon oxynitride layer, and a polyimide layer. The damp-proof reinforcement structure 220 may reduce and/or prevent the contamination or damp of chips outside from being permeated into the peripheral circuit region B.

According to the modified exemplary embodiment, the semiconductor layer (not illustrated) may be deposited on the semiconductor substrate 100 in which the lower selective active pattern 158 below the string contact hole 190 may be exposed. The semiconductor layer may be, e.g., polysilicon or amorphous silicon. Subsequently, the semiconductor layer may be crystallized by heat treatment. The semiconductor layer, which may be formed in the string contact hole 190 of the peripheral circuit region B, may be removed by, e.g., a wet etching process. The string contact hole 190 of the peripheral circuit region B may be filled with the damp-proof reinforcement structure 220. The damp-proof reinforcement structure 220 may include, e.g., a silicon nitride layer.

According to the modified exemplary embodiment, the semiconductor layer (not illustrated) may be deposited on the semiconductor substrate 100 in which the lower selective active pattern 158 below the string contact hole 190 is exposed. The semiconductor layer may be conformally deposited on the sidewall of the string contact hole 190. The damp-proof reinforcement layer may include, e.g., a silicon nitride layer. The semiconductor substrate formed with the damp-proof reinforcement layer may be planarized such that the upper selective capping layer 186a is exposed, thereby forming the damp-proof reinforcement structure 220 filling the string contact hole 190.

Figure 42:
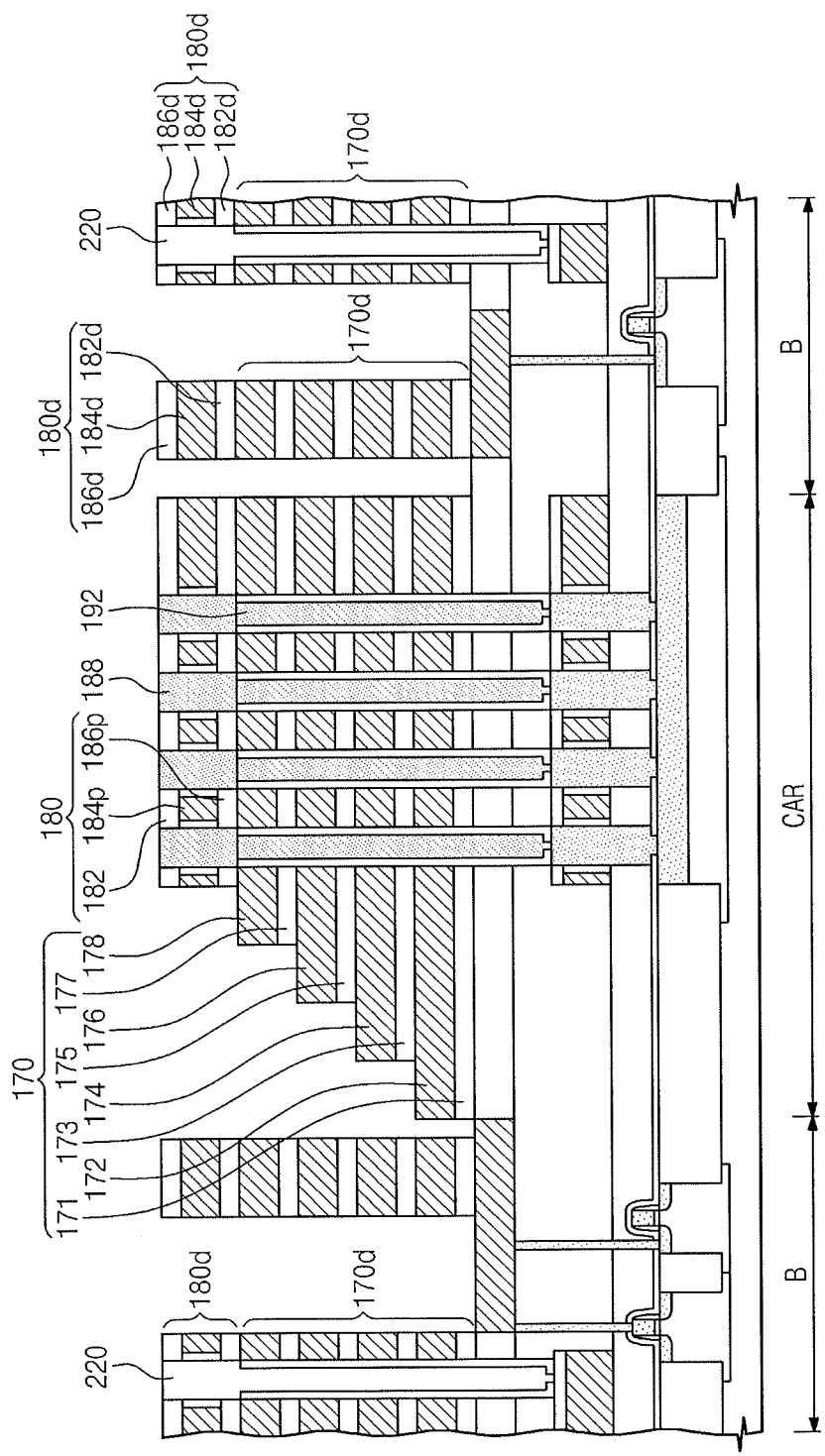

Referring to FIG. 42, the structure below the upper selective capping layer 186a may be patterned to form the upper selective line structure 180, the dummy upper selective line structure 180d, the wordline structure 170, and the dummy wordline structure 170d. The patterning may be performed using a plurality of masks.

The wordline structure 170 may include the first wordline insulating pattern 171, the first wordline 172, the second wordline insulating pattern 173, the second wordline 174, the third wordline insulating pattern 175, the third wordline 176, the fourth wordline insulating pattern 177, and the fourth wordline 178. The upper selective line structure 180 may be disposed on the wordline structure 170. The upper selective line structure 180 may include an upper selective insulating pattern 182, a preliminary upper selective line 184p, and a preliminary upper string selective capping pattern 186p. Sides of the upper selective insulating pattern 182, the preliminary upper selective line 184p, and the preliminary upper selective capping pattern 186p may be aligned to one another.

In the step-like shaped wordline structure 170, the first to fourth wordline insulating patterns 171, 173, 175, and 177 and the first to fourth wordlines 172, 174, 176, and 178 may be aligned to one another. As shown in FIG. 42, the upper selective line structure 180 may have a step-like shape like the step-like shaped wordline structure 170.

The dummy wordline structure 170d may have a vertical structure at the peripheral circuit region B as in the wordline structure 170. The dummy wordline structure 170d, however, may not have the step-like shape. The sides of the dummy upper selective line structure 180d and the dummy wordline structure 170d may be aligned to each other.

Alternatively, as described in the first to fourth exemplary embodiments, all sides of the wordline structure 170 and the dummy wordline structure 170d may have a profile of the step-like shape by the exhaustive etching process.

Figure 43:
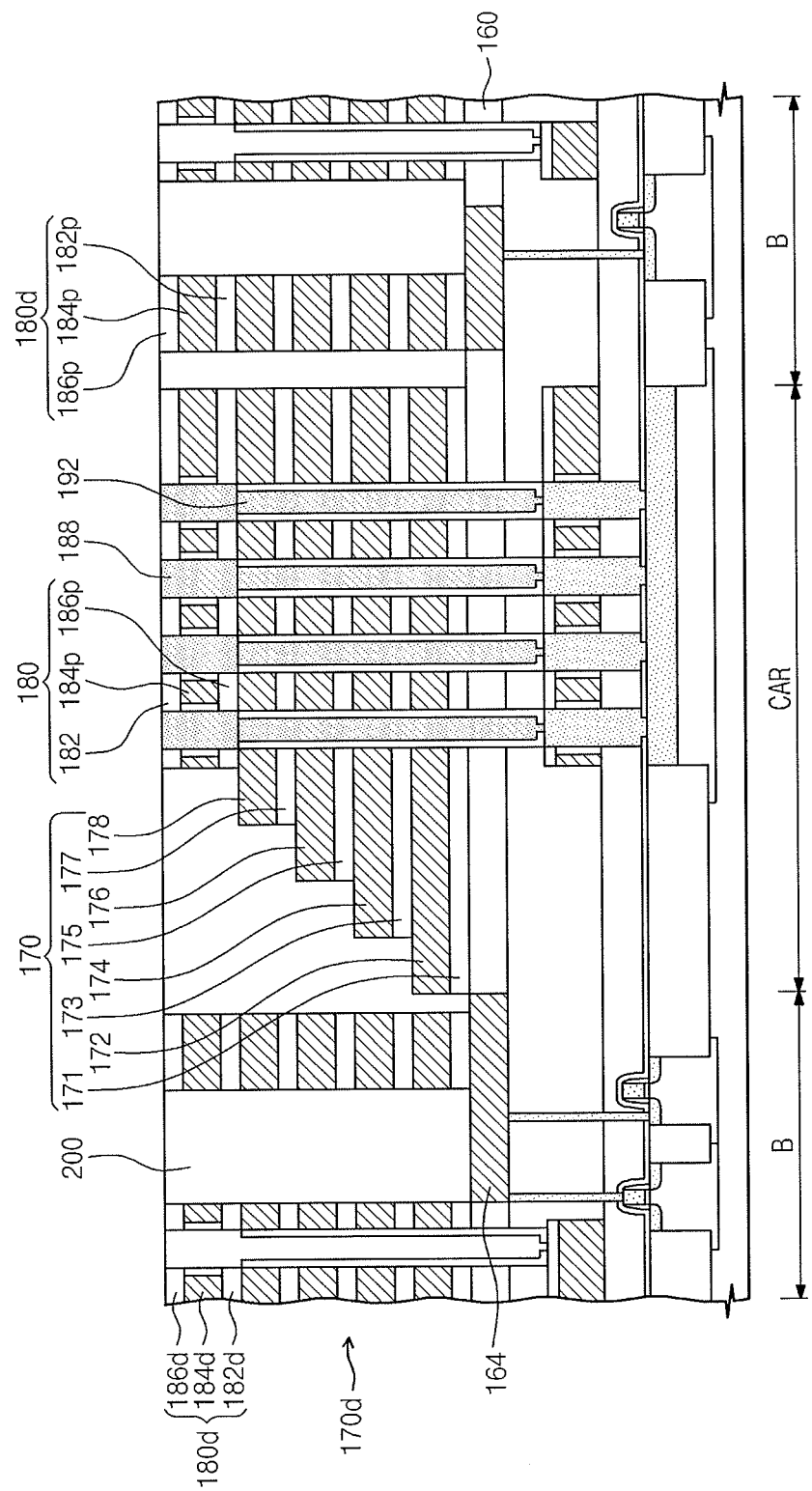

Referring to FIG. 43, the fourth interlayer insulating layer 200 may be formed on the semiconductor substrate 100. The fourth interlayer insulating layer 200 may be planarized such that the preliminary upper selective capping pattern 186p may be exposed. The fourth interlayer insulating layer 200 may be a silicon oxide layer. During the planarization process of the fourth interlayer insulating layer 200, a step difference between the cell array region CAR and the peripheral circuit region B may occur. The dummy wordline structure 170d and the dummy upper selective line structure 180d may act as a dummy pattern to uniformly maintain the upper surface of the fourth interlayer insulating layer 200 at the peripheral circuit region B and the cell array region CAR, such that the dishing phenomenon may not occur.

Figure 44:
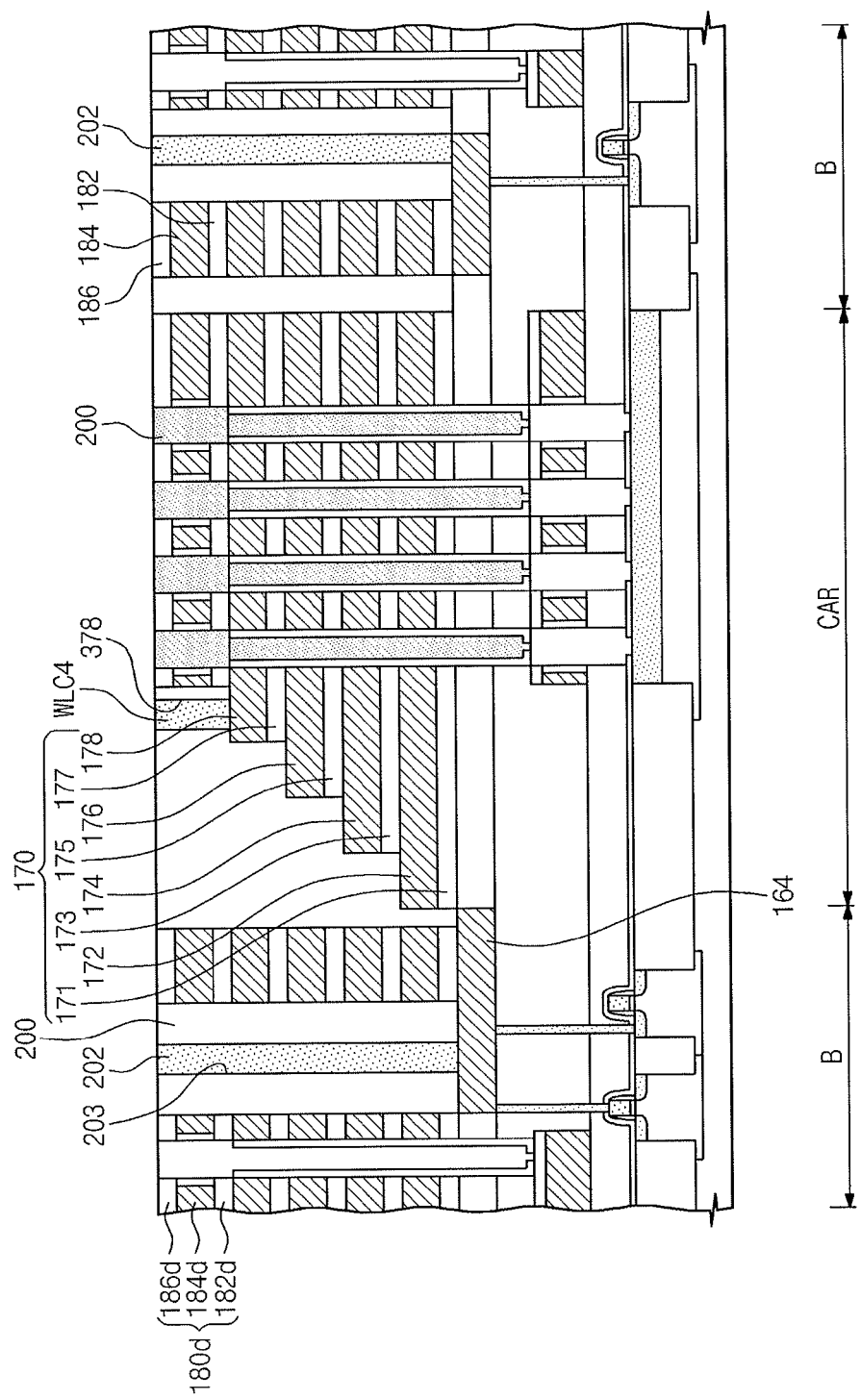

Referring to FIG. 44, the preliminary upper selective capping pattern 186p and the preliminary upper selective line 184p may be patterned to form the respective upper selective capping pattern 186 and the upper selective line 184 extending in the first direction. The fifth interlayer insulating layer (not illustrated) may be formed on the semiconductor substrate 100 provided with the upper selective line 184. The fifth interlayer insulating layer may be planarized such that the upper selective capping pattern 186 may be exposed.

Referring to FIGS. 27 and 44, the fourth interlayer insulating layer 200 may be patterned to form a first wordline contact hole (not shown) exposing the first wordline 172, a second wordline contact hole (not shown) exposing the second wordline 174, a third wordline contact hole (not shown) exposing the third wordline 176, and a fourth wordline contact hole (not shown) exposing the fourth wordline 178. An upper interconnection contact hole 203 may be formed in the peripheral circuit region B to expose the lower interconnection 164. A metal layer may be formed to fill the first to fourth wordline contact hole and the upper interconnection contact hole. The metal layer may be planarized such that the fourth interlayer insulating layer 200 is exposed, resulting in forming the first to fourth wordline contact plugs WLC1 to WLC4 and the upper interconnection contact plug 202.

Referring again to FIG. 28, the damp-proof layer 456 may be formed on substantially the entire surface of the semiconductor substrate 100 including the first to fourth wordline contact plugs WLC1 to WLC4. In addition, the damp-proof layer may be patterned to expose the first to fourth wordline contact plugs WLC1 to WLC4, the upper selective active pattern 188, and the upper interconnection contact plug 202. The bit conductive layer (not shown) may be formed on the entire surface of the semiconductor substrate 100. The bit conductive layer may be patterned to form the bitline BL at the cell array region CAR. The bitline BL may connect the upper selective active pattern 188 and/or the cell active pillar 192 in the second direction. Furthermore, an upper pad 203 may be formed at the peripheral circuit region B to connect the upper interconnection contact plugs 202 to each other.

The sixth interlayer insulating layer 230 may be formed on the semiconductor substrate 100 provided with the bitline BL. The sixth interlayer insulating layer 230 and the upper selective capping pattern 186 may be patterned to form the upper selective contact hole (not shown). The metal layer may be formed to fill the string contact hole. The metal layer may be planarized to form the upper selective contact plugs 204. The upper selective contact plugs 204 may be connected to each other through the upper interconnection 212.

Sixth Embodiment

Figure 45:
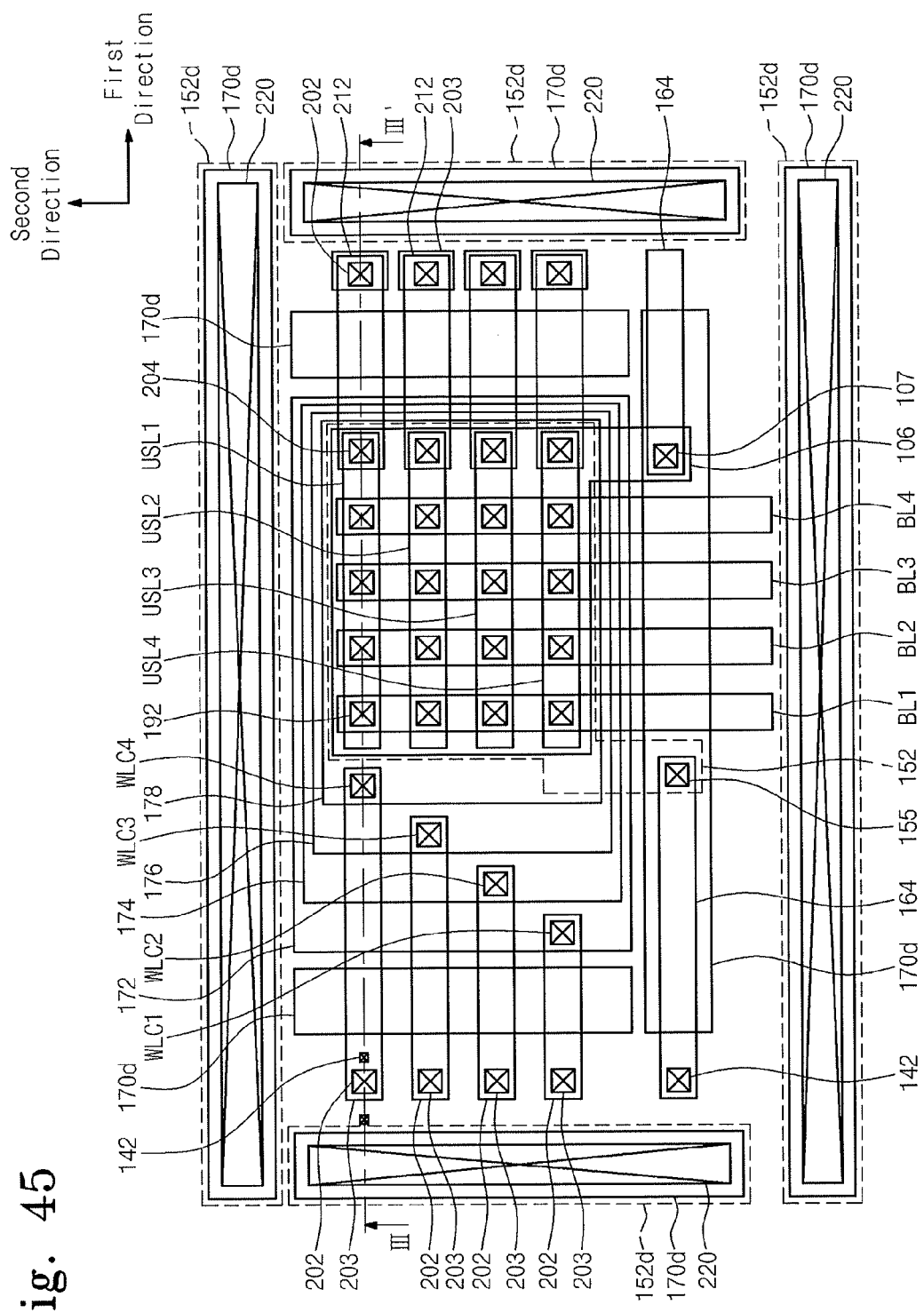
FIG. 45 illustrates a detailed plane view of a semiconductor device according to an exemplary embodiment.

FIG. 45 is a detailed plane view of a semiconductor device according to a sixth exemplary embodiment.

Referring to FIG. 45, the dummy wordline structure 170d, the dummy lower selective line 152d, and the damp-proof reinforcement structure 220 may have a bar shape. The cross-sectional view taken along the line III-III' in the semiconductor device of FIG. 45 may be substantially the same as to FIG. 28. Other configurations may be equal to and similar to the sixth exemplary embodiment.

Figure 46:
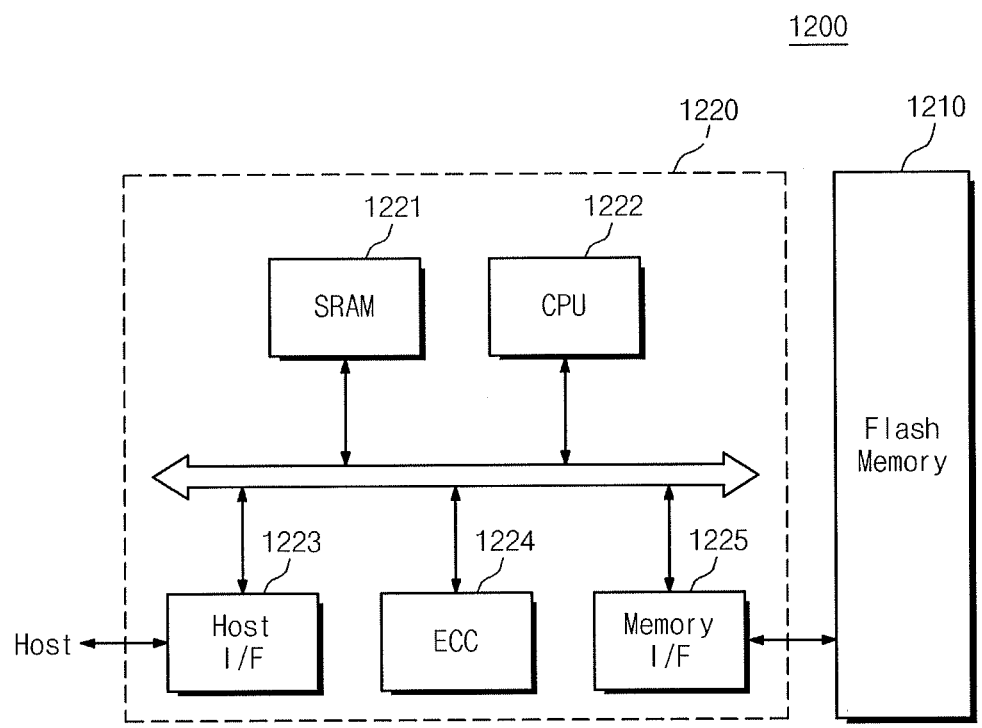
FIG. 46 illustrates a schematic block diagram showing an exemplary memory card including a flash memory device according to exemplary embodiments.

FIG. 46 is a schematic block diagram illustrating an example of a memory card 1200 including a flash memory device according to exemplary embodiments.

Referring to FIG. 46, the memory card 1200 may be mounted with a flash memory device 1210 according to an exemplary embodiment to support a mass data storing ability. The memory card 1200 may include a memory controller 1220 for controlling all the data exchange between a host and the flash memory device 1210.

A Static Random Access Memory (SRAM) 1221 is used as an operation memory of a processing unit 1222. A host interface (I/F) 1223 has a data exchange protocol of a host connected to the memory card 1200. An Error Correction Coding block (ECC block) 1224 detects and corrects errors of data read from the flash memory device 1210 with a multi-bit characteristic. A memory interface (I/F) 1225 interfaces with the flash memory device 1210. The CPU 1222 controls overall operations for the data exchange of the memory controller 1220. Even though not illustrated in the drawings, it will be apparent to those skilled in the art that the memory card 1200 may further be provided with a ROM (Read-Only Memory, which is not illustrated) storing code data for interfacing with the host.

According to the flash memory device, the memory card, or the memory system, there is provided the memory system having high reliability through the flash memory device 1210 in which erasing characteristics of dummy cells are improved. In particular, the flash memory device according to an exemplary embodiment may be provided in the memory system such as a solid state drive (SSD), which has actively been developed in recent. In this case, the memory system having high reliability may be realized by blocking reading errors caused by the dummy cells.

Figure 47:
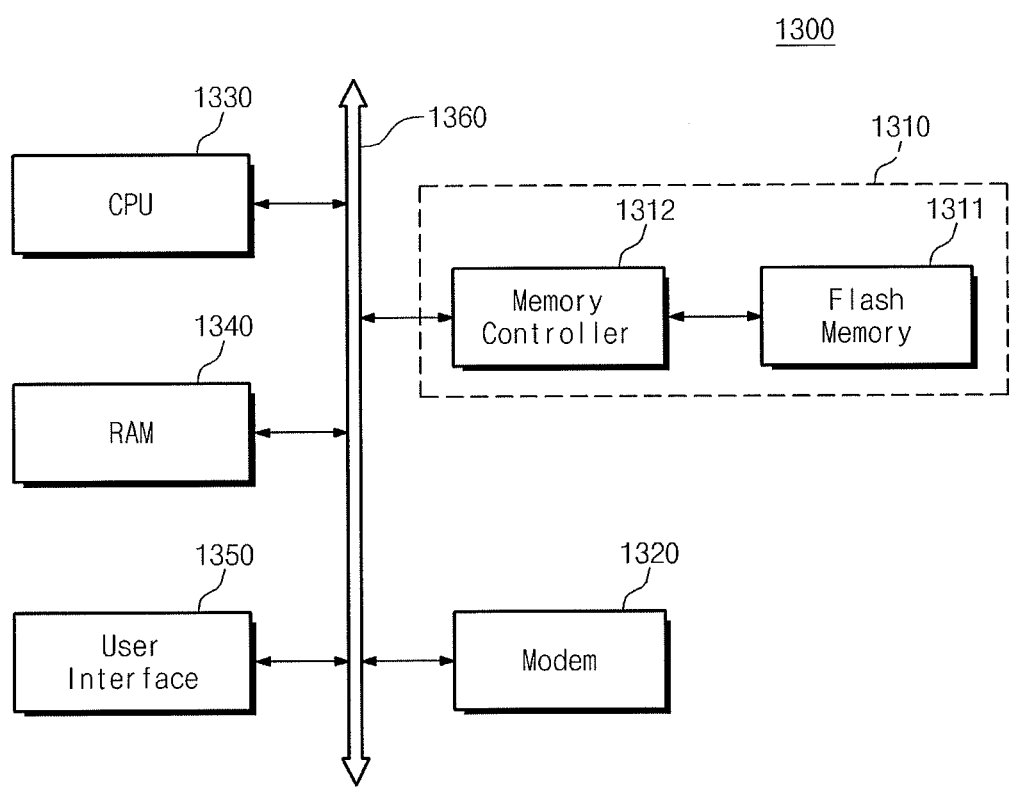
FIG. 47 illustrates a schematic block diagram of an information processing system mounted with a flash memory system according to exemplary embodiments.

FIG. 47 is a schematic block diagram illustrating an information processing system 1300 mounted with a flash memory system 1310.

Referring to FIG. 47, the flash memory system 1310 is mounted into an information processing system such as a mobile device or a desktop computer. An information processing system 1300 includes a flash memory system 1310, a MOdulator and DEModulator (MODEM) 1320, a central processing unit 1330, a RAM 1340, and a user interface 1350, which are electrically connected to a system bus 1360, respectively. The flash memory system 1310 may have substantially the same configuration as the above-described memory system or flash memory system. The flash memory system 1310 stores data processed by the central processing unit 1330 or data input from the outside. Here, the above-described flash memory system 1310 may be configured by a solid state drive. In this case, the information processing system 1300 may stably stores mass data in the flash memory system 1310. Moreover, as the reliability increases, the flash memory system 1310 may reduce resources required for an error correction, thereby providing a high-speed data exchange function to the information processing system 1300. Even though not illustrated in drawings, it will be apparent to those skilled in the art that an application chipset, a camera Image Signal Processor (ISP), an input/output device, or the like may further be provided to the information processing system 1300 according to an exemplary embodiment.

The flash memory device or the memory system according to an exemplary embodiment may be mounted in various types of packages. For example, the flash memory device or the memory system may be packaged and mounted in such manners as Package on Package (PoP), Ball Grid Array (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small-Outline Integrated Circuit (SOIC), Shrink Small-Outline Package (SSOP), Thin Small-Outline Package (TSOP), Thin Quad Flat Pack (TQFP), System In Package (SIP), Multi Chip Package (MCP), Wafer-level Fabricated Package (WFP), or Wafer-level processed Stack Package (WSP).

In order to realize a three-dimensional flash memory device, techniques using vertical semiconductor pillars as an active region are disclosed in Japanese Patent Application Publication No. 1994-338602, entitled "Semiconductor Memory Device and Method of Fabricating The Same", U.S. Patent Publication No. 20070252201, entitled "Nonvolatile Semiconductor Memory Device and Manufacturing Method Thereof", the treatise (Electron Devices Meeting, 2007. IEDM 2007. IEEE International, pp. 449-452), entitled "Optimal Integration and Characteristics of Vertical Array Devices for Ultra-High Density, Bit-Cost Scalable Flash Memory" written by Y. Fukuzumi, and the treatise (VLSI Technology, 2007 IEEE Symposium on, pp. 14-15), entitled "Bit Cost Scalable Technology with Punch and Plug Process for Ultra High Density Flash Memory" written by H. Tanaka. For brevity of the description, with respect to contents disclosed in these publication patents and treatises, duplicated description will be omitted, but are included in the scope of the embodiments.

As described above, the semiconductor device, e.g., a three-dimensional semi-conductor device, according to exemplary embodiments includes a damp-proof structure surrounding the cell array region. Therefore, exterior dampen or contamination of the cell array region may be reduced and/or prevented. In addition, when the semiconductor device further includes a damp-proof layer covering the top of the cell array region and a damp-proof reinforcement structure penetrating the damp-proof structure, the cell array region may be substantially and/or completely free from the exterior damp or contamination.

Furthermore, the method of fabricating the semiconductor device according to exemplary embodiments may form the damp-proof structure surrounding the cell array region. Accordingly, the dishing phenomenon which can occur in the CMP (Chemical Mechanical Polishing) process may be reduced and/or prevented. A vertical-type nonvolatile memory device and a method of fabricating the same may include using the semiconductor device and method of fabricating according to embodiments.

Although the exemplary embodiments have been described with reference to the accompanying drawings, the present invention it is not limited thereto. Exemplary embodiments have been disclosed herein, and although specific terms are employed, they are used and are to be interpreted in a generic and descriptive sense only and not for purpose of limitation. It will be apparent to those skilled in the art that the embodiments are modified in various specific forms without departing from the spirit and scope of the present invention as set forth in the following claims. Therefore, the above-disclosed subject matter is to be considered illustrative and not restrictive.

What is claimed is:

1. A method of fabricating a semiconductor device, the method comprising:
   preparing a substrate including a cell array region and a dummy pattern region surrounding the cell array region;
   forming a cell structure and a damp-proof structure spaced apart from each other on the cell array region and the dummy pattern region, respectively, the damp-proof structure laterally surrounding the cell structure,
   wherein the cell structure includes a plurality of cell active pillars extending in a vertical direction from the substrate; and cell gate patterns and cell gate interlayer insulating patterns are alternately stacked on the substrate and have sides facing the cell active pillars; and
   enclosing the cell structure within the damp-proof structure by forming a damp-proof layer over upper surfaces of the cell structure and damp-proof structure.

2. The method as claimed in claim 1, further comprising:
   forming an outer interlayer insulating layer filling a gap between the cell structure and the damp-proof structure such that the damp-proof layer covers upper surfaces of the cell structure, the damp-proof structure, and the outer interlayer insulating layer.

3. The method as claimed in claim 1, wherein forming the cell structure and the damp-proof structure at the cell array region and the dummy pattern region, respectively, includes:
   alternately stacking sacrificial layers and interlayer insulating layers on an entire surface of the substrate to form a stacked structure;
   forming the plurality of cell active pillars in contact holes penetrating the stacked structure in the cell array region, the cell active pillars being in contact with the substrate;
   forming a cell preliminary structure and the damp-proof structure spaced apart from each other on the cell array region and the dummy pattern region, respectively, by patterning the sacrificial layers and the interlayer insulating layers;
   forming an outer interlayer insulating layer that fills a gap between the cell preliminary structure and the damp-proof structure; and
   removing the cell sacrificial patterns in the cell array region and forming the cell gate patterns in a region where the cell sacrificial patterns are removed, wherein:
   the cell preliminary structure includes alternately stacked cell sacrificial patterns and cell gate interlayer insulating patterns and includes the cell active pillars; and
   the damp-proof structure includes alternately stacked dummy sacrificial patterns and dummy interlayer insulating patterns.

4. The method as claimed in claim 3, further comprising forming a damp-proof reinforcement structure that penetrates the dummy sacrificial patterns and the dummy interlayer insulating patterns at the dummy pattern region, after forming the cell gate patterns.

5. The method as claimed in claim 1, wherein forming the cell structure and the damp-proof structure at the cell array region and the dummy pattern region, respectively, includes:
   alternately stacking sacrificial layers and interlayer insulating layers on an entire surface of the substrate to form a stacked structure;
   forming the plurality of cell active pillars in first contact holes penetrating the stacked structure in the cell array region, the cell active pillars being in contact with the substrate, and forming a damp-proof reinforcement structure in second contact holes penetrating the stacked structure in the dummy pattern region;
   forming a cell preliminary structure and the damp-proof structure spaced apart from each other on the cell array region and the dummy pattern region, respectively, by patterning the sacrificial layers and the interlayer insulating layers;
   forming an outer interlayer insulating layer that fills a gap between the cell preliminary structure and the damp-proof structure; and
   removing the cell sacrificial patterns at the cell array region and forming the cell gate patterns in a region where the cell sacrificial patterns are removed, wherein:
   the cell preliminary structure includes alternately stacked cell sacrificial patterns and cell gate interlayer insulating patterns and includes the cell active pillars, and
   the damp-proof structure includes alternately stacked dummy sacrificial patterns and dummy interlayer insulating patterns and includes the damp-proof reinforcement structure.

6. The method as claimed in claim 5, wherein forming the plurality of cell active pillars and the damp-proof reinforcement structure includes:
- forming dummy active patterns between the damp-proof reinforcement structure and the sacrificial layers and between the damp-proof reinforcement structure and the interlayer insulating layers; and
- forming a protective insulating pattern on the damp-proof reinforcement structure, the protective insulating pattern having an upper surface that is a same height as upper surfaces of the cell active pillars.

7. The method as claimed in claim 1, wherein forming the cell structure and the damp-proof structure at the cell array region and the dummy pattern region, respectively, includes:
- alternately stacking conductive layers and interlayer insulating layers on an entire surface of the substrate to form a stacked structure;
- forming the plurality of cell active pillars in contact holes penetrating the stacked structure in the cell array region, the cell active pillars being in contact with the substrate;
- forming the cell structure and the damp-proof structure spaced apart from each other at the cell array region and the dummy pattern region, respectively, by patterning the conductive layers and the interlayer insulating layers; and
- forming an outer interlayer insulating layer that fills a gap between the cell structure and the damp-proof structure,
- wherein the damp-proof structure includes alternately stacked dummy gate patterns and dummy interlayer insulating patterns.

8. The method as claimed in claim 1, wherein forming the cell structure and the damp-proof structure at the cell array region and the dummy pattern region, respectively, includes:
- alternately stacking conductive layers and interlayer insulating layers on an entire surface of the substrate to form a stacked structure;
- forming the plurality of cell active pillars in first contact holes penetrating the stacked structure in the cell array region, the cell active pillars being in contact with the substrate, and
- forming a damp-proof reinforcement structure in second contact holes penetrating the stacked structure in the dummy pattern region;
- forming the cell structure and a damp-proof structure spaced apart from each other on the cell array region and the dummy pattern region, respectively, by patterning the conductive layers and the interlayer insulating layers; and
- forming an outer interlayer insulating layer that fills a gap between the cell structure and the damp-proof structure,
- wherein the damp-proof structure includes alternately stacked dummy gate patterns and dummy interlayer insulating patterns and includes the damp-proof reinforcement structure.

9. The method as claimed in claim 1, further including providing a plurality of bitlines, the bitlines directly contacting an upper part of a cell active pillar and penetrating a top surface of the damp-proof layer.

10. The method as claimed in claim 9, wherein the damp-proof layer is provided in between adjacent bitlines in the semiconductor device.

11. The method as claimed in claim 1, wherein the damp-proof layer directly contacts the upper surface of the damp-proof structure.

* * * * *